(12) United States Patent
Haneda et al.

(10) Patent No.: US 8,952,535 B2
(45) Date of Patent: Feb. 10, 2015

(54) SEMICONDUCTOR TRANSISTOR DEVICE WITH BARRIER INTERCONNECTS

(71) Applicant: Fujitsu Semiconductor Limited, Yokohama-shi, Kanagawa (JP)

(72) Inventors: Masaki Haneda, Kawasaki (JP); Akiyoshi Hatada, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/761,931

(22) Filed: Feb. 7, 2013

(65) Prior Publication Data
US 2013/0207193 A1    Aug. 15, 2013

(30) Foreign Application Priority Data

Feb. 13, 2012   (JP) ................. 2012-028506

(51) Int. Cl.
  *H01L 29/41*    (2006.01)
  *H01L 29/417*   (2006.01)
  *H01L 29/45*    (2006.01)
  *H01L 27/088*   (2006.01)
  *H01L 29/66*    (2006.01)
  *H01L 21/8234*  (2006.01)
  *H01L 29/49*    (2006.01)
  *H01L 29/51*    (2006.01)
  *H01L 29/78*    (2006.01)

(52) U.S. Cl.
  CPC ........ *H01L 27/088* (2013.01); *H01L 29/66477* (2013.01); *H01L 21/823475* (2013.01); *H01L 29/456* (2013.01); *H01L 29/665* (2013.01); *H01L 29/6659* (2013.01); *H01L 29/4933* (2013.01); *H01L 29/495* (2013.01); *H01L 29/513* (2013.01); *H01L 29/517* (2013.01); *H01L 29/7843* (2013.01); *H01L 29/7848* (2013.01)
  USPC ..... 257/751; 257/753; 257/774; 257/E23.145

(58) Field of Classification Search
  CPC ............ H01L 23/485; H01L 29/41766; H01L 21/76843
  USPC ........... 257/751, 774, 753, 754, 773, E23.145
  See application file for complete search history.

(56) References Cited

U.S. PATENT DOCUMENTS 7,115,999 B2 * 10/2006 Tsumura et al. .............. 257/774
7,348,676 B2 *  3/2008 Lee ............................... 257/774

(Continued)

FOREIGN PATENT DOCUMENTS

WO    2007/026429 A1    3/2007

*Primary Examiner* — Jerome Jackson, Jr.
*Assistant Examiner* — Paul Budd
(74) *Attorney, Agent, or Firm* — Westerman, Hattori, Daniels & Adrian, LLP

(57) ABSTRACT

A semiconductor device including a first insulation film including a first opening reaching a diffusion region of a transistor; a first barrier metal over the diffused region in the first opening; a first conduction layer formed over the first barrier metal in the first opening and formed of a first conductor; a second barrier metal formed over the first conduction layer in the first opening; a second conduction layer formed over the second barrier metal in the first opening and formed of a second conductor; a third barrier metal formed over the first gate electrode in the second opening; a fourth barrier metal formed in the second opening and contacting with the third barrier metal; and a third conduction layer formed of the second conductor contacting with the fourth barrier metal in the second opening.

12 Claims, 42 Drawing Sheets

(56) References Cited

U.S. PATENT DOCUMENTS

| | | | |
|---|---|---|---|
| 2002/0056879 A1* | 5/2002 | Wieczorek et al. | 257/368 |
| 2008/0157155 A1 | 7/2008 | Wang | |
| 2008/0265417 A1* | 10/2008 | Kawamura et al. | 257/751 |
| 2008/0265419 A1* | 10/2008 | Frohberg et al. | 257/753 |
| 2011/0042752 A1* | 2/2011 | Mayuzumi | 257/369 |
| 2011/0156270 A1* | 6/2011 | Seidel et al. | 257/774 |
| 2012/0104471 A1* | 5/2012 | Chang et al. | 257/288 |

* cited by examiner

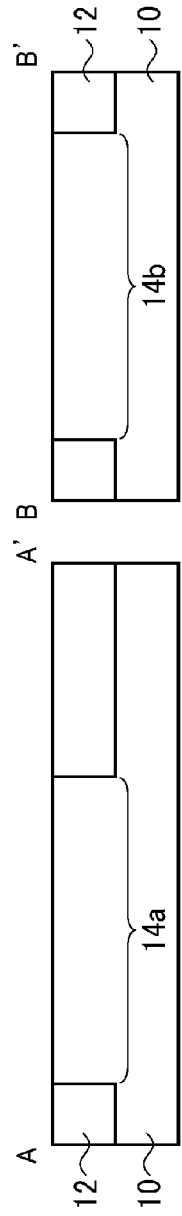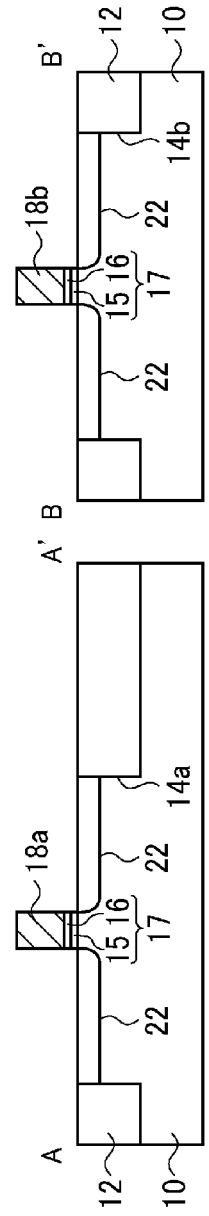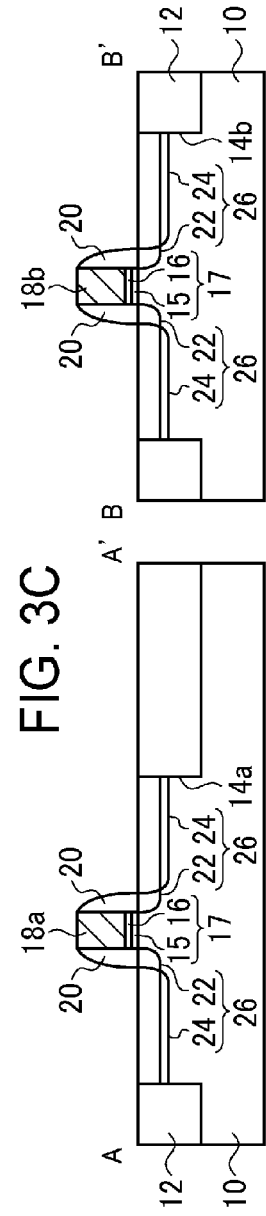

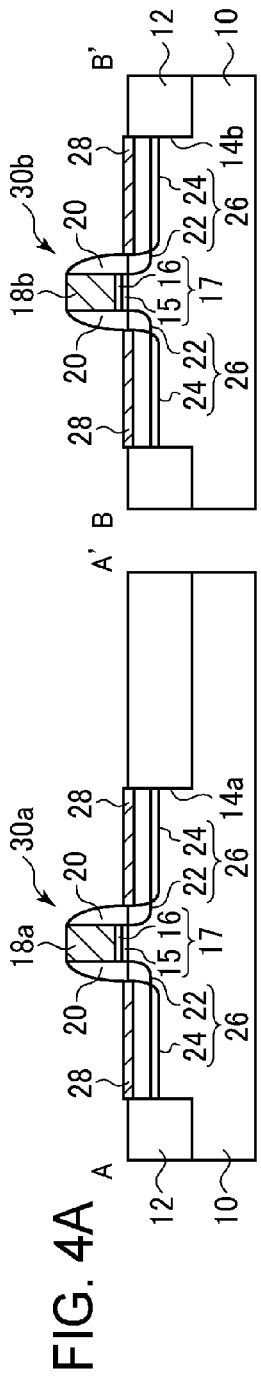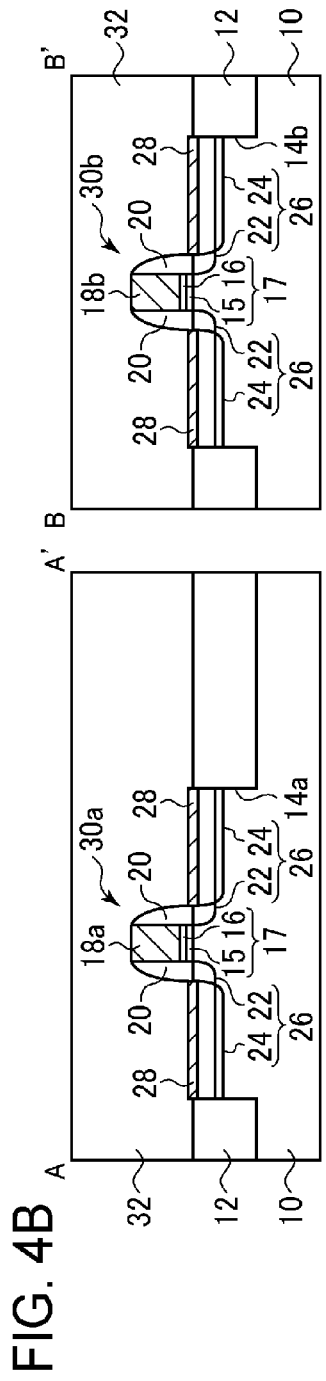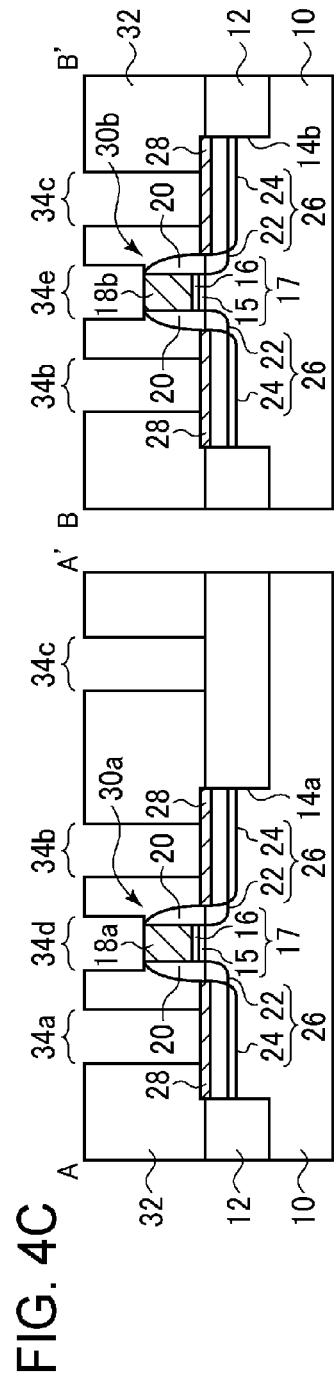

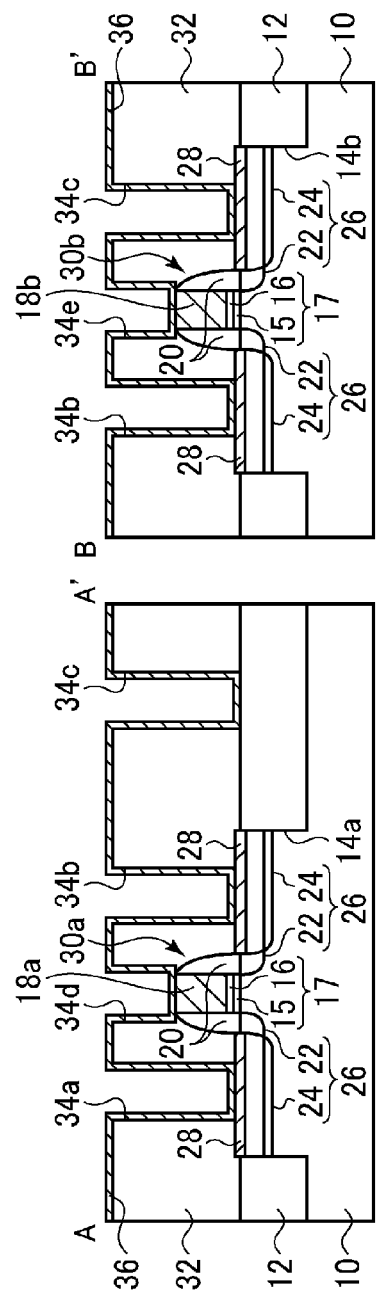
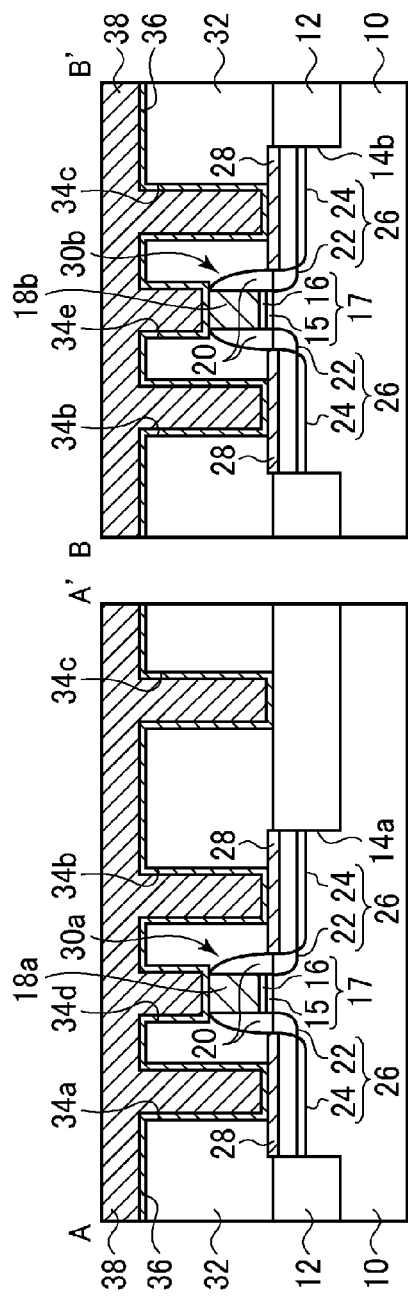

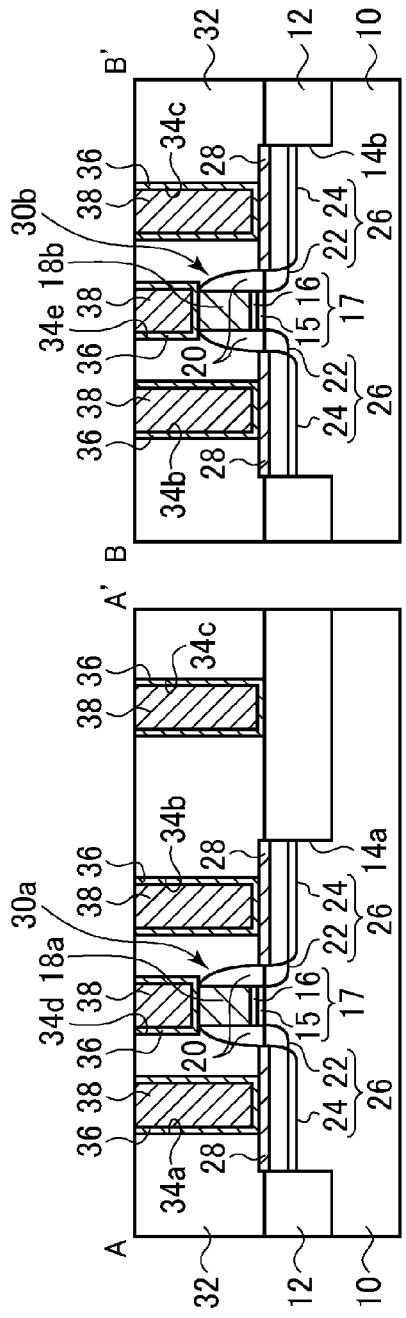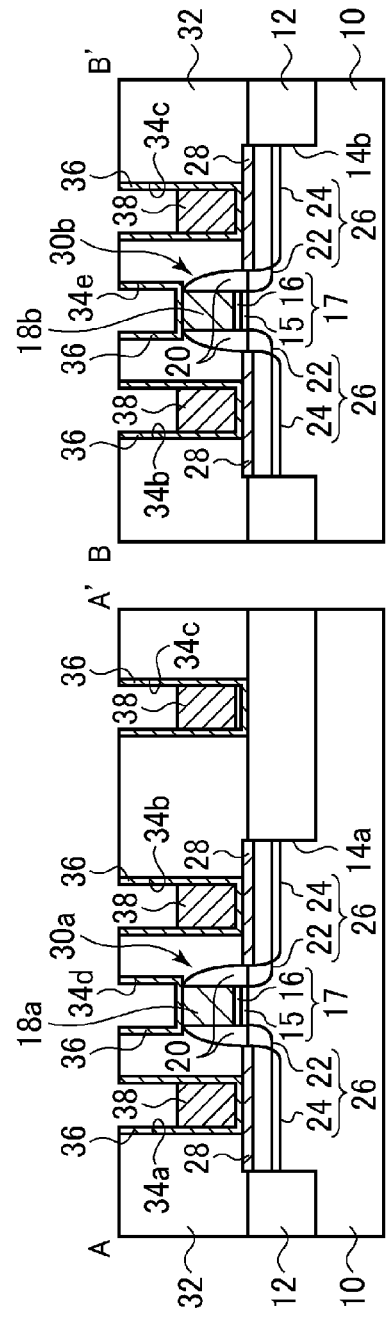

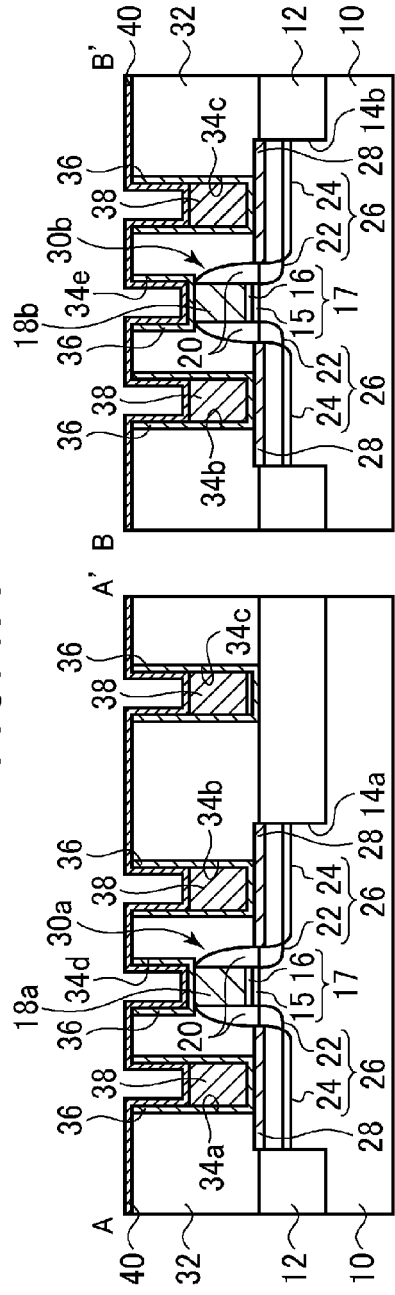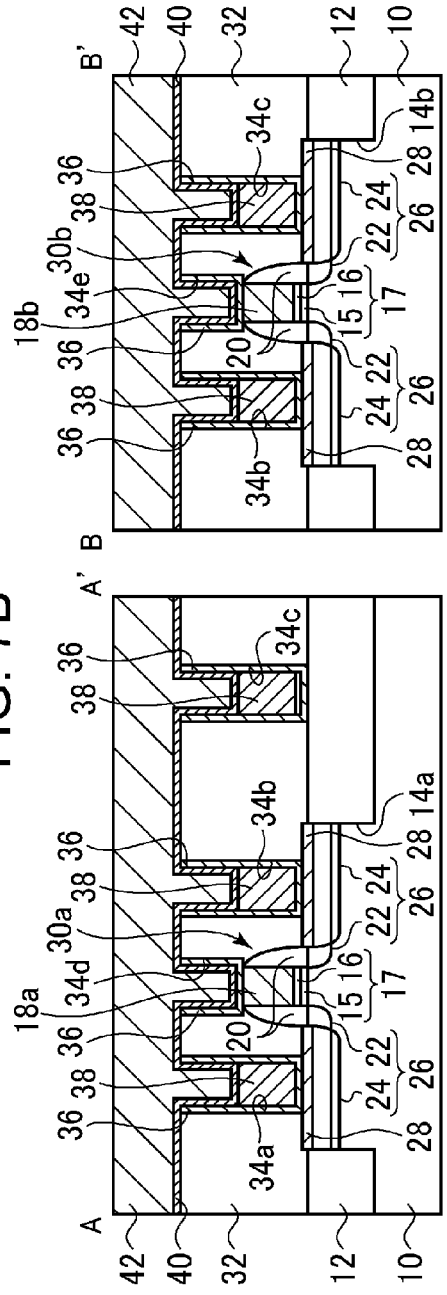

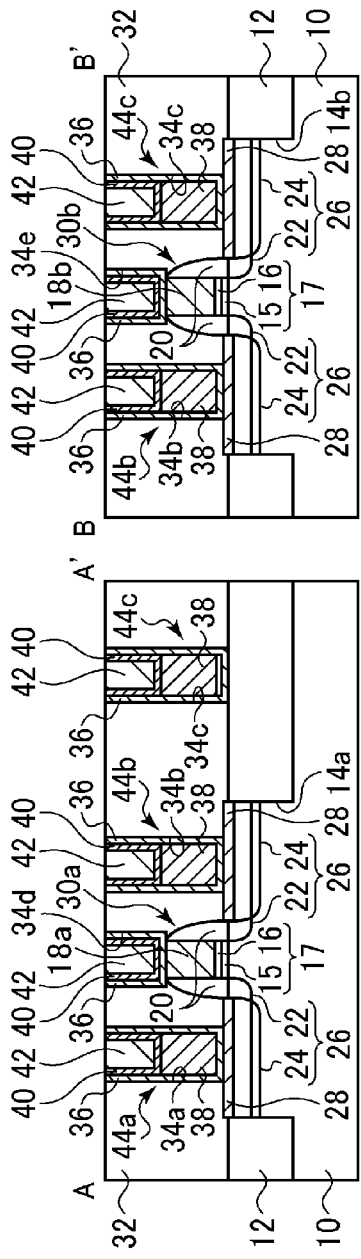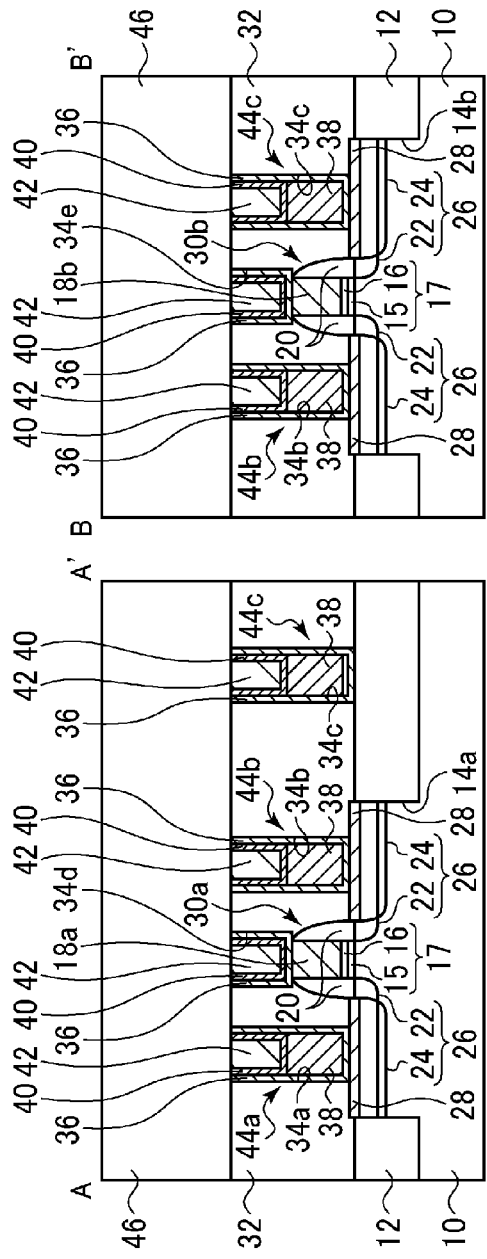

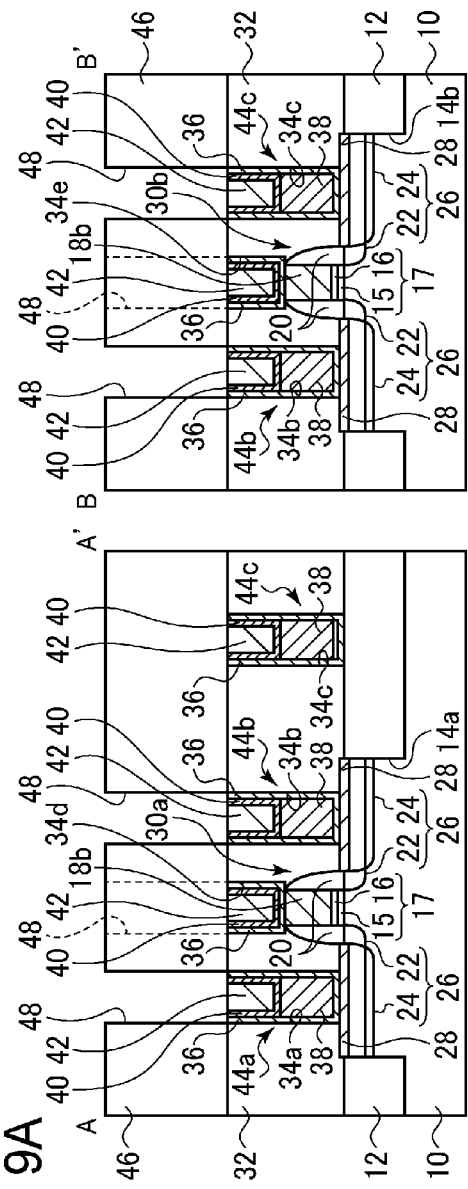
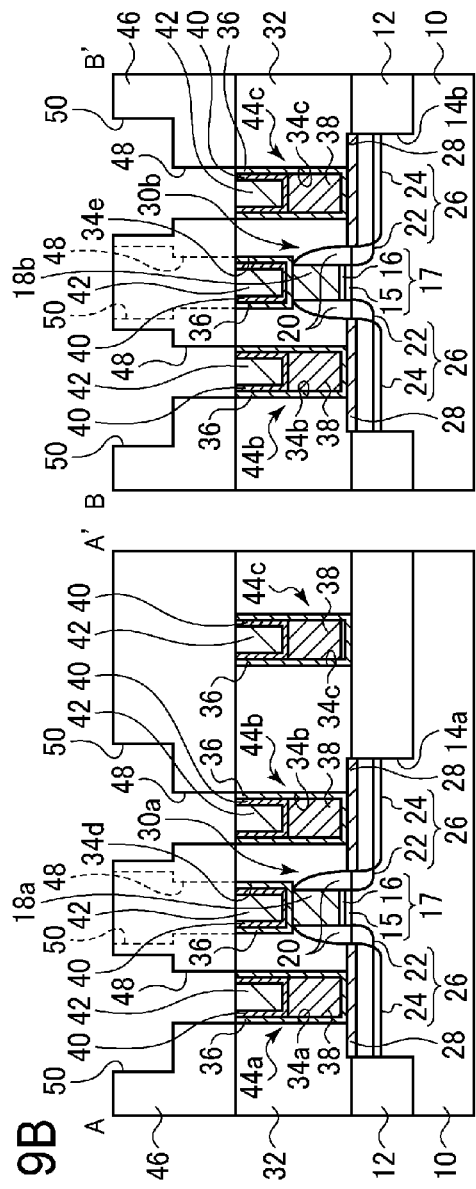

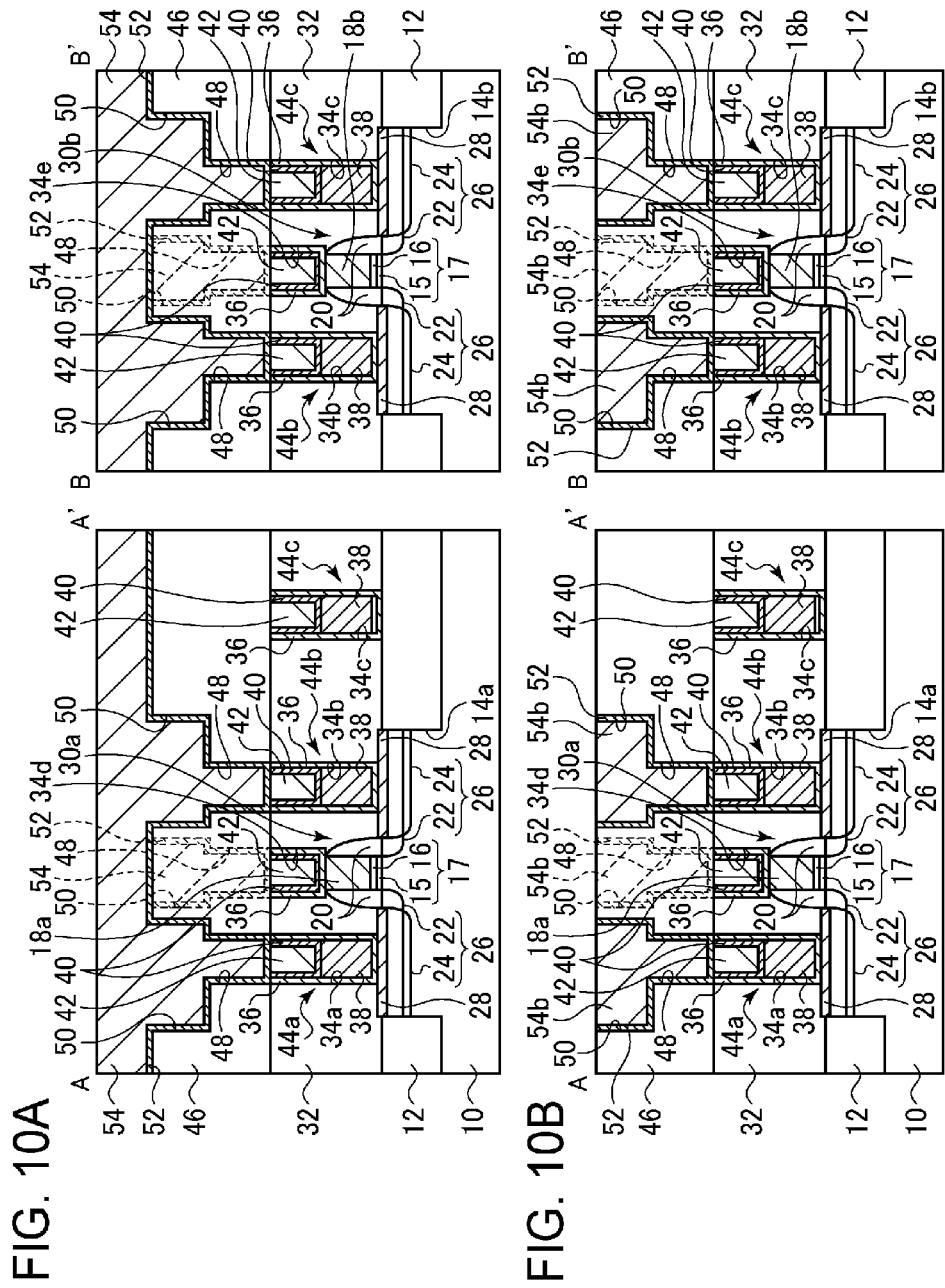

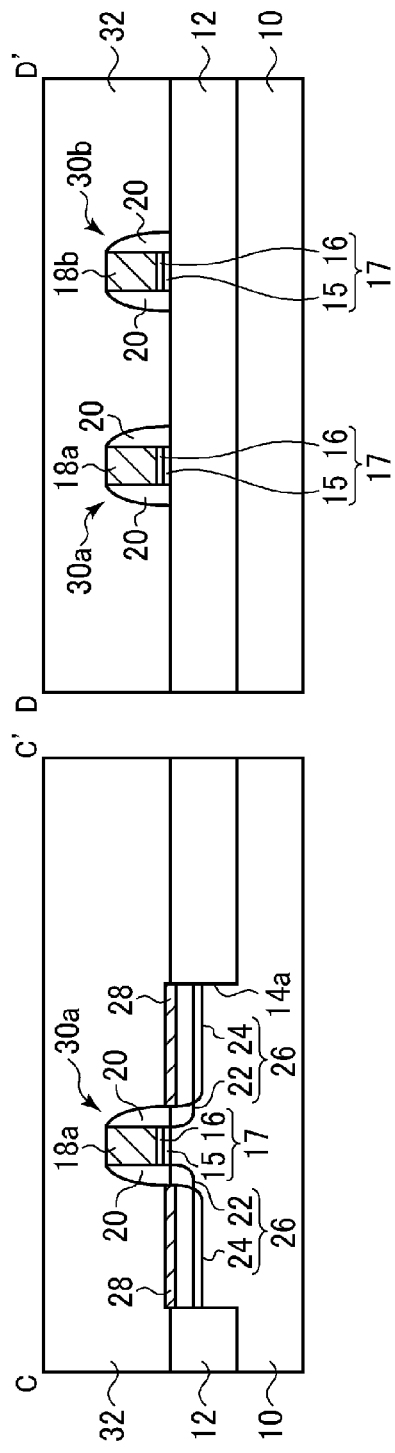
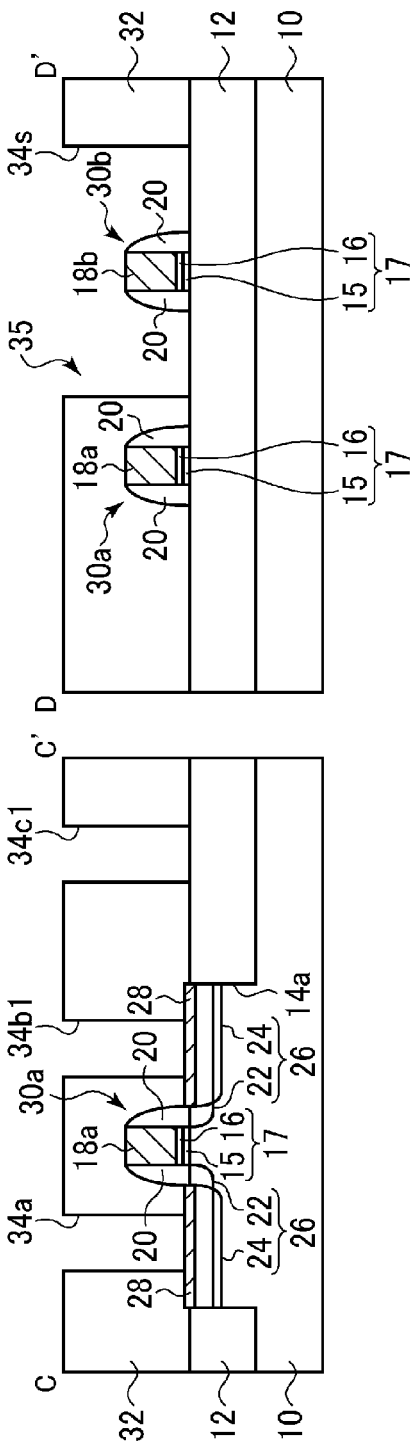

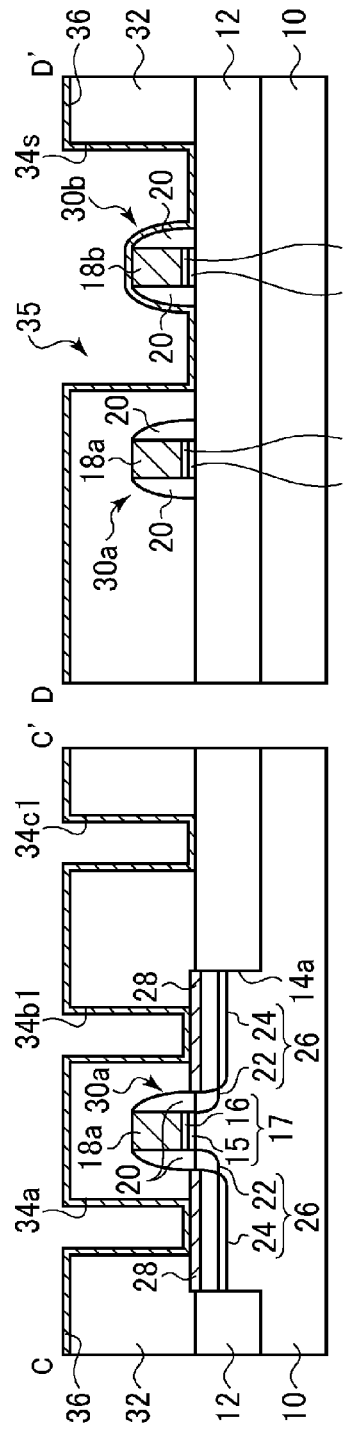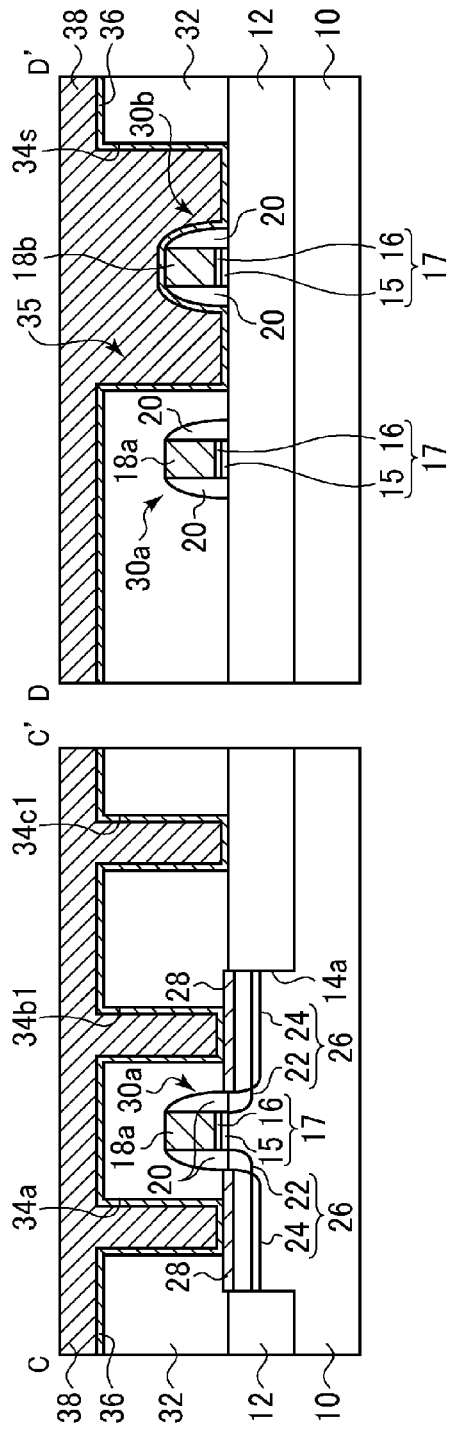

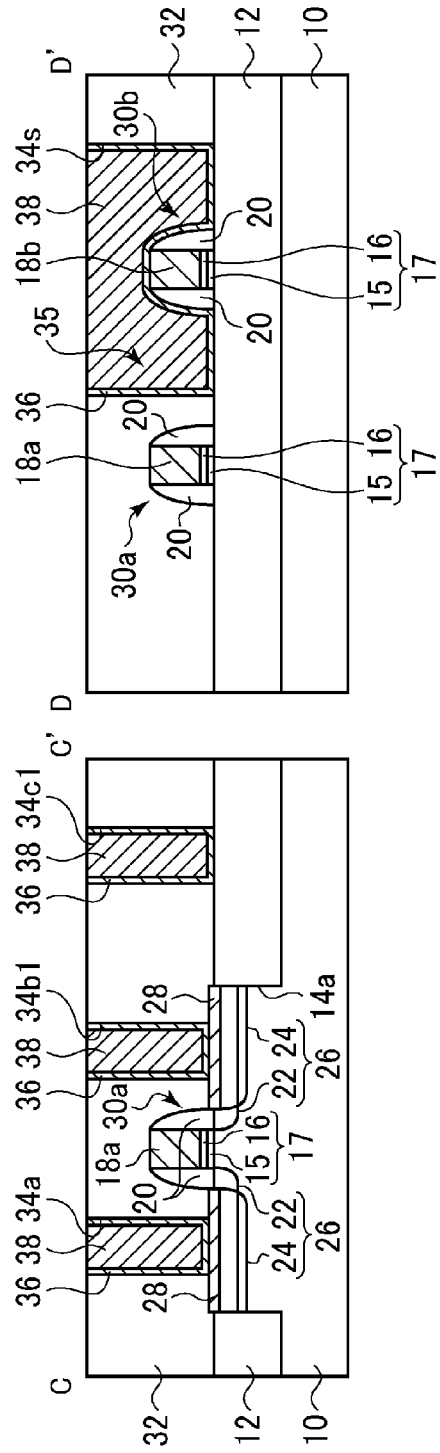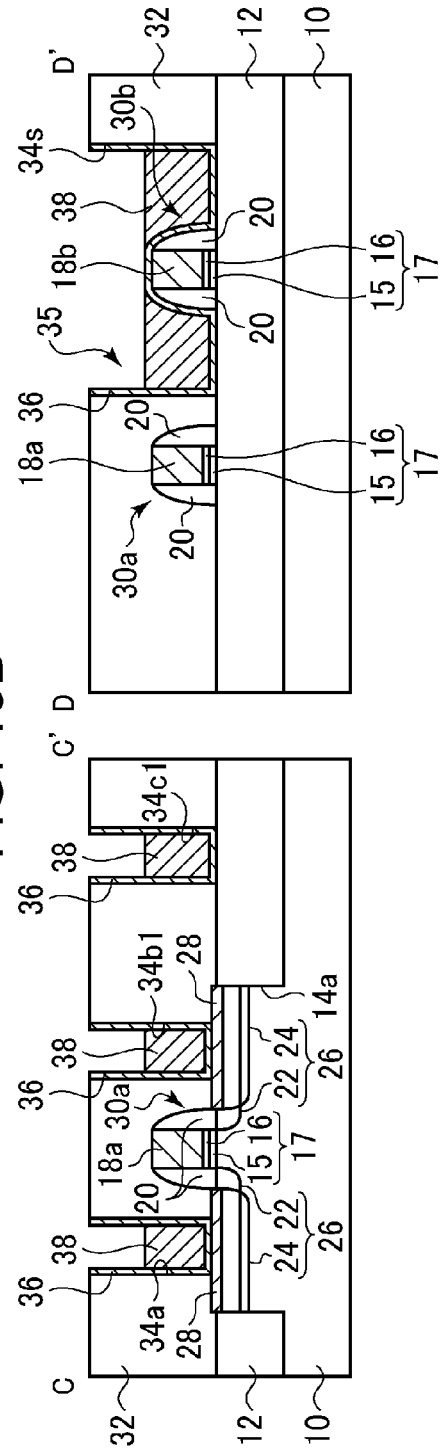

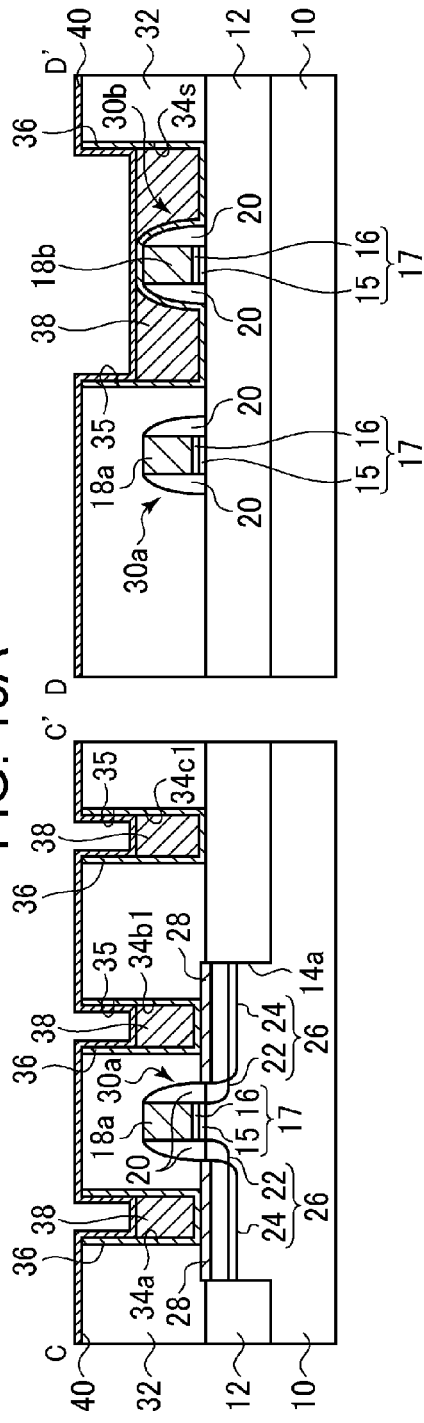
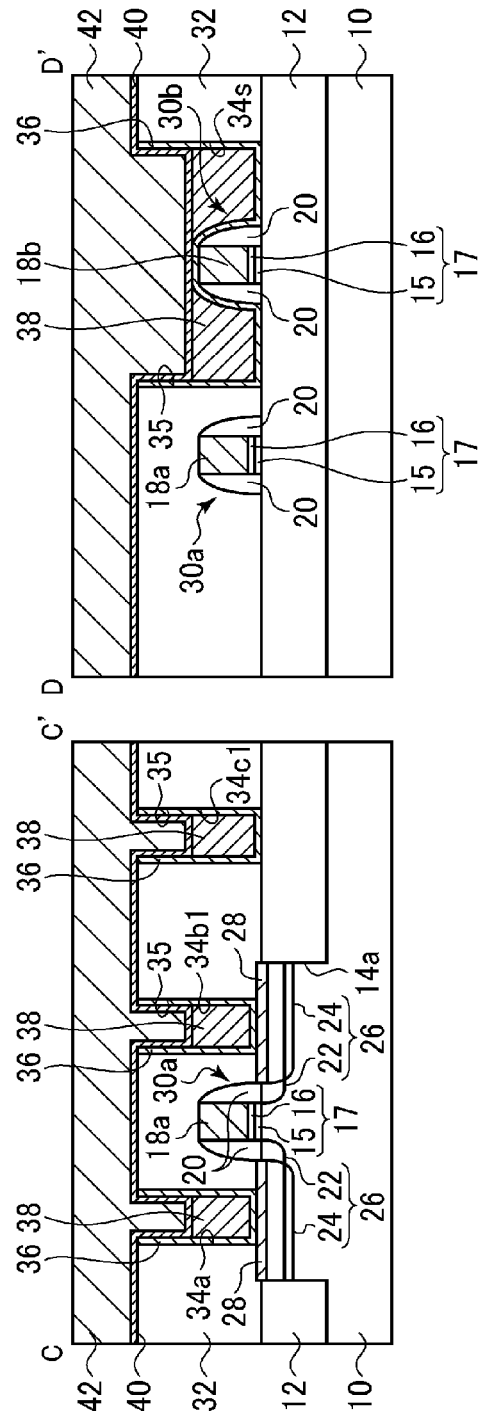
FIG. 19A
FIG. 19B

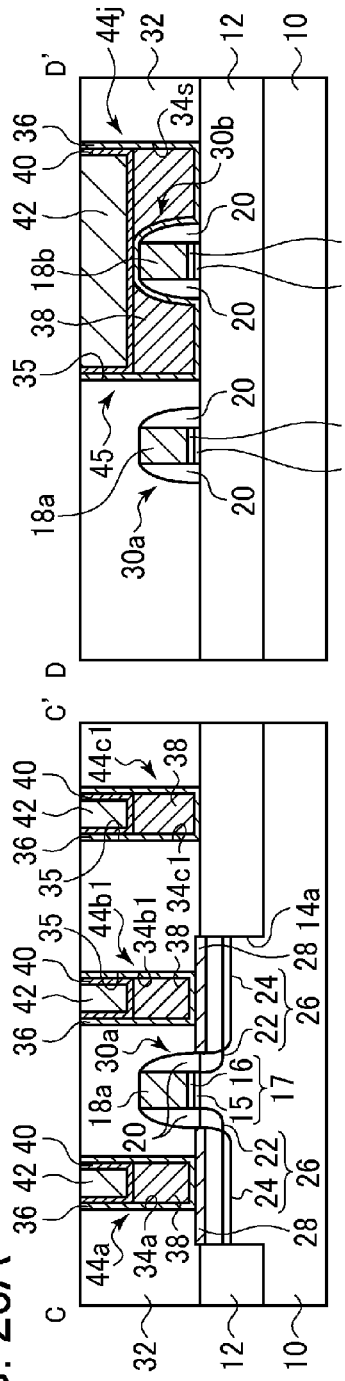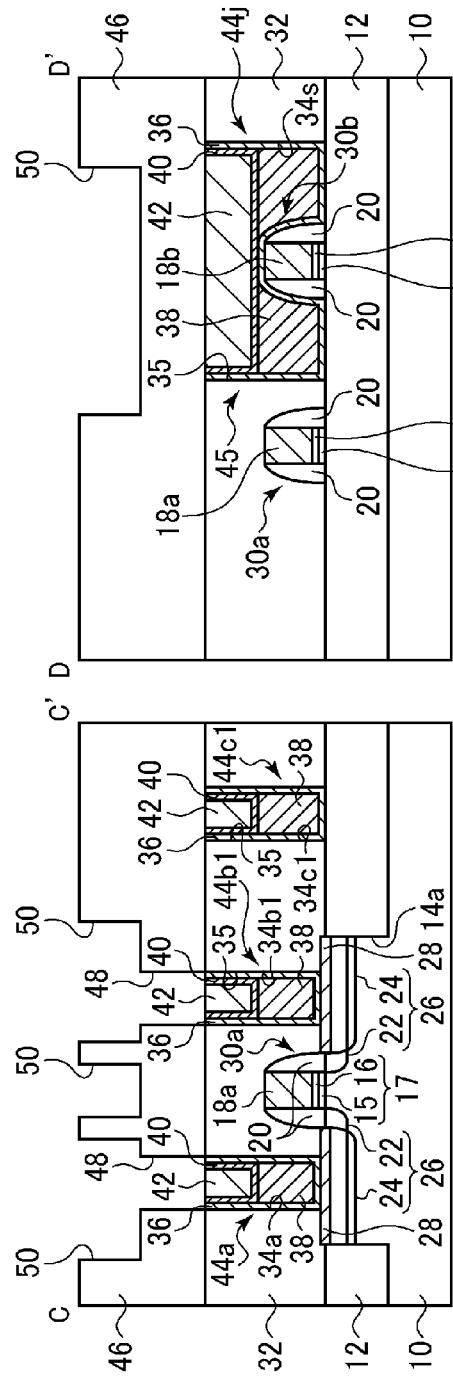

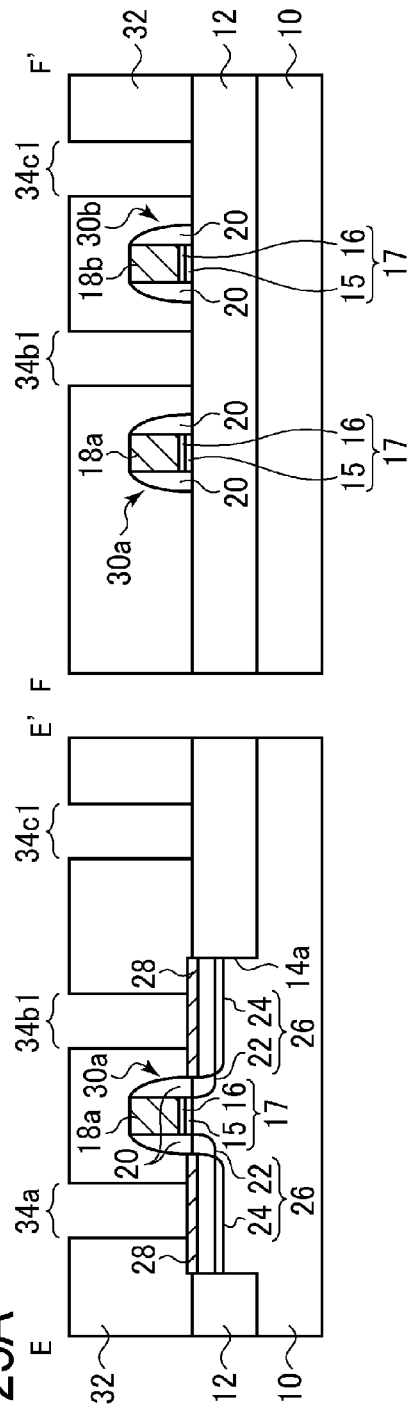
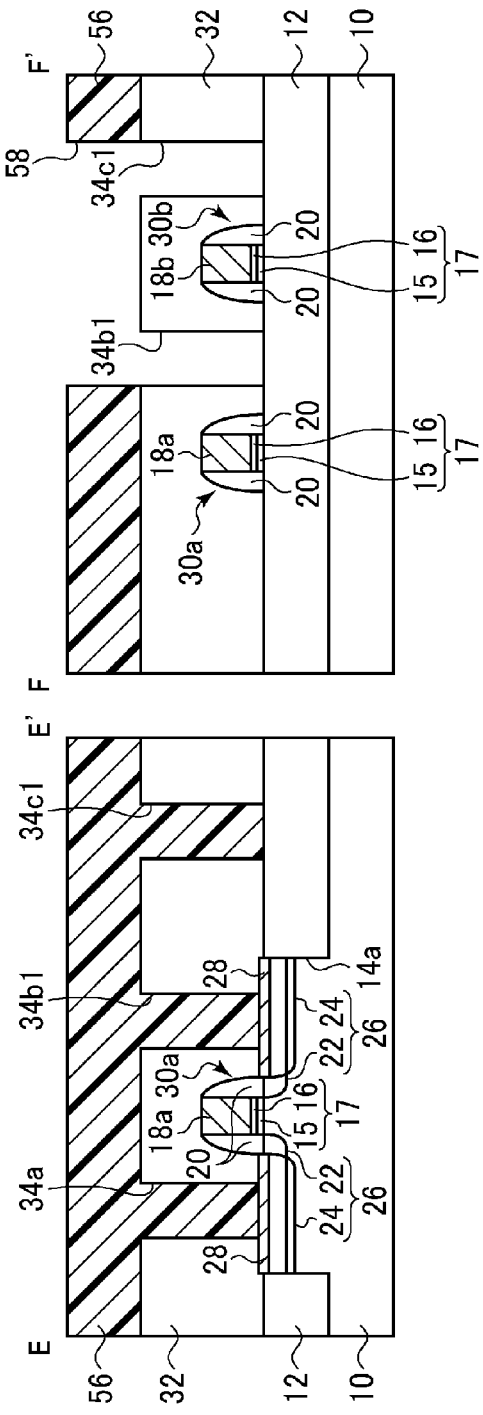
FIG. 25A
FIG. 25B

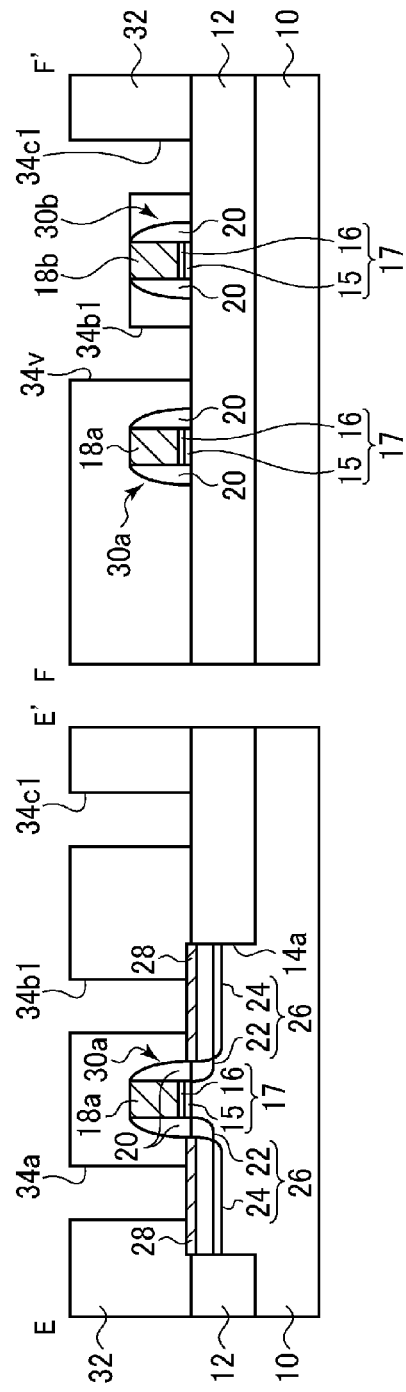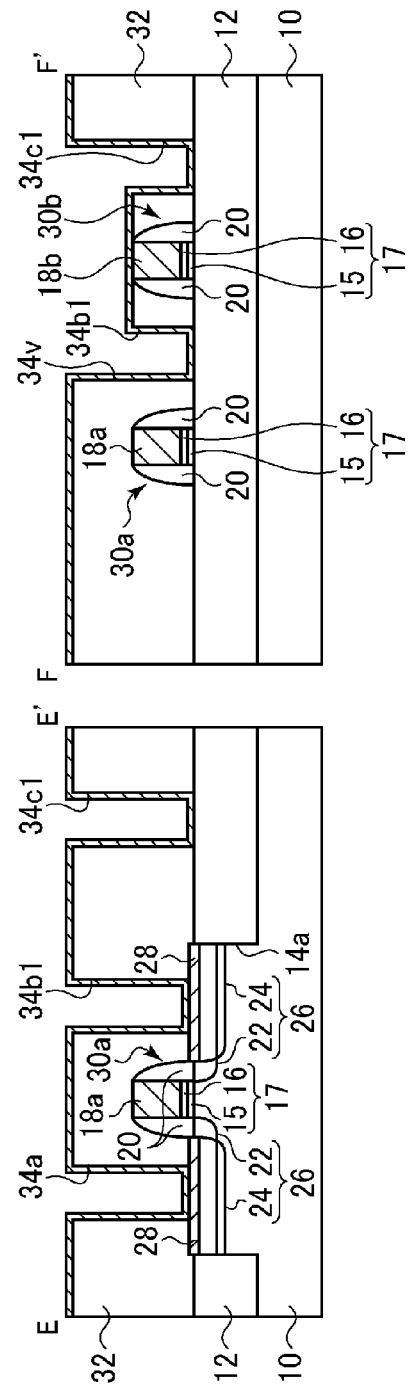

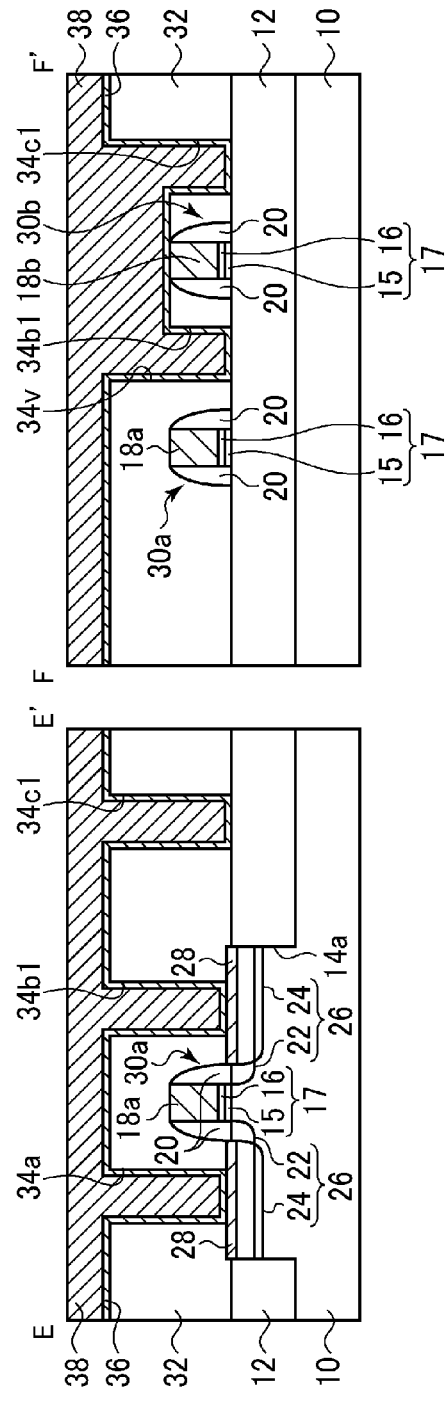
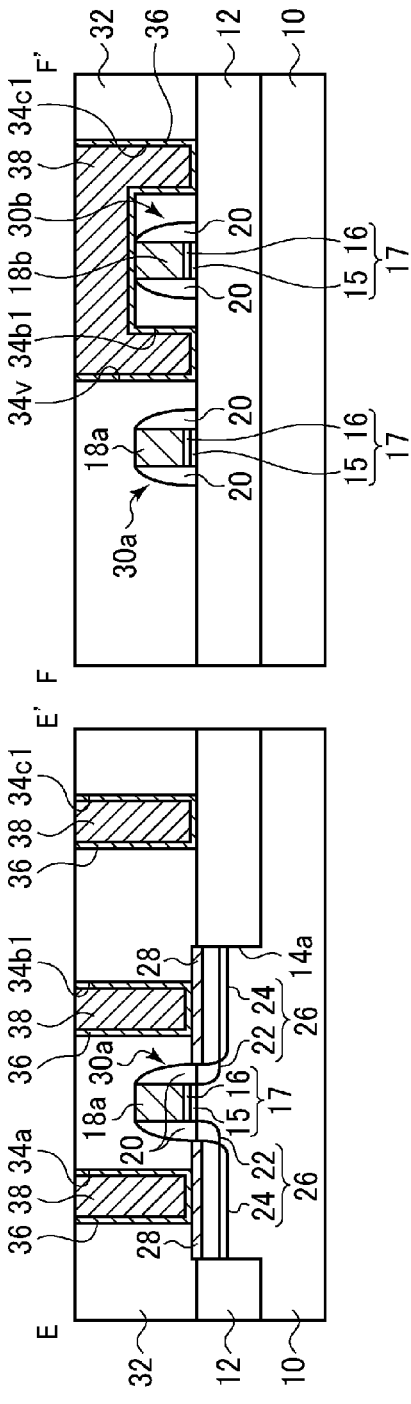
FIG. 27A
FIG. 27B

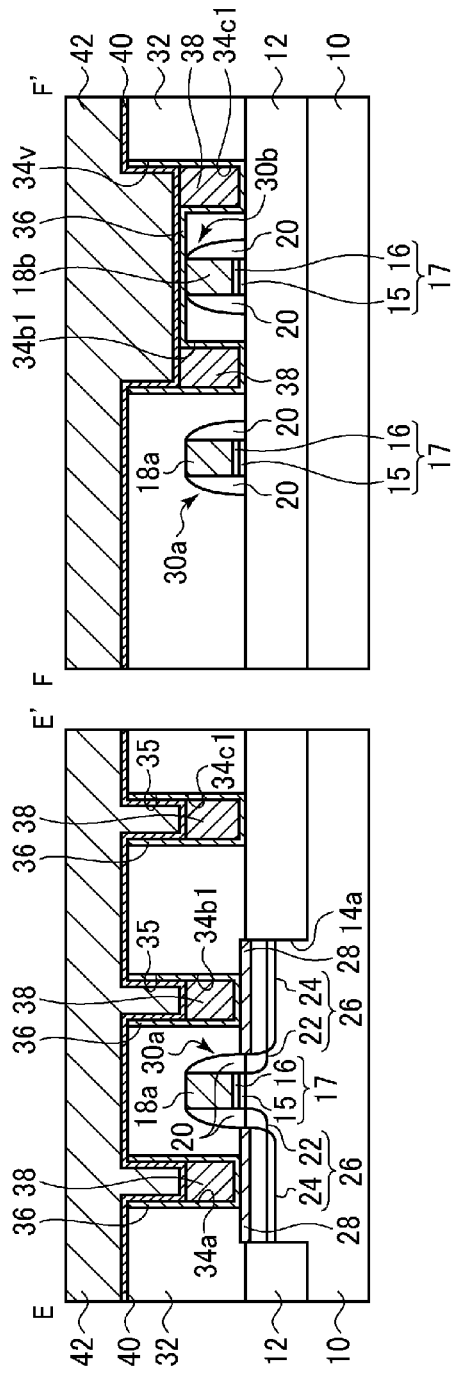
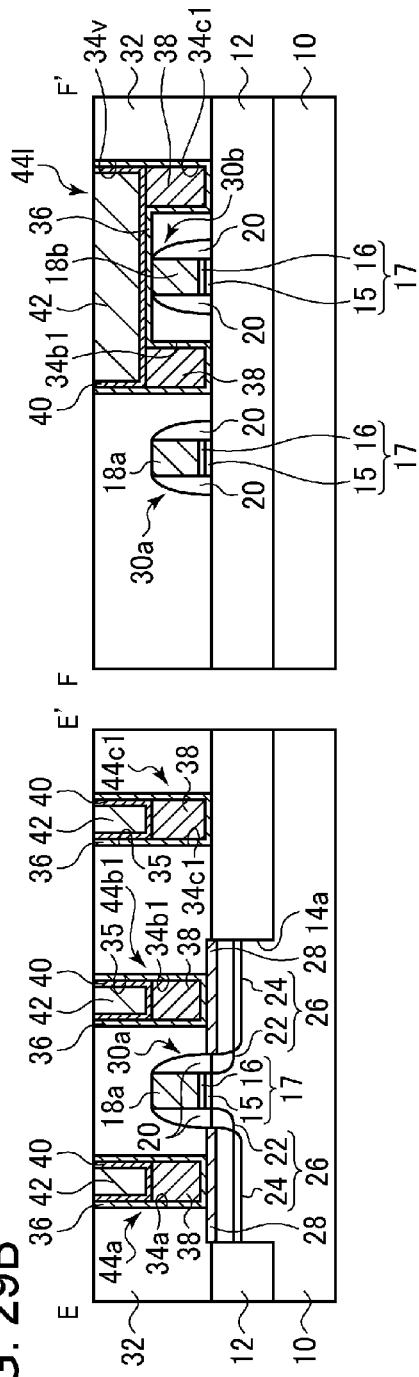
FIG. 29A
FIG. 29B

SEMICONDUCTOR TRANSISTOR DEVICE WITH BARRIER INTERCONNECTS

CROSS-REFERENCE TO RELATED APPLICATION

This application is based upon and claims the benefit of priority of the prior Japanese Patent Application No. 2012-28506, filed on Feb. 13, 2012, the entire contents of which are incorporated herein by reference.

FIELD

The embodiments discussed herein are related to a semiconductor device and a method for manufacturing a semiconductor device.

BACKGROUND

Recently, the semiconductor devices to be used in information devices, electronic devices, etc. are required to increase the operational speeds and to decrease the power consumptions, etc.

To realize the increase of the operational speed, it is proposed to use copper (Cu) as the material of the interconnections of the multilayer interconnection structure to be formed on an inter-layer insulation film. The use of Cu as the material of the interconnections can decrease the electric resistance of the interconnections, and can contribute to the increase of the operational speed, etc.

Related reference is International Publication Pamphlet No. WO 2007/026429.

SUMMARY

According to an aspect of embodiments, a semiconductor device including: a device isolation region formed in a semiconductor substrate; a first transistor including a first gate insulation film formed over a first device region defined by the device isolation region, a first gate electrode formed over the first gate insulation film, and a first diffused regions formed in the first device region on both sides of the first gate electrode; a first insulation film formed over the semiconductor substrate and over the first transistor, and including first opening reaching the first diffusion region and second opening reaching the first gate electrode; a first barrier metal over the diffused region in the first opening; a first conduction layer formed over the first barrier metal in the first opening and formed of a first conductor; a second barrier metal formed over the first conduction layer in the first opening; a second conduction layer formed over the second barrier metal in the first opening and formed of a second conductor; a third barrier metal formed over the first gate electrode in the second opening; a fourth barrier metal formed in the second opening and contacting with the third barrier metal; and a third conduction layer formed of the second conductor contacting with the fourth barrier metal in the second opening.

According to another aspect of the embodiments, a method for manufacturing a semiconductor device including: forming a device isolation region defining a device region in a semiconductor substrate; forming a gate insulation film over the device region; forming a gate electrode over the gate insulation film; forming diffused regions in the device region on both sides of the gate electrode to thereby form a transistor including the gate electrode and the diffused regions; forming a first insulation film over the semiconductor substrate and over the transistor; forming in the first insulation film a first opening reaching the diffused region, and a second opening reaching the gate electrode; forming a first barrier metal in the opening and the second opening; forming a first conductor over the first barrier metal; etching off a part of the first conductor in the first opening and forming a first conduction layer of the first conductor, and removing the first conductor in the second opening to expose the first barrier metal at the bottom of the second opening; and forming a second conductor over the first conduction layer in the first opening and over the first barrier metal in the second opening to thereby form a second conduction layer and a third conduction layer.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF DRAWINGS

FIGS. 3A to 10B are sectional views of the semiconductor device according to the first embodiment in the steps of the method of manufacturing the semiconductor device, which illustrate the method;

FIGS. 16A to 21 are sectional views of the semiconductor device according to the second embodiment in the steps of the method of manufacturing the semiconductor device, which illustrate the method;

FIGS. 25A to 31 are sectional views of the semiconductor device according to the third embodiment in the steps of the method of manufacturing the semiconductor device, which illustrate the method;

DESCRIPTION OF EMBODIMENTS

The electric characteristics, such as the operational speed, the power consumption, etc., are required to further improve.

[a] First Embodiment

The semiconductor device according to a first embodiment and its manufacturing method will be described with reference to FIGS. 1 to 10B.

(Semiconductor Device)

Figure 1:
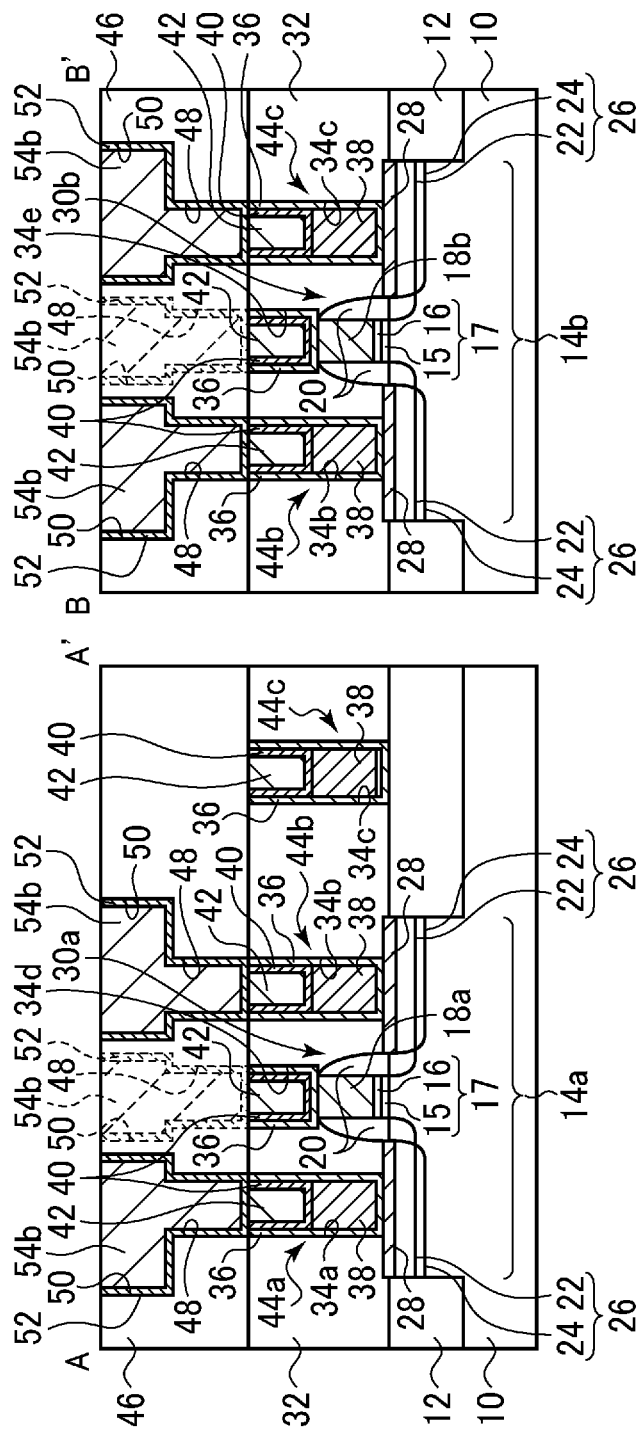
FIG. 1 is sectional views of a semiconductor device according a first embodiment.
Figure 2:
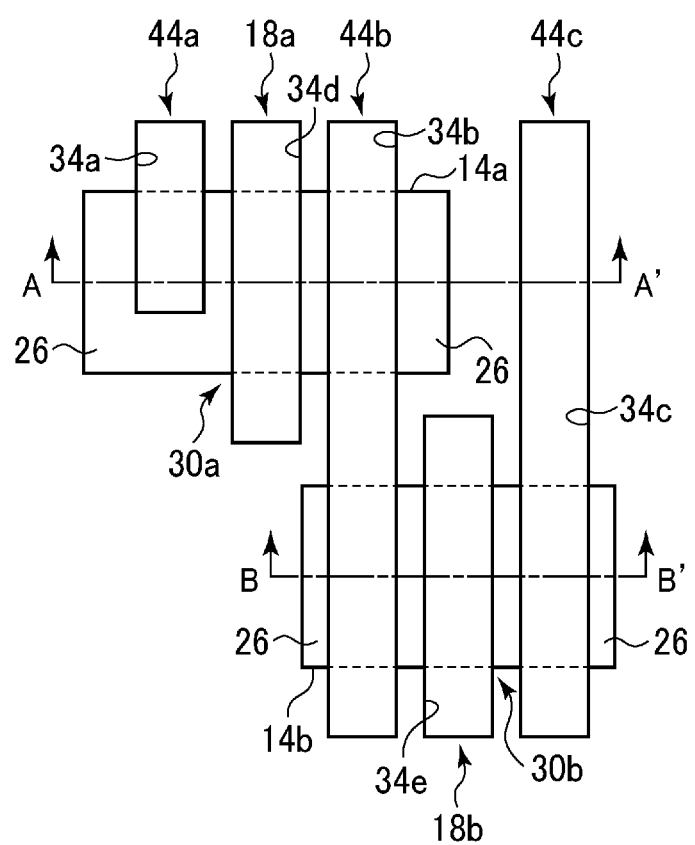
FIG. 2 is a plan view of the semiconductor device according to the first embodiment.

First, the semiconductor device according to the present embodiment will be described with reference to FIGS. 1 and 2. FIG. 1 is sectional views of the semiconductor device according to the present embodiment. FIG. 2 is a plan view of the semiconductor device according to the present embodiment. The drawing on the left side in FIG. 1 is the A-A' line sectional view of FIG. 2. The drawing on the right side in FIG. 1 is the B-B' line sectional view of FIG. 2.

In a semiconductor substrate 10, device isolation regions 12 defining device regions 14a, 14b are formed. The semiconductor substrate 10 is, e.g., a silicon substrate. The material of the device isolation regions 12, silicon oxide film, for example, is used.

On the semiconductor substrate 10 with the device isolation regions 12 formed in, gate electrodes (gate interconnections, gate lines) 18a, 18b are formed with a gate insulation film 17 formed therebetween. The gate interconnections 18a, 18b are extended perpendicularly as viewed in FIG. 1, i.e., up to down direction as viewed in FIG. 2. The gate insulation film 17 is a film including a high dielectric film (high-k film) 16, or others. Such high dielectric film 16 is, e.g., hafnium oxide ($HfO_2$) film 16. As the gate insulation film 17 here, the layer film which includes a silicon oxide film 15, and the hafnium oxide film 16 formed on the silicon oxide film 15 is formed. The film thickness of the silicon oxide film 15 is, e.g., about 0.5-0.7 nm. The film thickness of the hafnium oxide film 16 is, e.g., about 1.1-1.5 nm. As the material of the gate interconnections 18A, 18b, a metal, such as titanium (Ti), aluminum (Al) or others, is used (metal gates). The height of the gate interconnections 18a, 18b is e.g., about 45-55 nm. The width of the gate interconnections 18a, 18b, i.e., the gate length is, e.g., about 30-35 nm.

The high dielectric film 16 is not limited to hafnium oxide film. For example, as the high dielectric film 16, an oxide containing aluminum (Al), more specifically, aluminum oxide film may be used. As the high dielectric film 16, an oxide containing lanthanum (La), more specifically, lanthanum oxide film may be used. As the high dielectric film 16, an oxide containing zirconium (Zr), more specifically, zirconium oxide film may be used.

The gate insulation film 17 is not limited to the layer film. For example, as the gate insulation film 17, a single layer of silicon oxide film, a single layer of high dielectric film or others may be used.

The metal material forming the gate interconnections 18a, 18b may contain nitrogen, etc.

The material of the gate interconnections 18a, 18b is not limited to the metal material. For example, polysilicon or others may be used as the gate interconnections 18a, 18b.

On the side walls of the gate interconnections 18a, 18b, a sidewall insulation film 20 is formed. As the material of the sidewall insulation film 20, for example, silicon oxide film, silicon nitride film, the layer film of them or others are used.

In the device regions 14a, 14b on both sides of the gate interconnections 18a, 18b with the sidewall insulation film 20 formed on, source/drain regions (source/drain diffused layers, diffusion regions) 26 of the extension source/drain structure are formed. The source/drain regions 26 each include a shallow impurity diffused region 22 which is the extension region, and an impurity diffused region 24 formed deeper than the shallow impurity diffused region 22.

On the source/drain regions, a silicide film 28 is formed. As the silicide film 28, for example, nickel silicide film, nickel platinum silicide film, cobalt silicide film or other is used. The silicide film 28 on the source/drain regions 26 function as the source/drain regions.

In the case that polysilicon is used as the material of the gate interconnections 18a, 18b, the silicide film is formed also on the gate interconnections 18a, 18b.

Thus, transistors 30a, 30b including the gate interconnections 18a, 18b and the source/drain regions 26 are formed.

The semiconductor device has been described by means of the planar type transistors 30a, 30b, but the transistors 30a, 30b are not limited to planar type transistors. For example, non-planar type transistors, such as double gate transistors, tri-gate type transistors or others, may be formed.

A stress inductive film (stress film) (not illustrated) which induces stresses in the channel regions of the transistors 30a, 30b may be formed on the semiconductor substrate.

In the source/drain regions 26, stressors (not illustrated), such as a silicon germanium layer, a silicon carbon layer or others, may be buried.

An inter-layer insulation film 32 of silicon oxide film of, e.g., an about 100-130 nm-film thickness is formed on the semiconductor substrate 10 with the transistors 30a, 30b formed on. The surface of the inter-layer insulation film 32 is planarized.

The inter-layer insulation film 32 is not limited to silicon oxide film. For example, the inter-layer insulation film 32 may be a low dielectric film (low-k film), whose dielectric constant is lower than that of silicon dioxide, or others.

Phosphorus (P), boron (B) or others may be doped in the inter-layer insulation film 32.

In the inter-layer insulation film 32, trench-shaped openings 34a-34c exposing the source/drain regions 26 of the transistors 30a, 30b are formed. More specifically, the trench-shaped openings 34a-34c exposing the source/drain electrodes 28 of the transistors 30a, 30b are formed in the inter-layer insulation film 32. The opening 34a exposes the source/drain regions 26 of a transistor formed in a device region not illustrated, and the source/drain regions 26 of the transistor 30a formed in the device region 14a. The opening 34b exposes the source/drain regions 26 of the transistor 30a formed in the device region 14a, and the source/drain regions 26 of the transistor 30b formed in the device region 14b. The opening 34c exposes the source/drain region 26 of a transistor 30b formed in a device region 14b, and the source/drain region 26 of a transistor formed in a device region not illustrated. Thus, the openings 34a-34c expose the source/drain regions 26 of a plurality of transistors 30a, 30b formed in the device regions 14a, 14b different from each other.

In the inter-layer insulation film 32, trench-shaped openings 34d, 34e respectively exposing the gate interconnections 18a, 18b are formed. These openings 34d, 34d are formed along the longitudinal direction of the gate interconnections 18a, 18b.

The longitudinal direction of the openings 34a-34e are the same as the longitudinal direction of the gate interconnections 18a, 18b. The openings 34a-34e are extended perpendicularly as viewed in FIG. 1, i.e., up to down direction as viewed in FIG. 2. The width of the openings 34a-34e is, e.g., about 30 nm.

A barrier metal film (barrier metal) 36 is formed in the openings 34a-34e. The barrier metal film 36 is, e.g., the layer film of a Ti film and a TiN film. The film thickness of the Ti film is, e.g., about 4-6 nm. The film thickness of the TiN film is, e.g., about 4-6 nm.

In the openings 34a-34c with the barrier metal film 36 formed in, a conduction layer 38 is formed. As the material of the conduction layer 38, tungsten (W), for example, is used. The thickness of the conduction layer 38 is, e.g., about 70-80 nm. The conduction layer 38 is buried in the lower part of the openings 34a-34c. The conduction layer 38 is absent in the upper part of the openings 34a-34c. The height of the upper surface of the conduction layer 38 is equal to the height of the upper surfaces of the gate electrodes 18a, 18b or smaller than the height of the upper surfaces of the gate electrodes 18a, 18b.

The barrier metal film 36 covers the bottom surfaces and the entire side walls of the openings 34a-34e. The barrier metal film 36 in the openings 34a-34c covers not only the bottom surfaces and side walls of the lower parts of the openings 34a-34c but also the side walls of the upper parts of the openings 34a-34c.

The conduction layer 38 is absent in the openings 34d, 34e on the gate interconnections 18a, 18b.

In the openings 34a-34e, a barrier metal film (barrier metal) 40 of, e.g., an about 5-8 nm film thickness is formed. As the barrier metal film 40, for example, Ti film, Ta (tantalum) film or the layer film of them is used.

The barrier metal film 40 may contain nitrogen.

In the openings 34a-34e with the barrier metal film 40 formed in, a conduction layer 42 is buried. As the material of the conduction layer 42, a material whose conductivity is higher than that of the conduction layer 38 is used. As the material of the conduction layer 42, a material whose conductivity is higher than that of the gate interconnections 18a, 18b is used. Specifically, as the material of the conduction layer 42, a material containing, e.g., Cu is used. More specifically, as the material of the conduction layer 42, a copper alloy is used. The thickness of the conduction layer 42 is, e.g., about 280-320 nm.

As described above, the conduction layer 38 is buried in the lower part of the openings 34a-34c exposing a plurality of source/drain regions 26, and the conduction layer 42 whose conductivity is higher than that of the conduction layer 38 is buried in upper part of the openings 34a-34c. The layer body of the conduction layer 38 and the conduction layer 42 form interconnections 44a-44c. That is, in the openings 34a-34c, the interconnections 44a-44c formed of the layer body of the conduction layer 38 and the conduction layer are respectively buried. The interconnections 44a-44c are formed along the longitudinal direction of the gate interconnections 18a, 18b. The interconnections 44a-44c are called the local interconnects.

In the present embodiment, the conduction layer whose conductivity is higher than that of the conduction layer 38 is formed on the conduction layer 38, whereby the interconnections 44a-44c can have the electric resistance lowered in comparison with the interconnections 44a-44c formed of the conduction layer alone. Furthermore, in the present embodiment, the conduction layer 38 is buried in the lower part of the openings 34a-34c, and the conduction layer 42 is buried in the upper part of the openings 34a-34c. That is, the conduction layer 38 and the conduction layer 42 are buried in the same openings 34a-34c. Accordingly, no misregistration takes place between the conduction layer and the conduction layer 42. Consequently, the interconnections 44a-44c can have the electric resistance lowered without lowering the reliability and the yield. Thus, according to the present embodiment, the semiconductor device can have good electrical characteristics without lowering the reliability and the yield.

In the present embodiment, the interconnections 44a-44c are not formed of the conduction layer 42 alone, and the conduction layer 38 is provided below the conduction layer 42. This is for surely preventing by the conduction layer 38 the diffusion of the constituent atoms (e.g., Cu atoms) forming the conduction layer 42 into the source/drain regions 26. The conduction layer 38 of tungsten prevents the arrival of the Cu atoms in the conduction layer 42 at the source/drain regions 26.

In the openings 34d, 34e exposing the gate interconnections 18a, 18b, the conduction layer 38 is absent, and the conduction layer 42 is buried. Accordingly, in the openings 34d, 34e exposing the gate interconnections 18a, 18b, the conduction layer 42 is connected to the gate interconnections 18a, 18b via the barrier metal films 36, 40. Because the conduction layer whose conductivity is higher than that of the gate interconnections 18a, 18b is formed on the interconnections 18a, 18b, the electric resistance of the gate interconnections 18a, 18b can be decreased, and the semiconductor device can have good electric characteristics.

If the constituent atoms (e.g., Cu atoms) of the conduction layer 42 are diffused into the gate interconnections 18a, 18b, no special problem takes place. Consequently, no special problem takes place without the conduction layer 38 between the conduction layer 42 and the gate interconnections 18a, 18b.

The absence of the conduction layer 38 whose conductivity is lower than that of the conduction layer between the gate interconnections 18a, 18b and the conduction layer 42 can more contribute to the reduction of the electric resistance of the gate interconnections 18a, 18b in comparison with the presence of the conduction layer 38.

On the inter-layer insulation film 32 with the interconnections 44a-44c buried in the openings 34a-34c and the conduction layer 42 buried in the openings 34d, 34e, an inter-layer insulation film 46 of a silicon oxide film of, e.g., an about 90-110 nm-film thickness is formed.

In the inter-layer insulation film 46, contact holes 48 are formed down to the interconnections 44a-44c buried in the openings 34a-34c, and contact holes 48 are formed down to the conduction layer 42 buried in the openings 34d, 34e.

In the inter-layer insulation film 46, trenches 50 connected to the contact holes 48 are formed.

In the trenches 50 and the contact holes 48, a barrier metal film (barrier metal) 52 of, e.g., an about 5-8 nm-film thickness is formed. As the barrier metal film 52, for example, a Ti film, Ta (tantalum) film or their layer film is used.

The barrier metal film 52 may contain nitrogen.

In the trenches 50 and the contact holes 48 with the barrier metal film 52 formed in, a conduction layer containing, e.g., Cu is formed. More specifically, in the trenches 50 and the contact holes 48, a conduction layer of a copper alloy is formed. That is, the contact plugs 54a of the copper alloy are buried in the contact holes 48, and in the trenches 50, interconnections 54b of the copper alloy formed integrated with the conductor plugs 54a are buried.

Thus, the semiconductor device according to the present embodiment is constituted.

As described above, according to the present embodiment, the trench-shaped openings 34a-34c exposing the source/drains 26 of one transistor 30a and the source/drains 26 of another transistor 30b are formed. The conduction layer 38 is buried in the lower part of the openings 34a-34c, and the conduction layer 42 whose conductivity is higher than that of the conduction layer 38 is formed in the upper part of the openings 34a-34c. According to the present embodiment, because the conduction layer 42 whose conductivity is higher than that of the conduction layer 38 is formed on the conduction layer 38, the electric resistance of the interconnections 44a-44c can be decreased. Furthermore, the conduction layer 38 and the conduction layer 42, which are buried in the same openings 34a-34c, no misregistration takes place between the conduction layer and the conduction layer 42. Accordingly, the semiconductor device can have good electric characteristics without lowering the reliability and the yield.

According to the present embodiment, the trench-shaped openings 34d, 34e exposing the gate interconnections 18a, 18b are formed, and in the openings 34d, 34e, the conduction layer 34d, 34e whose conductivity is higher than that of the material of the gate interconnections 18a, 18b are buried. Furthermore, the conduction layer 38 whose conductivity is lower than that of the conduction layer 42 is absent between the gate interconnections 18a, 18b and the conduction layer 34d, 34e. Thus, according to the present embodiment, the electric resistance of the gate interconnections 18a, 18b can be decreased, and consequently, the semiconductor device can have good electric characteristics.

(Method of Manufacturing Method)

Next, the method of manufacturing the semiconductor device according to the present embodiment will be described with reference to FIGS. 3A to 10B. FIGS. 3A to 10B are sectional views of the semiconductor device according to the present embodiment in the steps of the method of manufacturing the semiconductor device, which illustrate the method.

First, the device isolation regions 12 defining the device regions 14a, 14b are formed in the semiconductor substrate 10 by STI (Shallow Trench Isolation). The semiconductor substrate 10 is, e.g., a silicon substrate. As the material of the device isolation regions 12, silicon oxide film, for example, is used (see FIG. 3A).

Then, the gate insulation film 17 is formed. As the gate insulation film 17, for example, a film including the high dielectric film 16 or others is formed. As the high dielectric film 16, for example, a hafnium oxide film 16 is formed. As the gate insulation film 17 here, the layer film of the silicon oxide film 15, and the hafnium oxide film 16 on the silicon oxide film 15 is formed. More specifically, first, the silicon oxide film is formed by, e.g., thermal oxidation. The film thickness of the silicon oxide film 15 is, e.g., about 0.5-0.8 nm. Next, by, e.g., ALD (Atomic Layer Deposition), the hafnium oxide film 16 is formed. The film thickness of the hafnium oxide film 16 is, e.g., about 1.0-1.5 nm.

Then, on the entire surface, a metal film of an about 45-55 nm-film thickness is formed by, e.g., PVD (Physical Vapor Deposition). As the material of the metal film, a metal, e.g., Ti, Al or others, is used.

Then, the metal film is patterned into the plane shape of the gate interconnections 18a, 18b by photolithography. Thus, the gate interconnections (gate electrodes) 18a, 18b are formed extended perpendicularly as viewed in FIG. 3B. The height of the gate interconnections 18a, 18b is, e.g., about 45-55 nm. The width of the gate interconnections 18a, 18b, i.e., the gate length is, e.g., about 32 nm.

The high dielectric film 16 is not essentially hafnium oxide film. For example, as the high dielectric film 16, an oxide containing Al, more specifically, aluminum oxide film may be used. As the high dielectric film 16, an oxide containing La, more specifically, lanthanum oxide film may be used. As the high dielectric film 16, an oxide containing Zr, more specifically, zirconium oxide film may be used.

The gate insulation film 17 is not essentially a layer film. For example, as the gate insulation film 17, a single layer of silicon oxide film, a single layer of a high dielectric film or others may be used.

A metal material forming the gate interconnections 18a, 18b may contain nitrogen or others.

The material of the gate interconnections 18a, 18b is not limited to a metal material. For example, as the material of the gate interconnections 18a, 18b, polysilicon or others may be used.

Next, with the gate electrodes 18a, 18b as the mask, a dopant impurity is implanted into the device regions 14a, 14b on both sides of the gate electrodes 18a, 18b by, e.g., ion implantation. Thus, the impurity diffused regions (lightly doped regions, extension regions) 22 forming the shallow regions of the extension source/drain structure are formed.

Next, by, e.g., CVD (Chemical Vapor Deposition), an insulation film of an about 25-35 nm-film thickness is formed. As the insulation film 20, for example, silicon oxide film, silicon nitride film or others is formed.

Next, the insulation film is anisotropically etched. Thus, the sidewall insulation film 20 is formed on the side walls of the gate interconnections 18a, 18b.

Next, by using as the mask the gate interconnections 18a, 18b with the sidewall insulation film 20 formed on, a dopant impurity is implanted by, e.g., ion implantation in the device regions 14a, 14b on both sides of the gate interconnections 18a, 18b with the sidewall insulation film 20 formed on. Thus, impurity diffused regions (highly doped impurity regions) 24 forming the deep regions of the source/drain regions of the extension source/drain structure are formed.

Thus, the source/drain regions (source/drain diffused layer) 26 of the extension source/drain structure including the lightly doped impurity regions 22, and the highly doped impurity regions 24 formed deeper than the lightly doped impurity regions 22 are formed (see FIG. 3C).

Next, on the entire surface, a metal film of, e.g., an about 15-25 nm-film thickness is formed by, e.g., sputtering. As the metal film, for example, nickel film, nickel platinum film, cobalt film or others is formed.

Next, heat processing is made to react the metal atoms in the metal film and the silicon atoms in the semiconductor substrate 10. Thus, a silicide film 28 is formed on the source/drain regions 26. As the silicide film 28, for example, nickel silicide film, nickel platinum silicide film, cobalt silicide film or others is formed. The silicide film 28 on the source/drain regions 26 function as the source/drain electrodes.

In the case that polysilicon is used as the material of the gate interconnections 18a, 18b, the silicide film is formed also on the gate interconnections 18a, 18b.

Thus, the transistors 30a, 30b including the gate interconnections 18a, 18b and the source/drain regions 26 are formed (see FIG. 4A).

The present embodiment has been described by means of the case that the planar type transistors 30a, 30b are formed, but the transistors 30a, 30b are not limited to the planar type transistors. Non-planar type transistors, e.g., double gate type transistors, tri-gate type transistors or others may be formed.

Then, the stress inducive film (stress film) (not illustrated) which induces stresses in the channel regions of the transistors 30a, 30b may be formed on the semiconductor substrate 10.

After the source/drain regions 26 have been formed and before the silicide film 28 is formed, a stressor (not illustrated), such as a silicon germanium layer, a silicon carbon layer or others, may be buried in the source/drain regions 26.

Next, on the semiconductor substrate 10 with the transistors 30a, 30b formed on, the inter-layer insulation film 32 of a silicon oxide film of, e.g., a 100-130 nm-film thickness is formed by, e.g., CVD.

The inter-layer insulation film 32 may be formed of silicon oxide film doped with P, B or others.

The inter-layer insulation film 32 is not limited to silicon oxide film. For example, as the inter-layer insulation film 32, a low dielectric film (low-k film) whose dielectric constant is lower than silicon dioxide or others may be formed.

Next, the surface of the inter-layer insulation film 32 is planarized by, e.g., CMP (Chemical Mechanical Polishing) (see FIG. 4B).

Next, on the entire surface, a photoresist film (not illustrated) is formed by, e.g., spin coating.

Next, by photolithography, openings (not illustrated) are formed in the photoresist film. The openings are for forming the trench-shaped openings 34a-34e.

Then, by, e.g., RIE (Reactive Ion Etching) with the photoresist film as the mask, the inter-layer insulation film 32 is etched to form the trench-shaped openings 34a-34e in the inter-layer insulation film 32 (see FIGS. 2 and 4C). The openings 34a-34e are formed perpendicularly as viewed in FIG. 4C. The opening 34a is formed, exposing the source/drain region 26 of a transistor formed in a device region not illustrated, and the source/drain region 26 of the transistor 30a formed in the device region 14a. The opening 34b is formed, exposing the source/drain region 26 of the transistor 30a formed in the device region 14a, and the source/drain region 26 of the transistor 30b formed in the device region 14b. The opening 34c is formed, exposing the source/drain region 26 of the transistor 30b formed in the device region 14b, and the source/drain region 26 of the transistor formed in a device region not illustrated. Thus, the openings 34a-34c are formed, exposing the source/drain regions 26 of a plurality of transistors 30a, 30b formed in device regions 14a, 14b different from each other. The openings 34d, 34e are formed, exposing the gate interconnections 18a, 18b. The width of the openings 34a-34e is, e.g., about 30 nm.

Then, the photoresist film is removed by, e.g., asking.

Next, on the entire surface, a Ti film of, e.g., an about 4-6 nm-film thickness, and a TiN film of, e.g., an about 4-6 nm-film thickness are sequentially formed by, e.g., CVD. Thus, the barrier metal film 36 of the layer film of the Ti film and the TiN film is formed. The barrier metal film 36 is formed on the inter-layer insulation film 32 and also on the bottom surfaces and the side walls of the openings 34a-34e (see FIG. 5A).

Next, the conduction layer 38 of, e.g., an about 70-80 nm-film thickness is formed on the entire surface by, e.g., CVD (see FIG. 5B). As the conduction layer 38, a tungsten film, for example, is formed.

Then, the conduction layer 38 and the barrier metal film 36 are polished by, e.g., CMP until the surface of the inter-layer insulation film 32 is exposed. Thus, the conduction layer 38 is buried in the openings 34a-34c (see FIG. 6A). The conduction layer 38 on the inter-layer insulation film 32 has been polished off in advance before the conduction layer 38 is etched later (see FIG. 6B), which reduces the amount of the conduction layer 38 to be removed in etching the conduction layer 38, and the contamination in the chamber can be suppressed.

Next, the upper part of the conduction layer 38 buried in the openings 34a-34c is etched off by, e.g., CDE (Chemical Dry Etching) (see FIG. 6B). The etched amount of the conduction layer 38 is, e.g., about 55-65 nm. In etching the conduction layer 38, the etching is made until the conduction layer 38 is absent at least in the openings 34d, 34e. The height of the upper surface of the conduction layer 38 in the openings 34a-34c is the same as or smaller than the height of the upper surfaces of the gate electrodes 18a, 18b. The conduction layer 38 is absent in the upper part of the openings 34a-34c, and is buried in the lower part of the openings 34a-34c. In the openings 34d, 34e on the gate interconnections 18a, 18b, the conduction layer 38 is absent.

The conditions for etching the conduction layer 38 by CDE are as exemplified below. The pressure in the chamber of the CDE system is, e.g., about 20 Pa. The gases to be introduced in the chamber are, e.g., $SF_6$ gas and $O_2$ gas. The flow rate of the $SF_6$ gas is, e.g., about 250 sccm. The flow rate of the $O_2$ gas is, e.g., about 50 sccm. The high-frequency power of the remote plasma is about 200-400 W. The stage temperature is, e.g., about 25° C.

The insides of the openings 34a-34e remain covered by the barrier metal film 38. That is, the bottom surfaces and the side walls of the openings 34a-34e remain covered by the barrier metal film 38. Inside the openings 34a-34c, the bottom surfaces and the side walls of the lower part of the opening 34a-34c remain covered by the barrier metal film 38, and the side walls of the upper part of the openings 34a-34c remain covered by the barrier metal 38.

Next, on the entire surface, the barrier metal film 40 of, e.g., an about 5-8 nm-film thickness is formed by, e.g., PVD (see FIG. 7A). As the barrier metal film 40, for example, a Ti film, a Ta (tantalum) film or their layer film is formed.

The barrier metal film 40 may contain nitrogen.

Next, on the entire surface, a seed layer (not illustrated) of, e.g., an about 30-40 nm-film thickness is formed by, e.g., PVD. As the material of the seed layer, a copper alloy, for example, is used.

Then, on the entire surface, the conduction layer 42 of, e.g., an about 280-320 nm-film thickness is formed by, e.g., electroplating (see FIG. 7B). As the material of the conduction layer 42, a material whose conductivity is higher than that of the conduction layer 38 is used. As the material of the conduction layer 42, a material whose conductivity is higher than that of the gate interconnections 18a, 18b is used. Specifically, as the material of the conduction layer 42, a material containing, e.g., Cu is used. More specifically, as the material of the conduction layer 42, a copper alloy is used.

Next, the conduction layer 42 and the barrier metal film 40 are polished by, e.g., CMP until the surface of the inter-layer insulation film 32 is exposed (see FIG. 8A). Thus, the conduction layer 42 is formed in the openings 34a-34e.

Thus, the conduction layer 38 is buried in the lower part of the openings 34a-34c exposing a plurality of source/drain regions 26, and the conduction layer 42 whose conductivity is higher than that of the conduction layer 38 is buried in the upper part of the openings 34a-34c. The layer body of the conduction layer 38 and the conduction layer 42 form the interconnections 44a-44c. That is, the interconnections 44a-44c formed of the layer body of the conduction layer 38 and the conduction layer 42 are buried respectively in the openings 34a-34c. The interconnections 44a-44c are formed extended along the longitudinal direction of the gate interconnections 18a, 18b.

In the present embodiment, the conduction layer whose conductivity is higher than that of the conduction layer 38 is formed on the conduction layer 38, whereby in comparison with the case that the interconnections 44a-44c are formed of the conduction layer 38 alone, the interconnections 44a-44c can have lower electric resistance. Furthermore, in the present embodiment, the conduction layer 38 is buried in the lower part of the openings 34a-34c, and the conduction layer 42 is buried in the upper part of the openings 34a-34c. That is, the conduction layer 38 and the conduction layer 42 are buried in the same openings 34a-34c. Consequently, no misregistration takes place between the conduction layer 38 and the conduction layer 42. Resultantly, without lowering the reliability and the yield, the interconnections 44a-44c of low electric resistance can be formed. Thus, according to the present embodiment, without lowering the reliability and the yield, the semiconductor device can have good electric characteristics.

The conduction layer 38 is absent in the openings 34d, 34e exposing the gate interconnections 18a, 18b, and the conduction layer 42 is buried in. Accordingly, in the openings 34d, 34e exposing the gate interconnections 18a, 18b, the conduction layer 42 is connected to the gate interconnections 18a, 18b via the barrier metal films 36, 40. Because the conduction layer whose conductivity is higher than that of the gate interconnections 18a, 18b is formed on the gate interconnections 18a, 18b, the electric resistance of the gate interconnections 18a, 18b can be decreased, and the semiconductor device can have good electric characteristics.

Next, on the entire surface, the inter-layer insulation film 46 of, e.g., an about 90-110 nm-film thickness is formed by, e.g., CVD (see FIG. 8B).

Next, by photolithography, the contact holes 48 down to the interconnections 44a-44c and the contact holes 48 down to the conduction layer 42 on the gate interconnections 18a, 18b are formed in the inter-layer insulation film 46 (see FIG. 9A).

Next, by photolithography, the trenches 50 connected to the contact holes 48 are formed in the inter-layer insulation film 46 (see FIG. 9B).

Next, on the entire surface, the barrier metal film 52 of, e.g., an about 5-8 nm-film thickness is formed by, e.g., PVD. As the barrier metal film 52, for example, a Ti film, a Ta (tantalum) film or their layer film is formed.

The barrier metal film 52 may contain nitrogen.

Next, on the entire surface, a seed layer (not illustrated) of, e.g., an about 30-40 nm-film thickness is formed by, e.g., PVD. As the material of the seed layer, a copper alloy, for example, is used.

Next, on the entire surface, the conduction layer 54 of, e.g., an about 1.8-1.2 µm-film thickness is formed by, e.g., electroplating (see FIG. 10A). As the material of the conduction layer 54, for example, a material containing Cu is used. More specifically, as the material of the conduction layer 54, a copper alloy is used.

Then, the conduction layer 54 and the barrier metal film 52 are polished by, e.g., CMP until the surface of the inter-layer insulation film 46 is exposed. Thus, the conductor plugs 54a are buried in the contact holes 48, and the interconnections 54b connected to the conductor plugs 54a are formed in the trenches 50. The conductor plugs 54a and the interconnections 54b are formed integral (see FIG. 10B).

Thus, the semiconductor device according to the present embodiment is formed.

As described above, according to the present embodiment, the trench-shaped openings 34a-34c exposing the source/drains 26 of one transistor 30a and the source/drains 26 of another transistor 30b are formed. The conduction layer 38 is buried in the lower part of the openings 34a-34c, and the conduction layer 42 whose conductivity is higher than that of the conduction layer 38 is buried in the upper part of the openings 34a-34c. According to the present embodiment, because the conduction layer 42 whose conductivity is higher than that of the conduction layer 38 is formed on the conduction layer 38, the electric resistance of the interconnections 44a-44c can be decreased. Furthermore, the conduction layer 38 and the conduction layer 42 are buried in the same openings 34a-34c, whereby no misregistration takes place between the conduction layer 38 and the conduction layer 42. Thus, the semiconductor device can have good electric characteristics without impairing the reliability and the yield.

According to the present embodiment, the trench-shaped openings 34d, 34e exposing the gate interconnections 18a, 18b are formed, and the conduction layers 42 whose conductivity is higher than that of the material of the gate interconnections 18a, 18b are buried in the opening 34d, 34e. Thus, according to the present embodiment, the electric resistance of the gate interconnections 18a, 18b can be decreased, and consequently the semiconductor device can have good electric characteristics.

Modification 1

Figure 11:
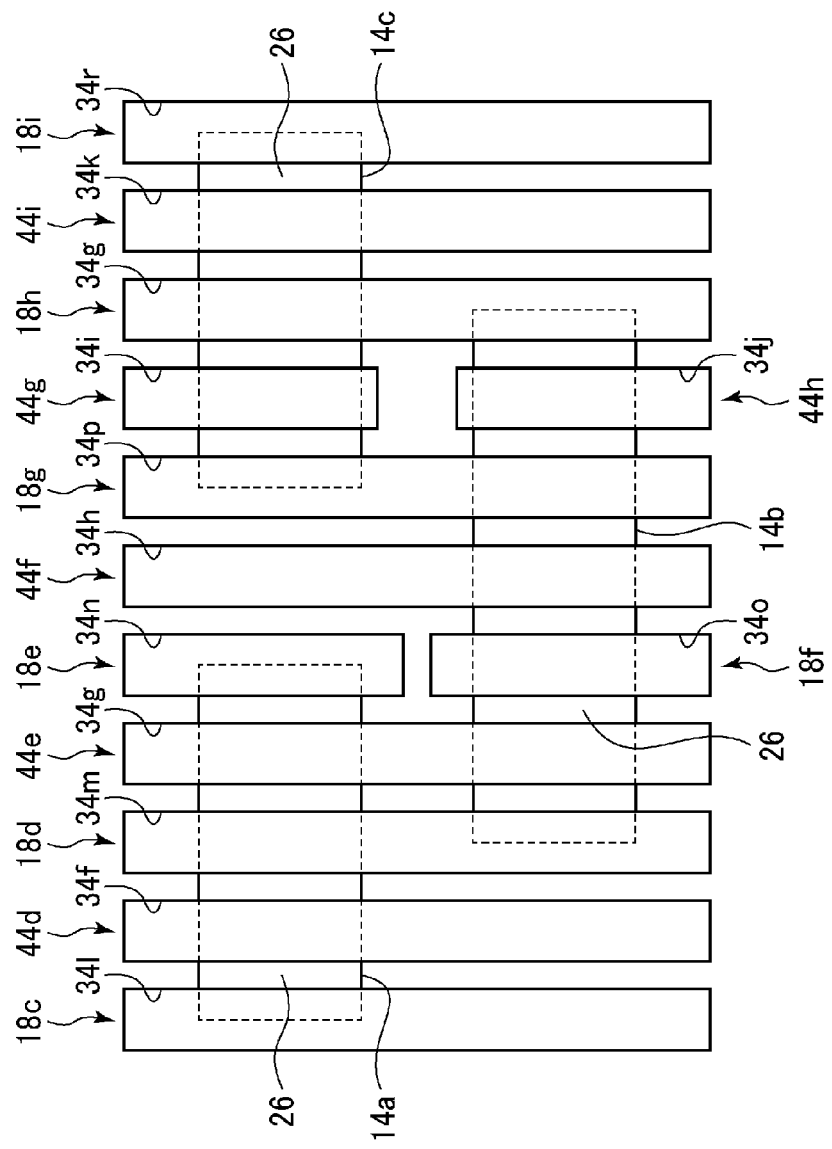
FIG. 11 is a plan view of an example of a layout of a semiconductor device according to a modification (Part 1) of the first embodiment.

Next, the semiconductor device according to Modification 1 of the present embodiment will be described with reference to FIG. 11. FIG. 11 is a plan view of an example of the layout of the semiconductor device according to the present modification.

As illustrated in FIG. 11, in the semiconductor device 10, device isolation regions 14a-14c defined by the device isolation regions 12 are formed.

On the semiconductor substrate 10 with the device regions 14a-14c formed in, gate interconnections 18c-18i are formed.

In the inter-layer insulation film 32 (see FIG. 1), trench-shaped openings 34f-34k exposing a plurality of source/drain regions 26 are formed. The conduction layer 38 is buried in the lower part of the openings 34f-34k, and the conduction layer 42 is buried in the upper part of the openings 34f-34k. In the openings 34f-34k, the interconnections (or dummy patterns) 44d-44i including the conduction layer 38 and the conduction layer 42 whose conductivity is higher than that of the conduction layer 38 are buried. Because the conduction layer 42 whose conductivity is higher than that of the conduction layer 38 is formed on the conduction layer 38, the electric resistance of the interconnections 44d-44i can be low.

In the inter-layer insulation film 32 (see FIG. 1), openings 34l-34r exposing gate interconnections (or dummy patterns) 18c-18i are formed. In the openings 34l-34r, the conduction layer 42 is buried. Because the conduction layer 42 whose conductivity is higher than that of the gate interconnections 18c-18i is formed on the gate interconnections 18c-18i, the electric resistance of the gate interconnections 18c-18i can be low.

The semiconductor device may have such layout.

Modification 2

Figure 12:
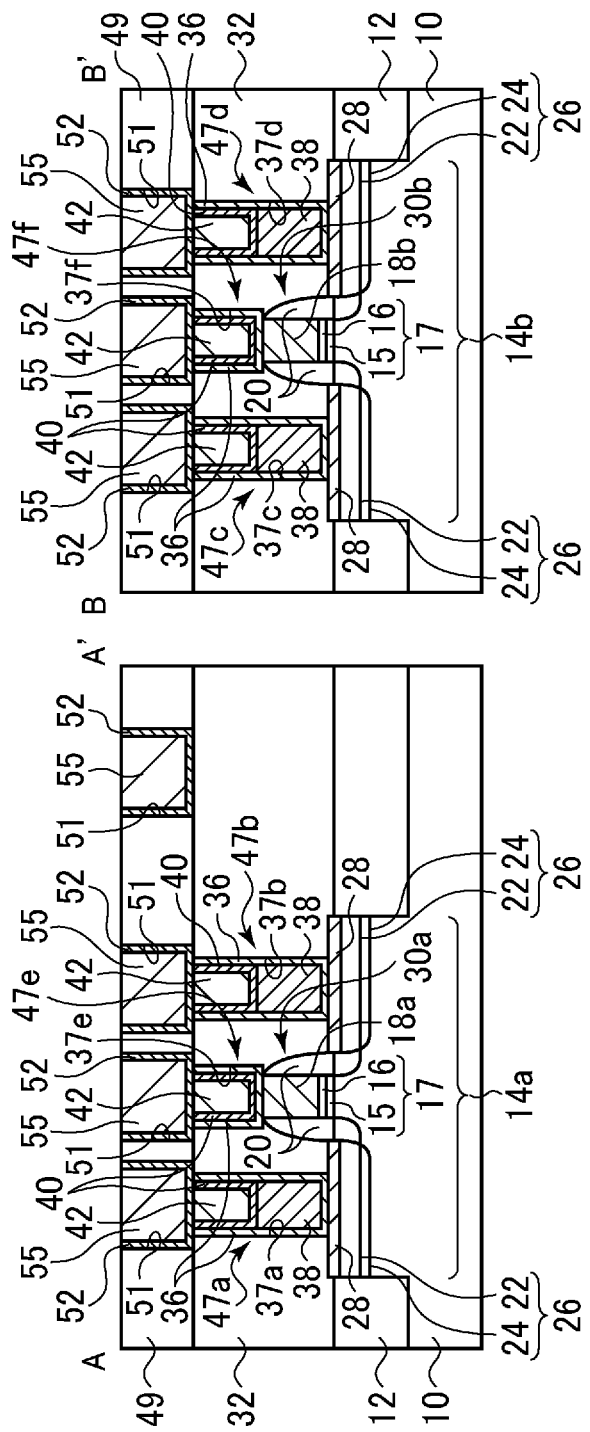
FIG. 12 is sectional views of a semiconductor device according to a modification (Part 2) of the first embodiment.
Figure 13:
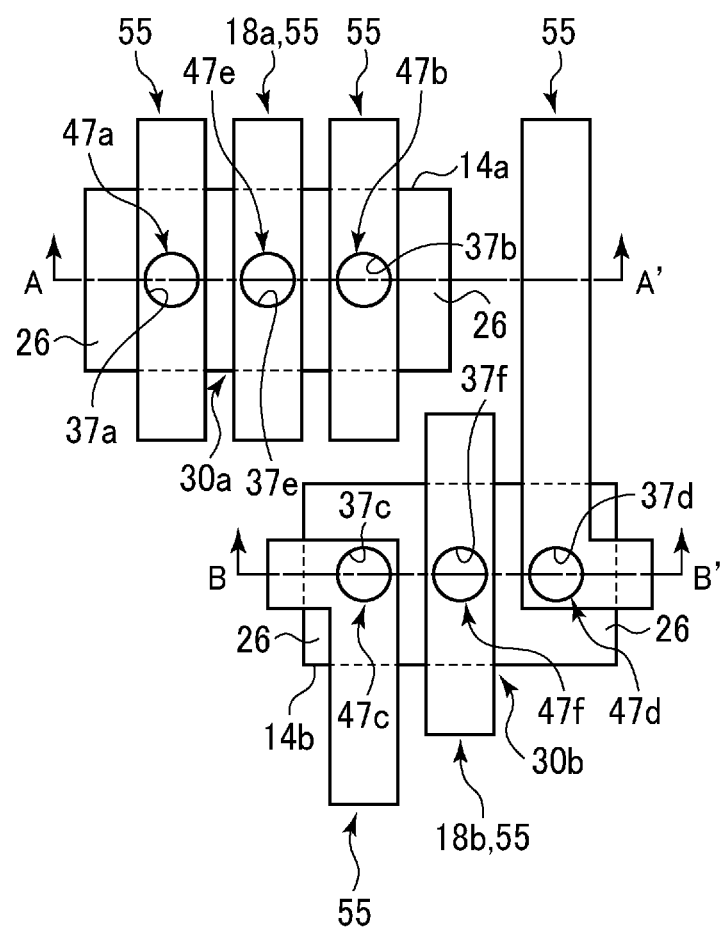
FIG. 13 is a plan view of the semiconductor device according to the modification (Part 2) of the first embodiment.

Next, the semiconductor device according to Modification 2 will be described with reference to FIGS. 12 and 13. FIG. 12 is sectional views of the semiconductor device according to the present modification. FIG. 13 is a plan view of the semiconductor device according to the present modification. The drawing on the left side in FIG. 12 is the A-A' line sectional view of FIG. 12. The drawing on the right side in FIG. 12 is the B-B' line sectional view of FIG. 13.

As illustrated in FIG. 12, in the inter-layer insulation film 32, contact holes (openings) 37a-37d which arrive respectively at source/drain regions 26, and contact holes (openings)

37e, 37f which arrive respectively at gate interconnections (gate electrodes) 18a, 18b are formed. The diameter of the contact holes 37a-37f is, e.g., about 45-55 nm.

In the contact holes 37a-37f, the barrier metal film 36 is formed. The barrier metal film 36 is formed of, e.g., the layer film of a Ti film and a TiN film.

In the openings 37a-37d with the barrier metal film 36 formed in, the conduction layer 38 is formed. As the material of the conduction layer 38, tungsten, for example, is used. The thickness of the conduction layer 38 is, e.g., about 70-80 nm. The conduction layer 38 is buried in the lower part of the contact holes 37a-37d. The conduction layer 38 is absent in the upper part of the contact holes 37a-37d. The height of the upper surface of the conduction layer 38 is the same as or smaller than the height of the upper surfaces of the gate electrodes 18a, 18b.

The barrier metal film 36 covers all the bottom surfaces and the side walls of the contact holes 37a-37d. That is, the barrier metal film 36 in the openings 37a-37d covers the bottom surfaces and side walls of the lower part of the contact holes 37a-37d and also the side walls of the upper part of the contact holes 37a-37d.

The conduction layer 38 is absent in the contact holes 37e, 37f reaching the gate interconnections 18a, 18b.

In the contact holes 37a-37f, the barrier metal film (barrier metal) 40 of, e.g., an about 5-8 nm-film thickness is formed. As the barrier metal film 40, for example, a Ti film, Ta (tantalum) film or their layer film is used.

The barrier metal film 40 contains nitrogen.

The conduction layer 42 is buried in the contact holes 37a-37f with the barrier metal film 40 formed in. As the material of the conduction layer 42, a material whose conductivity is higher than that of the conduction film 38 is used. As the material of the conduction layer 42, a material whose conductivity is higher than that of the gate interconnections 18a, 18b is used. Specifically, as the material of the conduction layer 42, a material containing, e.g., Cu is used. More specifically, as the material of the conduction layer 42, a copper alloy is used. The thickness of the conduction layer 42 is, e.g., about 280-320 nm.

As described above, the conduction layer 38 is buried in the lower part of the contact holes 37a-37d exposing a plurality of source/drain regions 26. In the upper part of the contact holes 37a-37d, the conduction layer 42 whose conductivity is higher than that of the conduction layer 38 is buried. The interconnections 44a-44c are formed of the layer body of the conduction layer 38 and the conduction layer 42. That is, in the contact holes 37a-37d, the conductor plugs 47a-47d formed of the layer body of the conduction layer 38 and the conduction layer 42 are respectively buried.

In the present modification, the conduction layer 42 whose conductivity is higher than the conduction layer 38 is formed on the conduction layer 38, whereby the conductor plugs 47a-47d can have a lower electric resistance in comparison with the case that the conductor plugs 47a-47d are formed of the conduction layer 38 alone. Furthermore, in the present embodiment, the conduction layer 38 is buried in the lower part of the contact holes 37a-37d, and the conduction layer 42 is buried in the upper part of the contact holes 37a-37d. That is, the conduction layer 38 and the conduction layer are buried in the same contact holes 37a-37d. Accordingly, no misregistration takes place between the conduction layer 38 and the conduction layer 42. Consequently, the electric resistance of the conductor plugs 47a-47d can be low without lowering the reliability and the yield. Thus, according to the present modification, the semiconductor device can have good electric characteristics without lowering the reliability and the yield.

The conductor plugs 47a-47d are not formed of the conductor layer 42 alone, and the conduction layer 38 is present below the conduction layer 42 so that the diffusion of the constituent atoms (e.g., Cu atoms) of the conduction layer 42 into the source/drain regions 26 can be surely prevented. The conduction layer 38 of tungsten prevents the arrival of the Cu atoms in the conduction layer 42 arriving at the source/drain regions 26.

In the contact holes 37e, 37f reaching the gate interconnections 18a, 18b, the conduction layer 38 is absent, and the conduction layer 42 is buried. Accordingly, in the contact holes 37e, 37f reaching the gate interconnections 18a, 18b, the conduction layer 42 is connected to the gate interconnections 18a, 18b via the barrier metal films 36, 40. Thus, in the contact holes 37e, 37f, the conductor plugs 47c, 47f formed of the conduction layer 42 are respectively buried. The conductor plugs 47e, 47f are formed of the conduction layer 42 whose conductivity is higher than the conduction layer 38, whereby the electric resistance between the interconnections 55 which will be described later and the gate interconnections 18a, 18b can be decreased, and the semiconductor device can have good electric characteristics.

Even if the constituent atoms (e.g., Cu atoms) of the conduction layer 42 are diffused into the gate interconnections 18a, 18b, no special problem takes place. Accordingly, even without the conduction layer 38 between the conduction layer 42 and the gate interconnections 18a, 18b, no special problem takes place.

The absence of the conduction layer 38, whose conductivity is lower than that of the conduction layer 42, between the gate interconnections 18a, 18b and the conduction layer 42 rather can contributes to the decrease of the electric resistance between the interconnections 55 and the gate interconnections 18a, 18b in comparison with that case that the conduction layer 38 is present.

On the inter-layer insulation film 32 with the conductor plugs 47a-47f buried in, the inter-layer insulation film 49 of, e.g., an about 90-110 nm film thickness is formed. As the material of the inter-layer insulation film 49, a low-k material, such as SiOC or others, SiO$_2$ or others is used.

In the inter-layer insulation film 49, trenches (openings) 51 exposing the conductor plugs 47a-47f are formed.

In the trenches 51, the barrier metal film (barrier metal) 53 of, e.g., an about 4-6 nm-film thickness is formed. As the barrier metal film 53, for example, a Ti film, a Ta (tantalum) film or their layer film is used.

The barrier metal film 53 may contain nitrogen.

In the trenches 51 with the barrier metal film 53 formed in, the interconnections 55 are buried. As the material of the interconnections 55, a material containing Cu, for example, is used. More specifically, as the material of the interconnections 55, a copper alloy is used.

Thus, the semiconductor device according to the present modification is constituted.

As described above, according to the present modification, the conduction layer 38 is buried in the lower part of the contact holes 37a-37d, and the conduction layer 42 whose conductivity is higher than that of the conduction layer 38 is buried in the upper part of the contact holes 37a-37d. Thus, the electric resistance of the conductor plugs 47a-47d can be deceased in comparison with the case that the conductor plugs 47a-47d are formed of the conduction layer 38 alone. Furthermore, the conduction layer 38 and the conduction layer 42 are buried in the same contact holes 37a-37d, whereby no misregistration takes place between the conduction layer 38 and the conduction layer 42. Accordingly, the electric resistance of the conductor plugs 47a-47d can be low without decreasing the reliability and the yield. Thus, according to the present modification, the semiconductor device can have good electric characteristics without decreasing the reliability and the yield.

According to the present modification, in the contact holes 37e, 37f exposing the gate interconnections 18a, 18b, the conduction layer 38 is absent, and the conduction layer 42 whose conductivity is higher than that of the conduction layer 38 is buried. On the gate interconnections 18a, 18b, the conductor plugs 47e, 47f are formed of the conduction layer 42 alone, whereby the electric resistance of the conductor plugs 47e, 47f can be low.

As described above, the shape of the openings 37a-37f may be hole-shaped.

[b] Second Embodiment (Semiconductor Device)

The semiconductor device according to a second embodiment and its manufacturing method will be described with reference to FIGS. 14 to 21. The same members as those of the semiconductor device according to the first embodiment and its manufacturing method illustrated in FIGS. 1 to 13 are represented by the same reference numbers not to repeat or to simplify the description.

(Semiconductor Device)

Figure 14:
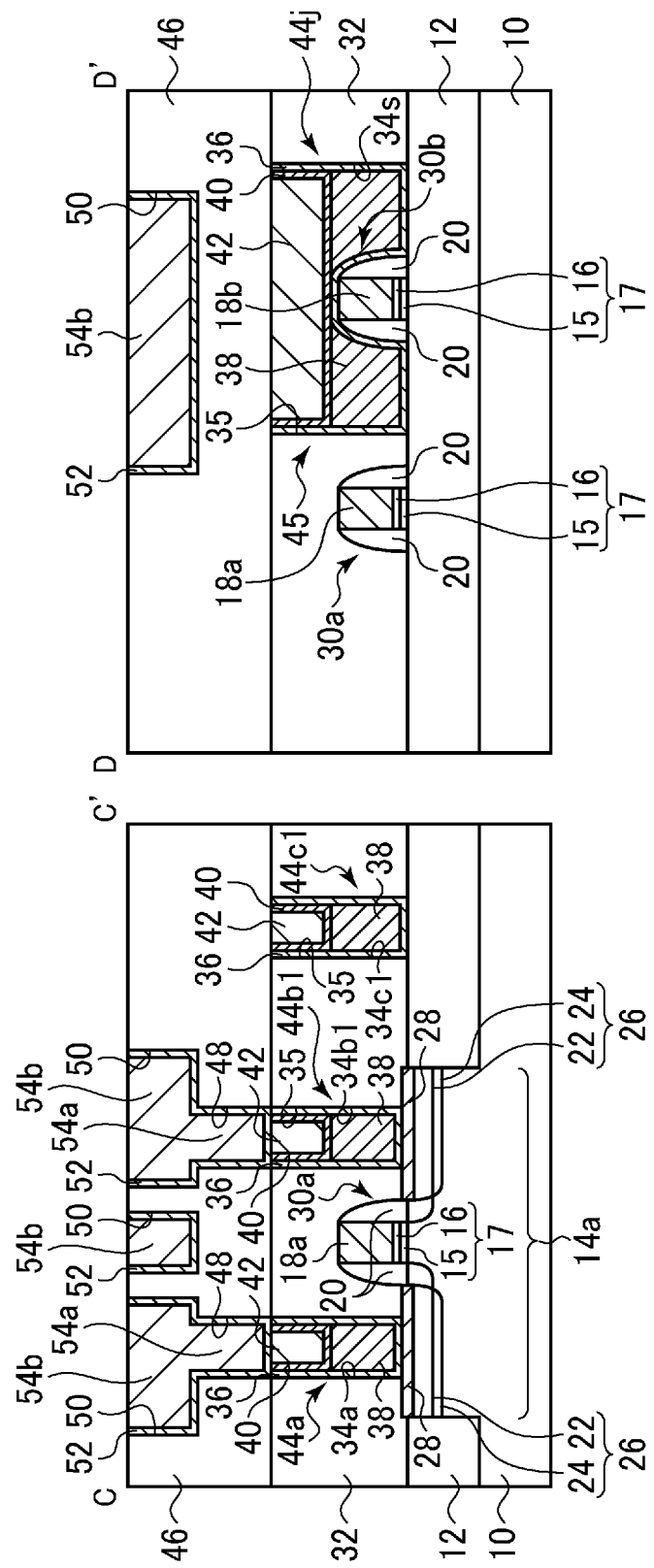
FIG. 14 is sectional views of a semiconductor device according a second embodiment.
Figure 15:
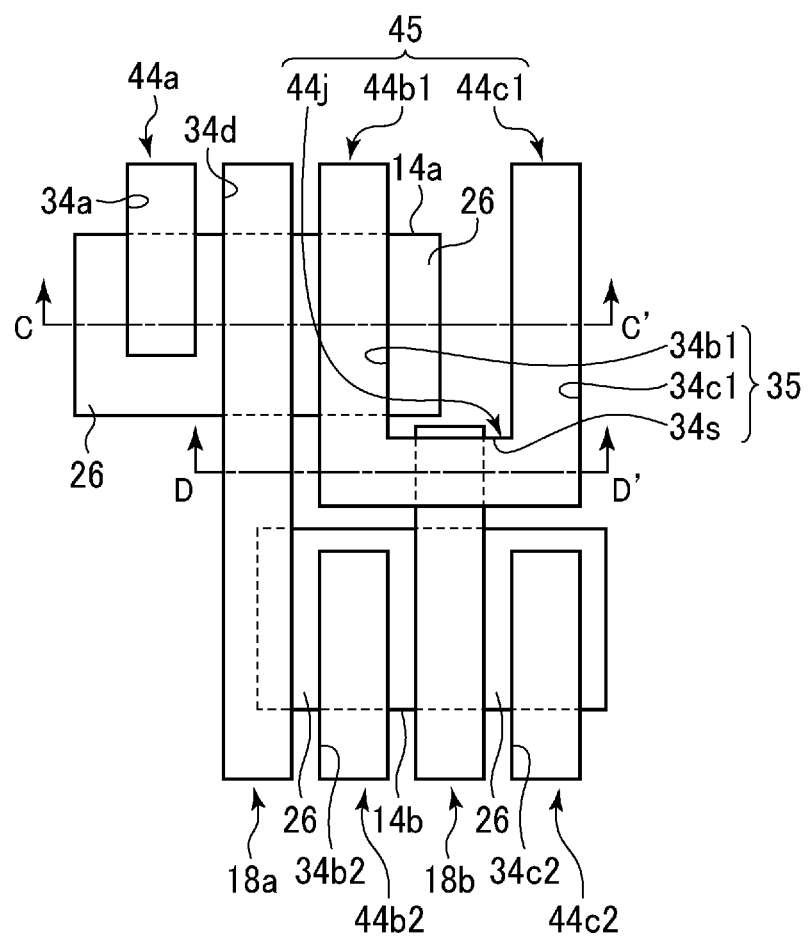
FIG. 15 is a plan view of the semiconductor device according to the second embodiment.

The semiconductor device according to a second embodiment and its manufacturing method will be described with reference to FIGS. 14 and 15. FIG. 14 is sectional views of the semiconductor device according to the present embodiment. FIG. 15 is a plan view of the semiconductor device according to the present embodiment. The drawing on the left side in FIG. 14 is the C-C' line sectional view of FIG. 15. The drawing on the right side of FIG. 14 is the D-D' line sectional view of FIG. 15.

In the semiconductor device according to the present embodiment, the trench-shaped opening pattern 34b1 exposing the source/drain regions 26, a trench-shaped opening pattern 34c1, and an opening pattern 34s exposing a gate interconnection 18b are formed integral.

As illustrated in FIGS. 14 and 15, a plurality of the trench-shaped opening patterns (openings) 34a, 34b1, 34b2, 34c1, 34c2 are formed in the inter-layer insulation film 32. The opening patterns 34a, 34b1, 34b2, 34c2 expose the source/drain regions 26. To the opening patterns 34b1, 34c1, an opening pattern (opening) 34s exposing at least a part of the gate interconnection 18b is connected. The opening 34s exposes the upper surfaces of the gate interconnections 18 on the device isolation regions 12. The longitudinal direction of the opening pattern 34s intersects the longitudinal direction of the gate interconnection 18b. More specifically, the longitudinal direction of the opening pattern 34s is perpendicular to the longitudinal direction of the gate interconnection 18b. The opening pattern 34b1, the opening pattern 34c1 and the opening pattern 34s are formed integral. In other words, an opening (opening pattern) 35 containing the partial opening (opening pattern) 34b1, the partial opening (opening pattern) 34c1 and the partial opening (opening pattern) 34s is formed in the inter-layer insulation film 32.

In the openings 34a, 34b2, 34c2, 35, the barrier metal film 36 is formed. The barrier metal film 36 in the openings 34a, 34b2, 34c2, 35 covers the bottom surfaces and the side walls of the openings 34a, 34b2, 34c2, 35. In the partial opening (opening pattern) 34s, the barrier film 36 covers the upper surface of the gate interconnection 18b exposed in the opening pattern 34s and also the sidewalls insulation film 20 exposed in the opening pattern 34s.

The conduction layer 38 is buried in the lower part of the opening 34a, 34b2, 34c2, 35 with the barrier metal film 36 formed in. The conduction layer 38 is absent directly on the gate interconnection 18b.

The barrier metal film 40 is formed in the openings 34a, 34b2, 34c2, 35 with the conduction layer 38 buried in.

The conduction layer 42 is formed in the openings 34a, 34b2, 34c2, 35 with the barrier metal film 40 formed in.

Thus, in the openings 34a, 34b2, 34c2, interconnections 44a, 44b2, 44c2 including the conduction layer 38 and the conduction layer 42 whose conductivity is higher than that of the conduction layer 38 are respectively buried.

In the opening patterns 34b1, 34c1, 34s, i.e., in the opening 35, the interconnection patterns 44b1, 44c1, 44j including the conduction layer 38 and the conduction layer 42 whose conductivity is higher than that of the conduction layer 38 are buried. The interconnection pattern 44b1 buried in the opening pattern 34b1, the interconnection pattern 44c1 buried in the opening pattern 34c1 and the interconnection pattern 44j buried in the opening pattern 34s form the interconnection (interconnection pattern) 45. In the opening pattern 34a, the conduction layer 42 of the interconnection 45 is connected to the gate interconnection 18b via the barrier metal 40.

As described above, the opening 35 including the trench-shaped opening pattern 34b1 exposing the source/drain regions 26, the trench-shaped opening pattern 34c1 and the opening pattern 34s exposing a part of the gate interconnection 18b may be formed. In such opening 35, the conduction layer 38, and the interconnection 45 including the conduction layer 38 and the conduction layer 42 whose conductivity is higher than that of the conduction layer 38 may be buried. According to the present embodiment, the interconnections 44b1, 44c1 and the gate interconnection 18b of the transistor 30b can be electrically connected at a low electric resistance.

(Method of Manufacturing the Semiconductor Device)

Next, the method of manufacturing the semiconductor device according to the present embodiment will be described with reference to FIGS. 16A to 21. FIGS. 16A to 21 are sectional views of the semiconductor device according to the present embodiment in the steps of the method of manufacturing the semiconductor device, which illustrate the method.

The step of forming the device isolation regions 12 to the step of planarizing the surface of the inter-layer insulation film 32 are the same as those of the method of manufacturing the semiconductor device according to the first embodiment described above with reference to FIGS. 3A to 4B, and their description will not be repeated (see FIG. 16A).

Next, on the entire surface, a photoresist film (not illustrated) is formed by, e.g., spin coating.

Next, by photolithography, the opening patterns (openings) (not illustrated) are formed in the photoresist film. Such opening patterns are for forming the trench-shaped opening patterns (openings) 34a, 34b1, 34b2, 34c1, 34c2, 34s in the inter-layer insulation film 32.

Then, the inter-layer insulation film 32 is etched by, e.g., RIE with the photoresist film as the mask to form the trench-shaped opening patterns 34a, 34b1, 34b2, 34c1, 34c2, 34s in the inter-layer insulation film (see FIGS. 15 and 16B). The opening patterns 34a, 34b1, 34b2, 34c1, 34c2 are formed, extended perpendicularly as viewed in FIG. 16. That is, the opening patterns 34a, 34b1, 34b2, 34c1, 34c2 are formed along the longitudinal direction of the gate interconnections 18a, 18b. The opening pattern 34s is formed, extended left to right direction as viewed in FIG. 16. That is, the opening pattern 34s is formed, crossing the longitudinal direction of the gate interconnections 18a, 18b. The openings 34a is formed, exposing the source/drain region of a transistor formed in the device region not illustrated, and the source/drain region 26 of the transistor 30a formed in the device region 14a. The opening pattern 34b1 is formed, exposing the source/drain region 26 of the transistor 30a formed in the device region 14a. The opening pattern 34b2 is formed, exposing the source/drain region 26 of the transistor 30b formed in the device region 14b, and the source/drain region 26 of a transistor formed in a device region not illustrated. The opening pattern 34c1 is formed, exposing the source/drain region 26 of a transistor of a device region not illustrated. The opening pattern 34c2 is formed, exposing the source/drain region 26 of the transistor 30b formed in the device region 14b, and the source/drain region 26 of a transistor formed in a device region not illustrated.

As described above, the openings patterns 34a, 34b1, 34b2, 34c1, 34c2 are formed, exposing the source/drain regions 26 of a plurality of transistors 30a, 30b formed in the device regions 14a, 14b different from each other. The opening pattern 34s is formed, exposing a part of the upper surface of the gate interconnection 18b. The opening pattern 34b, the opening pattern 34c and the opening pattern 34s form the opening (opening pattern) 35. The width of the opening patterns 34a-34c, 34s is, e.g., about 30 nm.

Then, the photoresist film is released by, e.g., asking.

Next, in the same way as in the method of manufacturing the semiconductor device according to the first embodiment describe above with reference to FIG. 5A, the barrier metal film 36 is formed (see FIG. 17A).

Then, in the same way as in the method of manufacturing the semiconductor device according to the first embodiment described above with reference to FIG. 5B, the conduction layer 38 is formed (see FIG. 17B).

Next, in the same way as in the method of manufacturing the semiconductor device according to the first embodiment described above with reference to FIG. 6A, the conduction layer 38 and the barrier metal film 36 are polished to bury the conduction layer 38 into the opening patterns 34a, 34b2, 34c2, 35 (see FIG. 18A).

Next, in the same way as in the method of manufacturing the semiconductor device according to the first embodiment descried above with reference to FIG. 6B, the upper portions of the conduction layer 38 buried in the opening patterns 34a, 34b2, 34c2, 35 is etched off (see FIG. 18B). In etching the conduction layer 38, preferably, the etching is made until the conduction layer 38 on the gate interconnection 18b does not exist in the opening pattern 34s. That is, preferably, the etching is made until the barrier meal film 36 directly on the gate interconnection 18b is exposed in the opening pattern 34s. The height of the upper surface of the conduction layer 38 in the opening patterns 34a, 34b2, 34c2, 35 becomes equal to the height of the upper surfaces of the gate electrodes 18a, 18b or smaller than the upper surfaces of the gate electrodes 18a, 18b. Thus, the conduction layer 38 is absent in the upper part of the opening patterns 34a, 34b2, 34c2, 35 and is buried in the lower part of the openings 34a, 34b2, 34c2, 35. In the opening pattern 34s, the conduction layer 38 is absent on the gate interconnection 18b.

Then, in the same way as in the method of manufacturing the semiconductor device according to the first embodiment described above with reference to FIG. 7A, the barrier metal film 40 is formed (see FIG. 19A).

Next, in the same way as in the method of manufacturing the semiconductor device according to the first embodiment described above with reference to FIG. 7B, the seed layer (not illustrated) is formed.

Next, in the same way as in the method of manufacturing the semiconductor device according to the first embodiment described above with reference to FIG. 7B, the conduction layer 42 is formed (see FIG. 19B).

Next, in the same way as in the method of manufacturing the semiconductor device according to the first embodiment described above with reference to FIG. 8A, the conduction layer 42 and the barrier metal film 40 are polished. Thus, the conduction layer 42 is buried in the opening patterns 34a, 34b2, 34c2, 35 (see FIG. 20).

Thus, the conduction layer 38 is buried in the lower part of the opening patterns 34a, 34b2, 34c2, 35, and the conduction layer 42 whose conductivity is higher than that of the conduction layer 38 is buried in the upper part of the opening patterns 34a, 34b2, 34c2, 35. The interconnection patterns 44a, 44b2, 44c2, 45 are formed of the layer body of the conduction layer 38 and the conduction layer 42. That is, in the openings patterns 34a, 34b2, 34c2, 35, the interconnection patterns 44a, 44b2, 44c2, 45 formed of the layer body of the conduction layer 38 and the conduction layer 42 are buried. The interconnection patterns 44a, 44b1, 44b2, 44c1, 44c2 are formed along the longitudinal direction of the gate interconnections 18a, 18b. The interconnection 44j is formed, crossing the longitudinal direction of the gate interconnection 18b. As described above, the opening pattern 34b1, the opening pattern 34c1 and the opening pattern 34s formed integral form the opening 35. In the opening 35, the interconnection patterns 44b1, 44c1, 44j formed integral are buried.

According to the present embodiment, the opening pattern 34s exposing a part of the gate interconnection 18b, and the trench-shaped opening patterns 34b1, 34c1 exposing a plurality of source/drain regions 26 are formed. In other words, the opening 35 exposing a part of the gate interconnection 18b and a plurality of source/drain regions 26 is formed. Thus, according to the present embodiment, the gate interconnection 18b and the source/drain regions 26 can be connected by the interconnection patterns 44b1, 44c1, 44j. In other words, the gate interconnection 18b and the source/drain regions 26 can be connected by the interconnection 45. Because the conduction layer 42 whose conductivity is higher than that of the conduction layer 38 is formed on the conduction layer 38, the electric resistance of the interconnection 45 can be lower in comparison with the case that the interconnection 45 is formed of the conduction layer 38 alone. Furthermore, in the present embodiment, the conduction layer 38 is buried in the lower part of the opening 35, and the conduction layer 42 is buried in the upper part of the opening 35. That is, the conduction layer 38 and the conduction layer 42 are buried in the same openings 34a-34c. Accordingly, no misregistration takes place between the conduction layer and the conduction layer 42. Thus, the electric resistance of the interconnection 45 can be low without lowering the reliability and the yield. Thus, according to the present embodiment, the semiconductor device can have good electric characteristics without lowering the reliability and the yield.

Next, by photolithography, the contact holes 48 are formed in the inter-layer insulation film 46 respectively down to the interconnections 44a, 44b1, 44b2, 44c2.

Next, by photolithography, the trenches 50 connected to the contact holes 48 is formed in the inter-layer insulation film 46 (see FIG. 20B).

Next, in the same way as in the method of manufacturing the semiconductor device according to the first embodiment described above with reference to FIG. 10A, the barrier metal film 52 is formed.

Next, in the same way as in the method of manufacturing the semiconductor device according to the first embodiment described above with reference to FIG. 10A, the seed layer (not illustrated) is formed.

Then, in the same way as in the method of manufacturing the semiconductor device according to the first embodiment described above with reference to FIG. 10A, the conduction layer 54 is formed.

Next, in the same way as in the method of manufacturing the semiconductor device according to the first embodiment described above with reference to FIG. 10B, the conduction layer 54 and the barrier metal film 52 are polished.

Figure 21:
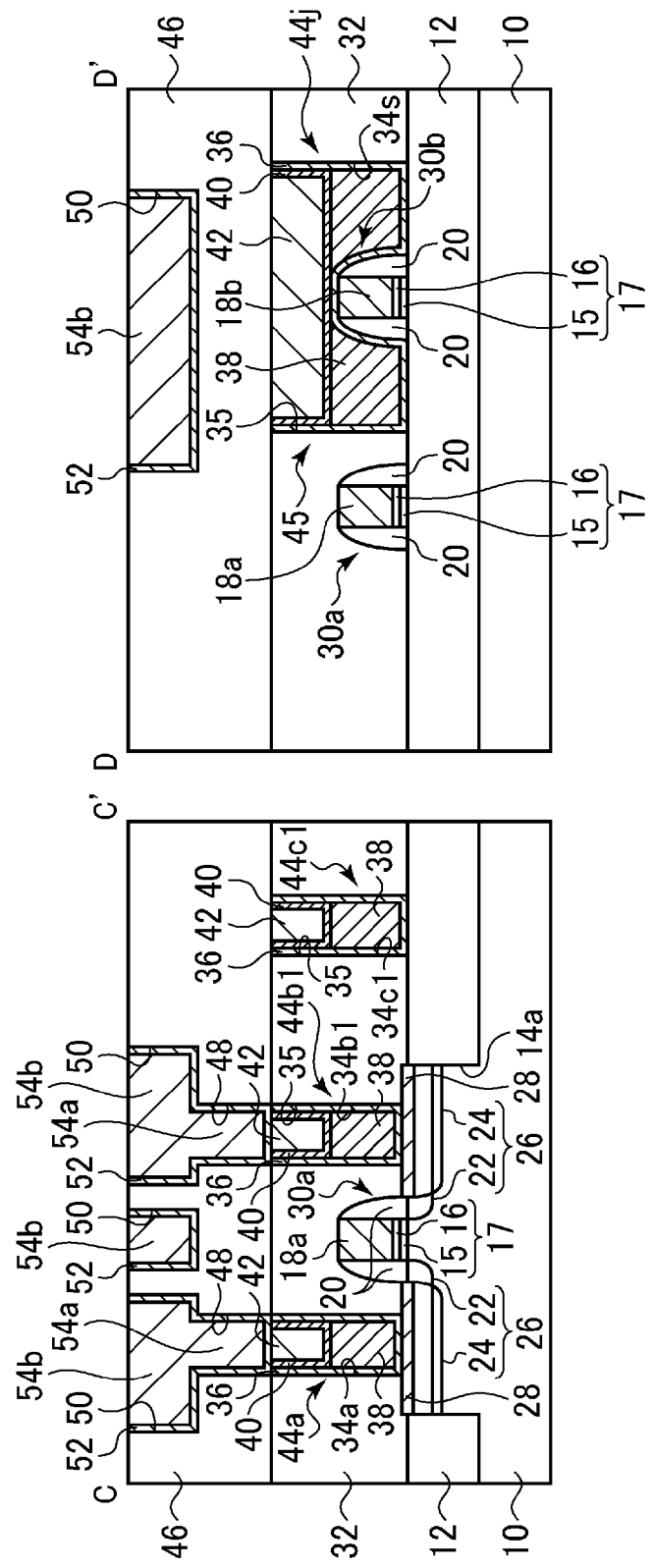

Thus, the semiconductor device according to the present embodiment is formed (see FIG. 21).

Modification

Figure 22:
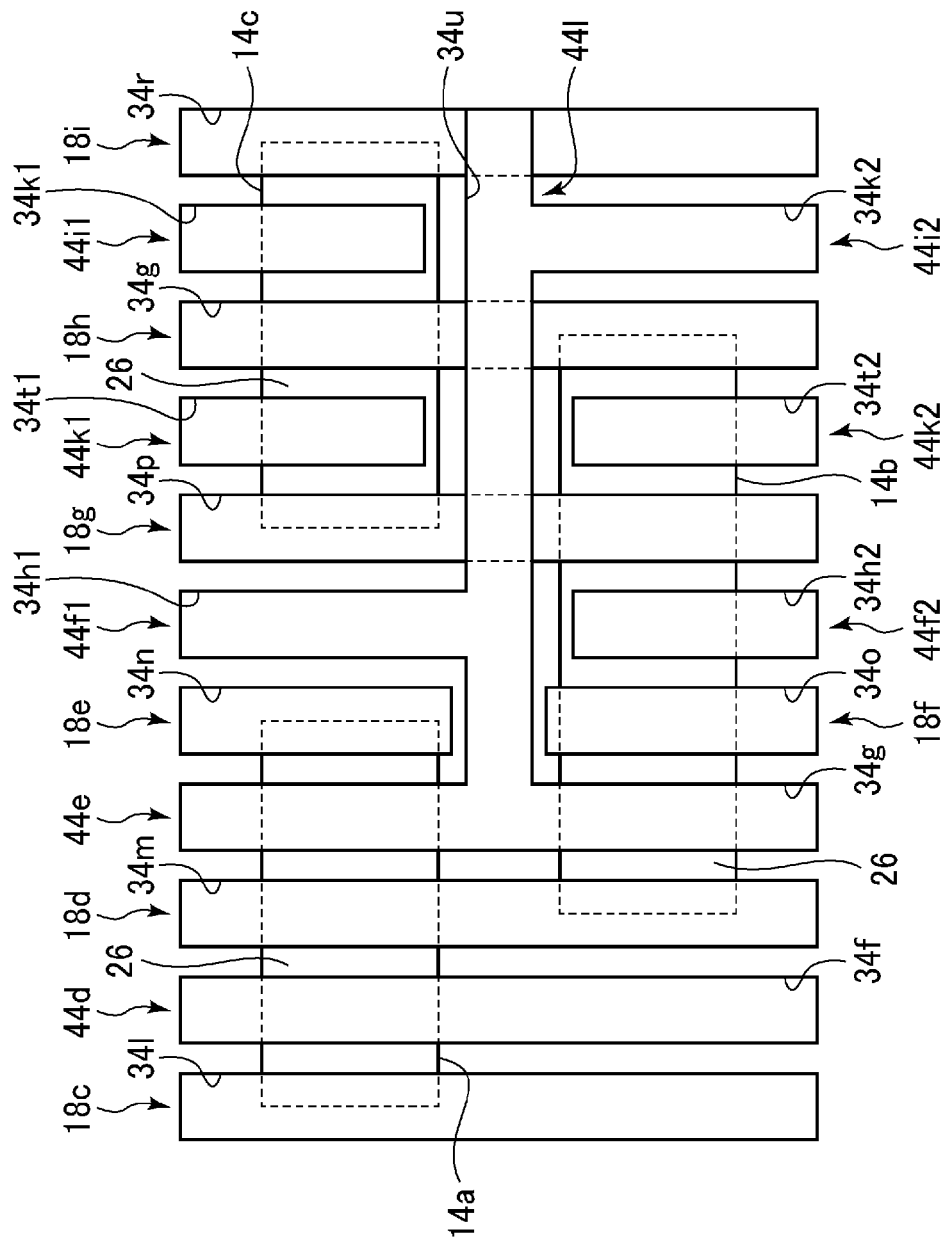
FIG. 22 is a plan view of an example of a layout of a semiconductor device according to a modification of the second embodiment.

Next, a modification of the semiconductor device according to the present embodiment will be described with reference to FIG. 22. FIG. 22 is a plan view of an example of the layout of the semiconductor device according to the present modification.

As illustrated in FIG. 22, in the semiconductor substrate 10, the device regions 14a-14c defined by the device isolation regions 12 are formed.

On the semiconductor substrate 10 with the device regions 14a-14c formed in, gate interconnections 18c-18i are formed.

In the inter-layer insulation film 32 (see FIG. 12), trench-shaped opening patterns (openings) 34f, 34g, 34h1, 34h2, 34k1, 34k2, 34t1, 34t2 exposing a plurality of source/drain regions 26 are formed. These opening patterns 34f, 34g, 34h1, 34h2, 34k1, 34k2, 34t1, 34t2 are extended along the longitudinal direction of the gate interconnections 18c-18i.

In the inter-layer insulation film 32 (see FIG. 12), an opening pattern (opening) 34u is formed. The opening pattern 34u is extended, crossing the longitudinal direction of the gate interconnections 18c-18i. The opening pattern 34u exposes parts of the upper surfaces of the gate interconnections 18g-18i. The opening pattern 34u is formed integral with the opening patterns 34g, 34h1, 34k2.

The conduction layer 38 is buried in the lower part of the opening patterns 34f, 34g, 34h1, 34h2, 34k1, 34k2, 34t1, 34t2, 34u. In the upper part of the opening patterns 34f, 34g, 34h1, 34h2, 34k1, 34k2, 34t1, 34t2, 34u, the conduction layer 42 is buried. In the opening patterns 34f, 34g, 34h1, 34h2, the interconnection patterns (or dummy patterns) 44d, 44e, 44f1, 44f2 including the conduction layer 38, and the conduction layer 42 whose conductivity is higher than that of the conduction layer 38 are respectively buried. In the opening patterns 34k1, 34k2, 34t1, 34t2, 34u, interconnection patterns (or dummy patterns) 44i1, 44i2, 44k1, 44k2, 44l including the conduction layer 38, and the conduction layer 42 whose conductivity is higher than that of the conduction layer 38 are respectively buried.

The semiconductor device may have such layout.

[c] Third Embodiment

The semiconductor device according to a third embodiment and its manufacturing method will be described with reference to FIGS. 23 to 31. The same members as those of the semiconductor device according to the first or the second embodiment and its manufacturing method illustrated in FIGS. 1 to 22 are represented by the same reference numbers not to repeat or to simplify the description.

(Semiconductor Device)

Figure 23:
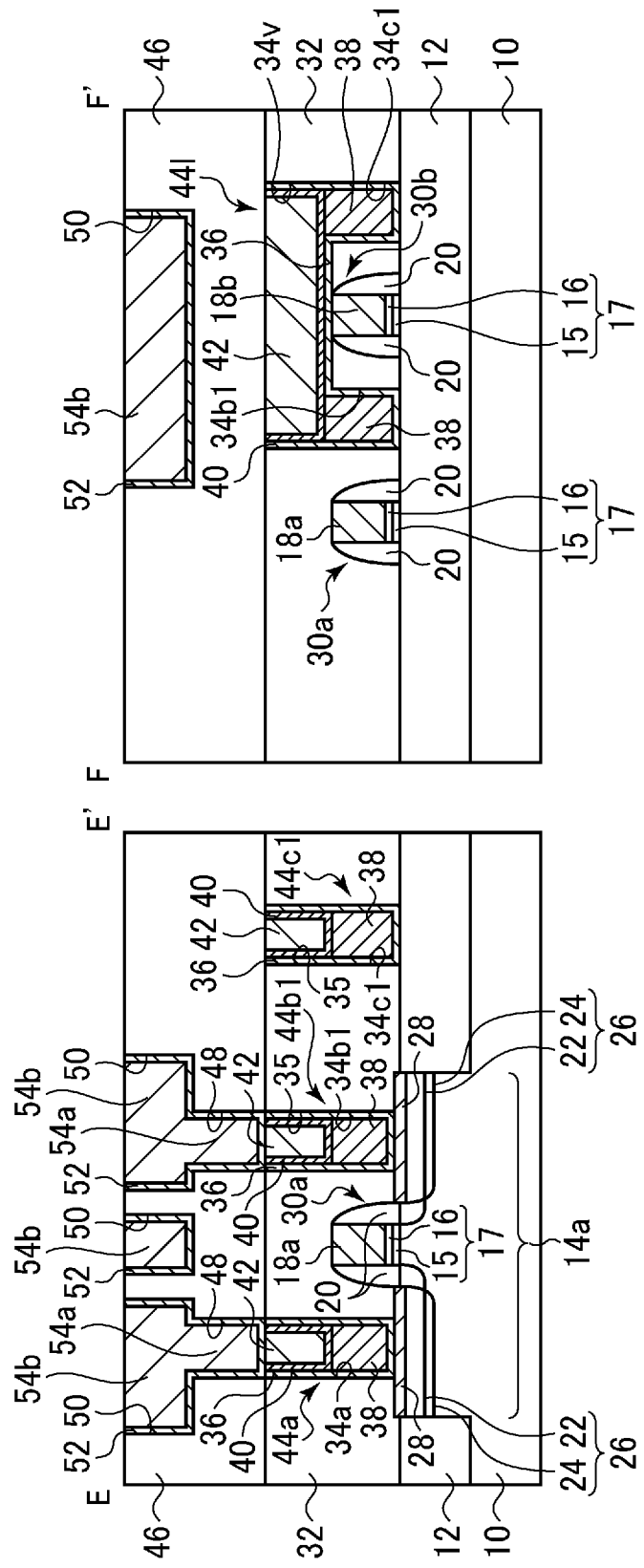
FIG. 23 is sectional views of a semiconductor device according to a third embodiment.
Figure 24:
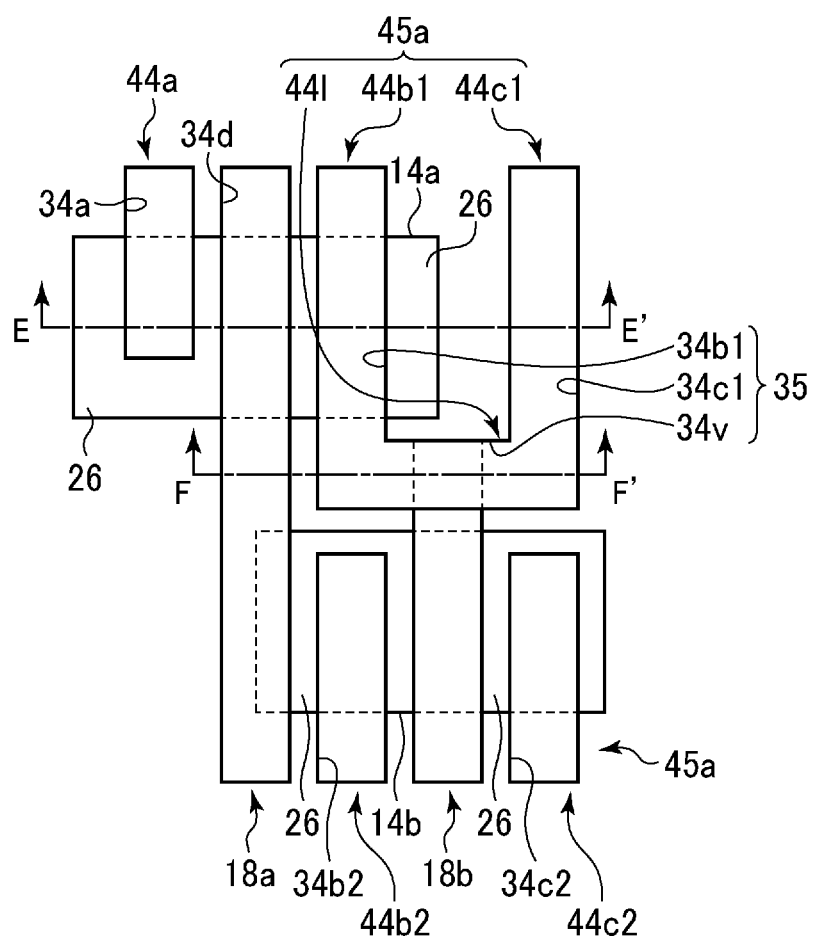
FIG. 24 is a plan view of the semiconductor device according to the third embodiment.

The semiconductor device according to the present embodiment will be described with reference to FIGS. 23 and 24. FIG. 23 is sectional views of the semiconductor device according to the present embodiment. FIG. 24 is a plan view of the semiconductor device according to the present embodiment. The drawing on the left side in FIG. 23 is the E-E' line sectional view of FIG. 24. The drawing on the right side in FIG. 23 is the F-F' line sectional view of FIG. 24.

In the semiconductor device according to the present embodiment, a part of the surface of the gate interconnection 18b is exposed by an opening pattern 34v formed different from the trench-shaped opening patterns 34b, 34c exposing a plurality of source/drain regions 26. An interconnection pattern 44l formed of the conduction layer 42 buried in the opening pattern 34v connects the interconnection pattern 44b, the interconnection pattern 44c and the gate electrode 18b.

As illustrated in FIGS. 23 and 24, the trench-shaped opening patterns (openings) 34a, 34b1, 34b2, 34c1, 34c2 exposing a plurality of source/drain regions 26 are formed in the inter-layer insulation film 32. The opening patterns 34a, 34b1, 34b2, 34c1, 34c2 are formed along the longitudinal direction of the gate interconnections 18a, 18b.

In the inter-layer insulation film 32, the opening pattern (opening) 34v exposing at least a part of the gate interconnection 18b and connected to the opening patterns 34b1, 34c2 is formed. The longitudinal direction of the opening pattern 34v crosses the longitudinal direction of the gate interconnection 18b. More specifically, the longitudinal direction of the opening pattern 34v is perpendicular to the longitudinal direction of the gate interconnection 18b. The opening pattern 34v exposes the upper surface of the gate interconnection 18b on the device isolation region 12. The opening pattern 34b1, the opening pattern 34c1 and the opening pattern 34v are formed integral. In other words, the opening (opening pattern) 35 including the partial opening (opening pattern) 34b, the partial opening (opening pattern) 34c1 and the partial opening (opening pattern) 34v is formed in the inter-layer insulation film 32.

In the opening patterns 34a, 34b2, 34c2, 35, the barrier metal film 36 is formed. The barrier metal film 36 in the opening patterns 34a, 34b2, 34c2, 35 covers the bottom surfaces and the side walls of the opening patterns 34a, 34b2, 34c2, 35.

In the openings 34a, 34b2, 34c2, 35 with the barrier metal film 36 formed in, the conduction layer 38 is buried. The conduction layer 38 is buried in the lower part of the openings 34a, 34b2, 34c2, 35.

In the upper part of the opening patterns (openings) 34a, 34b2, 34c2, 35, the barrier metal film 40 is formed.

In the opening patterns 34a, 34b2, 34c2, 35 with the barrier metal film 40 formed in, the conduction layer 42 is formed.

Thus, in the opening patterns 34a, 34b2, 34c2, the interconnection patterns (interconnections) 44a, 44b2, 44c2 including the conduction layer 38 and the conduction layer 42 whose conductivity is higher than that of the conduction layer 38 are buried.

In the opening patterns 34b1, 34c1, the interconnection patterns (interconnections) 44b1, 44c1 including the conduction layer 38 and the conduction layer 42 whose conductivity is higher than that of the conduction layer 38 are respectively buried. In the opening pattern 34l, the interconnection pattern (interconnection) 44l formed of the conduction layer 42 is buried. Thus, the interconnection pattern 44b1, the interconnection pattern 44c1 and the interconnection pattern 44l form the interconnection (interconnection pattern) 45a.

As described above, a part of the surface of the gate interconnection 18b may be exposed by the opening pattern 34v formed different from the trench-shaped opening patterns 34b1, 34c1 exposing a plurality of source/drain regions 26. The interconnection pattern 44b, the interconnection pattern 44c and the gate electrode 18b may be connected by the interconnection pattern 44*l* formed of the conduction layer 42 buried in the opening pattern 34*v*.

(Method of Manufacturing the Semiconductor Device)

Next, the method of manufacturing the semiconductor device according to the present embodiment will be described with reference to FIGS. 25A to 31. FIGS. 25A to 31 are sectional views of the semiconductor device according to the present embodiment in the steps of the method of manufacturing the semiconductor device, which illustrate the method.

The step of forming the device isolation regions 12 to the step of planarizing the surface of the inter-layer insulation film 32 are the same as those of the method of manufacturing the semiconductor device according to the first embodiment described above with reference to FIGS. 3A to 4B, and their description will not be repeated (see FIG. 16A).

Then, on the entire surface, a photoresist film (not illustrated) is formed by, e.g., spin coating.

Next, by photolithography, the opening patterns (openings) (not illustrated) are formed in the photoresist film. The opening patterns are for forming the trench-shaped opening patterns (openings) 34*a*, 34*b*1, 34*b*2, 34*c*1, 34*c*2 in the inter-layer insulation film 32.

Next, by, e.g., RIE with the photoresist film as the mask, the inter-layer insulation film 32 is etched to form the trench-shaped opening patterns 34*a*, 34*b*1, 34*b*2, 34*c*1, 34*c*2 in the inter-layer insulation film 32 (see FIGS. 24 and 25A). The opening patterns 34*a*, 34*b*1, 34*b*2, 34*c*1, 34*c*2 are formed, extended perpendicular as viewed in FIG. 25. That is, the opening patterns 34*a*, 34*b*1, 34*b*2, 34*c*1, 34*c*2 are formed along the longitudinal direction of the gate interconnections 18*a*, 18*b*. The opening pattern 34*a* is formed, exposing the source/drain region 26 of a transistor in a device region not illustrated and the source/drain region 26 of the transistor 30*a* formed in the device region 14*a*. The opening pattern 34*b*1 is formed, exposing the source/drain region 26 of the transistor 30*a* formed in the device region 14*a*. The opening pattern 34*b*2 is formed, exposing the source/drain region 26 of the transistor 30*b* formed in the device region 14*b*. The opening pattern 34*c*1 is formed, exposing the source/drain region 26 of a transistor formed in a device region not illustrated. The opening pattern 34*c*2 is formed, exposing the source/drain region 26 of the transistor 30*b* formed in the device region 14*b*. Thus, the opening patterns 34*a*, 34*b*1, 34*b*2, 34*c*1, 34*c*2 are formed, exposing the source/drain regions 26 of a plurality of transistors 30*a*, 30*b* formed in the device regions 14*a*, 14*b* different from each other. The width of the opening patterns 34*a*, 34*b*1, 34*b*2, 34*c*1, 34*c*2 is, e.g., about 25-35 nm.

Then, the photoresist film is released by, e.g., asking.

Next, on the entire surface, a photoresist film 56 is formed by, e.g., spin coating.

Then, by photolithography, an opening (opening) is formed in the photoresist film 56. This opening pattern is for forming the trench-shaped opening pattern (opening) 34*v* (see FIGS. 24 and 26A) in the inter-layer insulation film 32 (see FIG. 25B).

Next, with the photoresist film 56 as the mask, the inter-layer insulation film 32 is etched to form the opening pattern (opening) 34*v*. The opening pattern (opening) 34*v* is formed, connected to the opening patterns 34*b*1, 34*c*1. The longitudinal direction of the opening pattern 34*v* crosses the longitudinal direction of the gate interconnection 18*b*. More specifically, the longitudinal direction of the opening pattern 34*v* is perpendicular to the longitudinal direction of the gate interconnection 18*b*. The opening pattern 34*v* is formed, exposing the upper surface of the gate electrode 18*b*. The opening pattern (opening) 34*b*1, the opening pattern (opening) 34*c*1 and the opening pattern (opening) 34*v* form the opening pattern (opening) 35 (see FIGS. 24 and 26A).

Then, the photoresist film 56 is removed by, e.g., asking (see FIG. 26B).

Next, in the same ways as in the method of manufacturing the semiconductor device according to the first embodiment described above with reference to FIG. 5A, the barrier metal film 36 is formed (see FIG. 26B).

Then, in the same way as in the method of manufacturing the semiconductor device according to the first embodiment described above with reference to FIG. 5B, the conduction layer 38 is formed (see FIG. 27A).

Next, in the same way as in the method of manufacturing the semiconductor device according to the first embodiment described above with reference to FIG. 6A, the conduction layer 38 and the barrier metal film 36 are polished to bury the conduction layer 38 in the opening patterns 34*a*, 34*b*1, 34*b*2, 35 (see FIG. 27B).

In the same way as in the method of manufacturing the semiconductor device according to the first embodiment described above with reference to FIG. 6B, the upper portions of the conduction layer 38 buried in the openings patterns 34*a*, 34*b*2, 34*c*2, 35 is etched off. Thus, the conduction layer 38 is absent in the upper part of the opening patterns 34*a*, 35*b*2, 35*c*2, 35, and in the lower part of the opening 34*a*, 34*b*2, 35*c*2, 35, the conduction layer 38 is present. The etching of the conduction layer 38 is made until the barrier metal film 36 on the gate electrode 18*b* is exposed (see FIG. 28A).

Figure 28A:
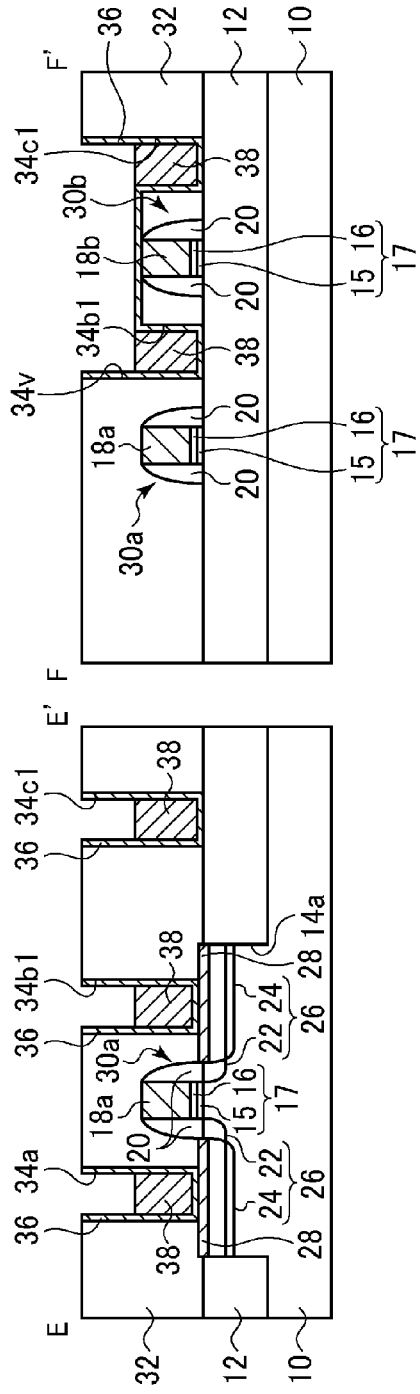
Figure 28B:
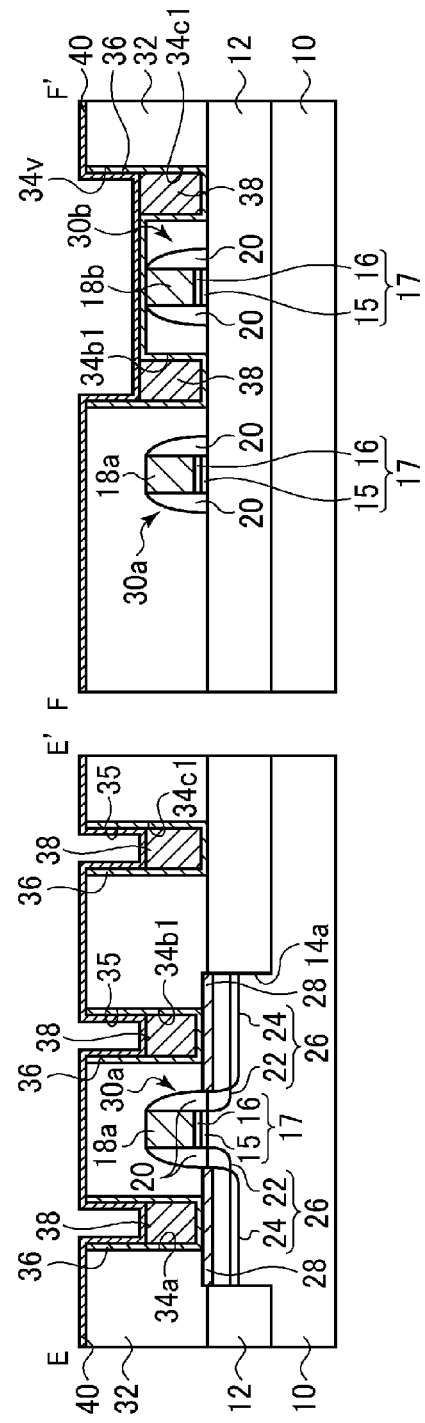

Next, in the same way as in the method of manufacturing the semiconductor device according to the first embodiment described above with reference to FIG. 7B, the barrier metal film 40 is formed (see FIG. 28B).

Then, in the same way as in the method of manufacturing the semiconductor device according to the first embodiment described above with reference to FIG. 7B, the seed layer (not illustrated) is formed.

Next, in the same way as in the method of manufacturing the semiconductor device according to the first embodiment described above with reference to FIG. 7B, the conduction layer 42 is formed (see FIG. 29A).

Next, in the same way as in the method of manufacturing the semiconductor device according to the first embodiment described above with reference to FIG. 8A, the conduction layer 42 and the barrier metal film 40 are polished. Thus, the conduction layer 42 is buried in the opening patterns 34*a*, 34*b*2, 34*c*2, 35 (see FIG. 29B).

Thus, the conduction layer 38 is buried in the lower part of the opening patterns 34*a*, 34*b*1, 34*b*2, 34*c*1, 34*c*2, and in the upper part of the opening patterns 34*a*, 34*b*1, 34*b*2, 34*c*1, 34*c*2, the conduction layer 42 whose conductivity is higher than that of the conduction layer 38 is buried. The layer body of the conduction layer 38 and the conduction layer 42 form the interconnection pattern 44*a*, 44*b*1, 44*b*2, 44*c*1, 44*c*2. In the opening pattern 34*v*, the conduction layer 42 is buried. The conduction layer 42 buried in the opening pattern 34*v* forms the interconnection pattern 44*l*. A part of the interconnection pattern 34*b*1, a part of the interconnection pattern 34*c*1 and a part of the gate interconnection 18*b* are electrically connected by the interconnection pattern 44*l* formed of the conduction layer 42.

Next, by photolithography, the contact holes 48 are formed in the inter-layer insulation film 46 down to the interconnections 44*a*, 44*b*.

Figure 30:
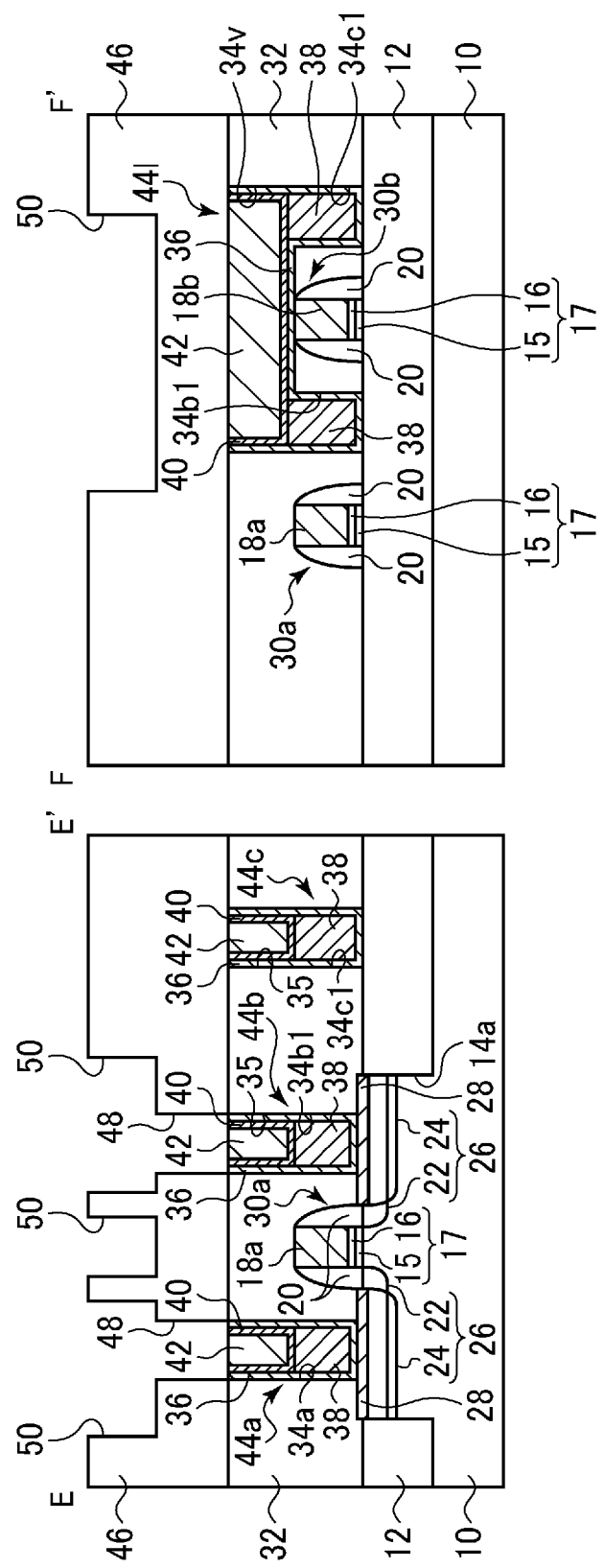

Next, by photolithography, the trenches 50 connected to the contact holes 48 are formed in the inter-layer insulation film 46 (see FIG. 30).

Then, in the same way as in the method of manufacturing the semiconductor device according to the first embodiment described above with reference to FIG. 10A, the barrier metal film 52 is formed.

Next, in the same way as in the method of manufacturing the semiconductor device according to the first embodiment described above with reference to FIG. 10A, the seed layer (not illustrated) is formed.

In the same way as in the method of manufacturing the semiconductor device according to the first embodiment described above with reference to FIG. 10A, the conduction layer 54 is formed.

Next, in the same way as in the method of manufacturing the semiconductor device according to the first embodiment described above with reference to FIG. 10B, the conduction layer 54 and the barrier metal film 52 are polished.

Figure 31:
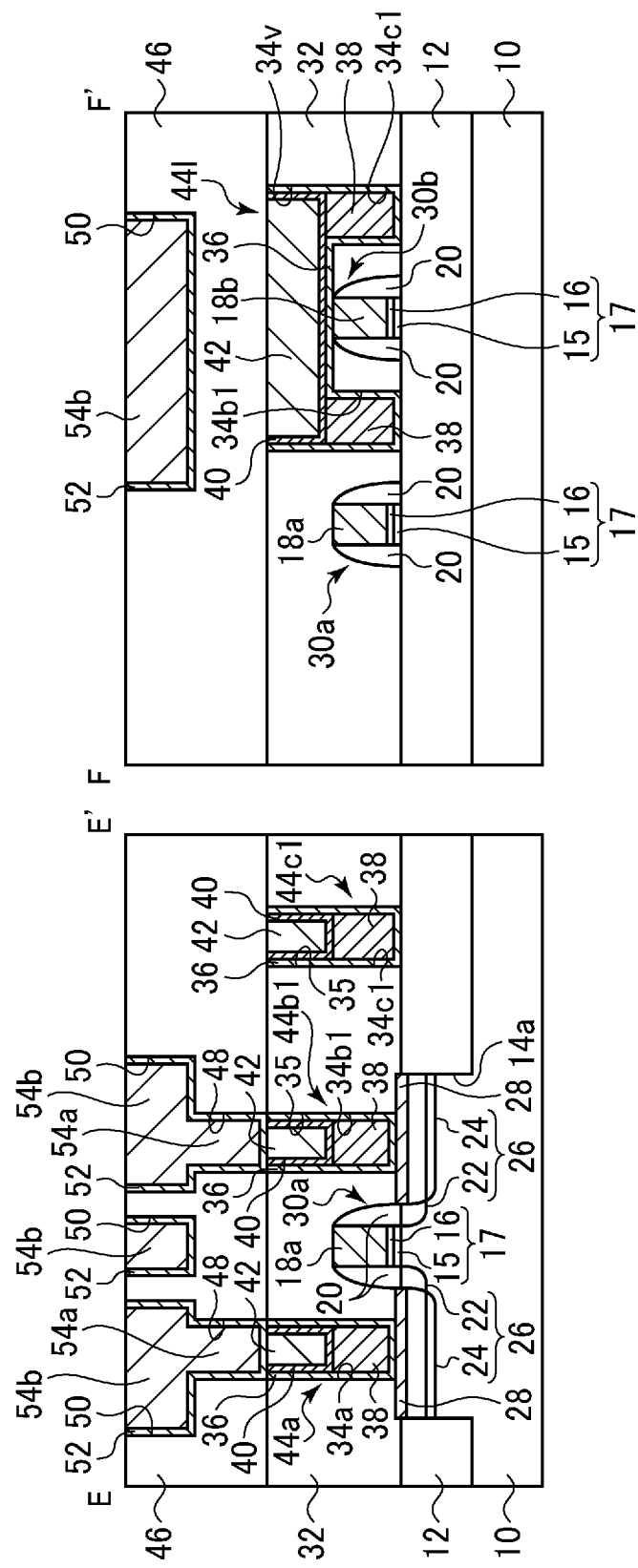

Thus, the semiconductor device according to the present embodiment is formed (see FIG. 31).

Modification

Figure 32:
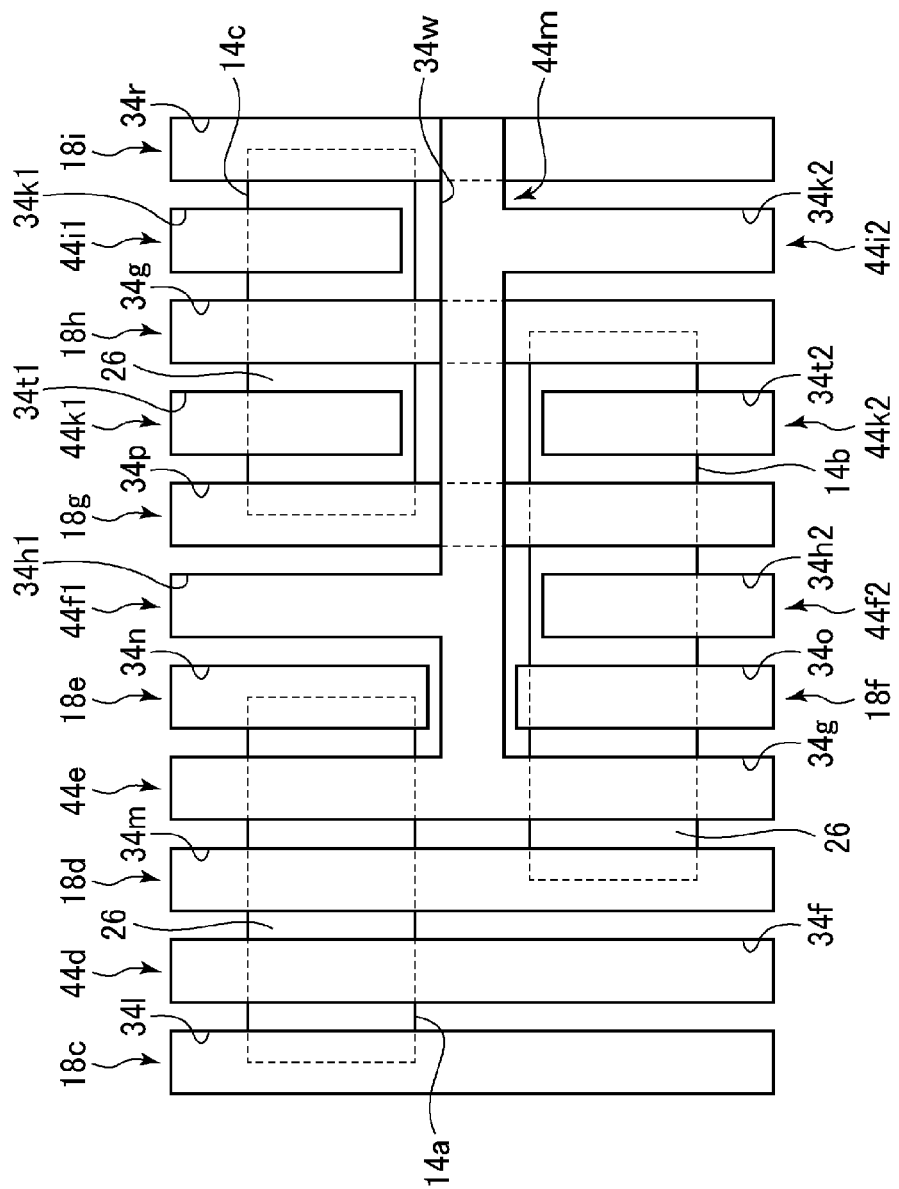
FIG. 32 is a plan view of an example of a layout of a semiconductor device according to a modification of the third embodiment.

The semiconductor device according to a modification of the present embodiment will be described with reference to FIG. 32. FIG. 32 is a plan view of an example of the layout of the semiconductor device according to the present modification.

As illustrated in FIG. 32, in the semiconductor substrate 10, the device regions 14*a*-14*c* are formed, defined by the device isolation regions 12.

On the semiconductor substrate 10 with the device regions 14*a*-14*c* formed in, gate interconnections 18*c*-18*i* are formed.

In the inter-layer insulation film 32 (see FIG. 23), the trench-shaped opening patterns (openings) 34*f*, 34*g*, 34*h*1, 34*h*2, 34*k*1, 34*k*2, 34*t*1, 34*t*2 exposing a plurality of source/drain regions 14*a*-14*c* are formed. The opening patterns 34*f*, 34*g*, 34*h*1, 34*h*2, 34*k*1, 34*k*2, 34*t*1, 34*t*2 are formed along the longitudinal direction of the gate interconnections 18*c*-18*i*.

In the inter-layer insulation film 32 (see FIG. 23), an opening pattern (opening) 34*w* is formed. The opening 34*w* is extended, crossing the longitudinal direction of the gate interconnections 18*c*-18*i*. The opening pattern 34*w* exposes parts of the upper surfaces of the gate interconnections 18*g*-18*i*. The opening pattern 34*w* is formed integral with the opening patterns 34*g*, 34*h*1, 34*k*2.

The conduction layer 38 is buried in the lower part of the opening patterns 34*f*, 34*g*, 34*h*1, 34*h*2, 34*k*1, 34*k*2, 34*t*1, 34*t*2, and in the upper part of the opening patterns 34*f*, 34*g*, 34*h*1, 34*h*2, 34*k*1, 34*k*2, 34*t*1, 34*t*2, the conduction layer 42 is buried. In the opening patterns 34*f*, 34*g*, 34*h*1, 34*h*2, 34*k*1, 34*k*2, 34*t*1, 34*t*2, the interconnection patterns (or dummy patterns) 44*d*, 44*e*, 44*f*1, 44*f*2, 44*i*1, 44*i*2, 44*k*1, 44*k*2 including the conduction layer 38 and the conduction layer 42 whose conductivity is higher than that of the conduction layer 38 are buried.

In the opening 34*w*, the conduction layer 42 is buried. The conduction layer 42 buried in the opening pattern 34*w* forms an interconnection pattern 44*m*. The interconnection pattern 44*m* electrically connects parts of the interconnection patterns 44*e*, 44*f*1, 44*f*2 and part of the gate interconnections 18*g*-18*i*.

The semiconductor device may have such layout.

[d] Fourth Embodiment

The semiconductor device according to a fourth embodiment and its manufacturing method will be described with reference to FIGS. 33 to 38B. The same members of the present embodiment as those of the semiconductor device according to the first to the third embodiments and its manufacturing method illustrated in FIGS. 1 to 32 are represented by the same reference numbers not to repeat or to simplify the description.

(Semiconductor Device)

Figure 33:
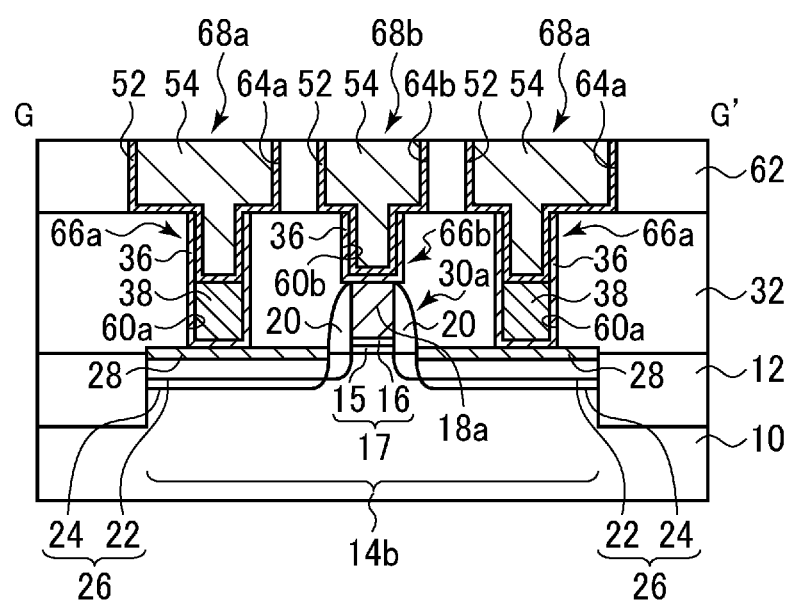
FIG. 33 is a sectional view of a semiconductor device according to a fourth embodiment.
Figure 34:
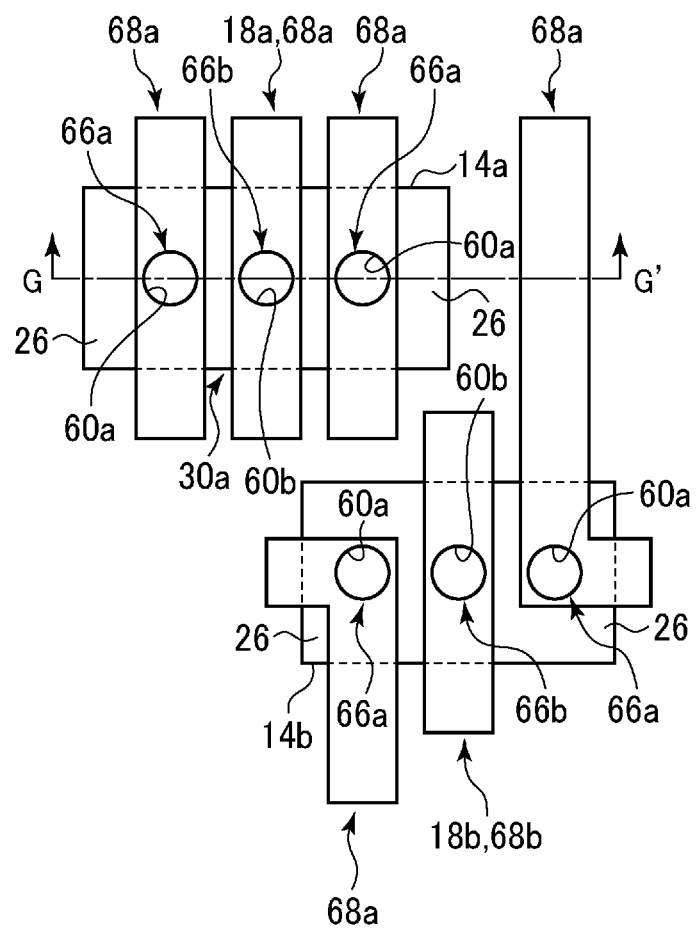
FIG. 34 is a plan view of the semiconductor device according to the fourth embodiment.

First, the semiconductor device according to the present embodiment will be described with reference to FIGS. 33 and 34. FIG. 33 is a sectional view of the semiconductor device according to the present embodiment. FIG. 34 is a plan view of the semiconductor device according to the present embodiment. FIG. 33 is the G-G' line sectional view of FIG. 34.

As illustrated in FIGS. 33 and 34, in the inter-layer insulation film 32, contact holes (openings) 60*a* reaching the source/drain regions 26, and a contact hole (opening) 60*b* reaching the gate interconnection (gate electrode) 18*a* are formed. The diameter of the contact holes 60*a*, 60*b* is, e.g., about 45-55 nm.

In the contact holes 60*a*, 60*b*, the barrier metal film 36 is formed. The barrier metal film 36 is formed of, e.g., the layer film of a Ti film and a TiN film.

In the openings 60*a* with the barrier metal film 36 formed in, the conduction layer 38 is formed. As the material of the conduction layer 38, for example, tungsten (W) is used. The thickness of the conduction layer 38 is, e.g., about 70-80 nm. The conduction layer 38 is buried in the lower part of the contact holes 60*a*. In the upper part of the contact holes 60*a*, the conduction layer 38 is absent. The height of the upper surface of the conduction layer 38 is the same as the height of the upper surfaces of the gate electrodes 18*a* or smaller than the height of the upper surface of the gate electrode 18*a*.

The barrier metal film 36 covers the bottom surface and all the side wall of the contact hole 60*a*. That is, the barrier metal film 36 in the opening 60*a* covers not only the bottom surface and side wall of the lower part of the contact hole 60*a* but also the side walls of the upper part of the contact hole 60*a*.

In the contact hole 60*b* exposing the gate interconnection 18*a*, the conduction layer 38 is absent.

On the inter-layer insulation film 32 with the contact holes 60*a*, 60*b*, etc. formed in, an inter-layer insulation film 62 of, e.g., an about 90-110 nm-film thickness is formed. As the material of the inter-layer insulation film 62, a low-k material, e.g., SiOC or others, $SiO_2$ or others is used.

In the inter-layer insulation film 62, trenches (openings) 64*a*, 64*b* connected to the contact holes 60*a*, 60*b* are formed.

In the trenches 64*a*, 64*b* and the contact holes 60*a*, 60*b*, the barrier metal film 40 of, e.g., a 4-6 nm-film thickness is formed. As the barrier metal film 40, for example a Ti film, Ta (tantalum) film or their layer film is used.

The barrier metal film 40 may contain nitrogen.

In the openings 64*a*, 64*b* and the contact holes 60*a*, 60*b* with the barrier metal film 40 formed in, a conduction layer 54 is buried in. As the material of the conduction layer 54, a material whose conductivity is higher than that of the conduction layer 38 is used. Specifically, as the material of the conduction layer 54, for example, a material containing Cu is used. More specifically, as the material of the conduction layer 54, a copper alloy is used. The conduction layer 54 buried in the contact holes 60*a* forms conductor plugs 66*a* together with the conduction layer 38 buried in the contact holes 60*a*. The conduction layer 54 buried in the contact hole 60*b* forms a conductor plug 66*b*. The conduction layer 54 buried in the trenches 64*a*, 64*b* form interconnections 68*a*, 68*b*.

As described above, the conduction layer 38 is buried in the lower part of the contact holes 60*a*, and the conduction layer 54 whose conductivity is higher than that of the conduction layer 38 is buried in the upper part of the contact holes 60a. The layer body of the conduction layer 38 and the conduction layer 54 form the conductor plugs 66a. That is, in the contact holes 60a, the conductor plugs 66a formed of the layer body of the conduction layer 38 and the conduction layer 54 are buried.

In the present embodiment, the conduction layer 38 is buried in the lower part of the contact holes 60a, and in the upper part of the contact holes 60a, the conduction layer 54 whose conductivity is higher than that of the conduction layer 38 is buried. Accordingly, in comparison with the case that the conductor plugs 66a are formed of the conduction layer 38 alone, the electric resistance of the conductor plugs 66a can be decreased. Furthermore, the conduction layer 38 and the conduction layer 54 are formed in the same contact holes 60a, whereby no misregistration between the conduction layer 38 and the conduction layer 54 takes place. Accordingly, the conductor plugs 66a can have a low electric resistance without decreasing the reliability and the yield. Thus, according to the present embodiment, the semiconductor device can have good electric characteristics without lowering the reliability and the yield.

In the present embodiment, the conductor plugs 66a are not formed of the conduction layer 54 alone, and the conduction layer 38 is present below the conduction layer 54 so as to surely prevent the diffusion of the constituent atoms (e.g., Cu atoms) of the conduction layer 54 into the source/drain regions 26 by the conduction layer 38. The conduction layer 38 of tungsten prevent the diffusion of the Cu atoms of the conduction layer 54 into the source/drain regions 26.

In the contact hole 60b exposing the gate interconnection 18a, the conduction layer 38 is absent, and the conduction layer 54 whose conductivity is higher than that of the conduction layer 38 is buried. In the contact hole 60b exposing the gate interconnection 18a, the conduction layer 54 is connected to the gate interconnection 18a via the barrier metal films 36, 52. The conduction layer 54 buried in the contact hole 60b forms the conductor plug 66b. On the gate interconnections 18a, the conductor plug 66b is formed of the conduction layer 54 alone, whereby the conductor plug 66b can have a low electric resistance.

The diffusion of the constituent atoms (e.g., Cu atoms) of the conduction layer 54 into the gate interconnections 18a causes no special problem. The absence of the conduction layer 38 between the conduction layer 54 and the gate interconnection 18a causes no special problem.

Thus, the semiconductor device according to the present embodiment is constituted.

As described above, according to the present embodiment, the conduction layer 38 is buried in the lower part of the contact holes 60a, and in the upper part of the contact holes 60a, the conduction layer 54 whose conductivity is higher than that of the conduction layer 38 is buried. Consequently, in comparison with the case that the conductor plugs 66a are formed of the conduction layer 38 alone, the electric resistance of the conductor plugs 66a can be decreased. Furthermore, the conduction layer 38 and the conduction layer 54 are buried in the same contact holes 60a, which causes no misregistration between the conduction layer 38 and the conduction layer 54. Accordingly, the conductor plugs 66a can have a low electric resistance without lowering the reliability and the yield. Thus, according to the present embodiment, the semiconductor device can have good electric characteristics without lowering the reliability and the yield.

According to the present embodiment, the conduction layer 38 is absent in the contact hole 60b exposing the gate interconnection 18a, and the conduction layer 54 whose conductivity is higher than that of the conduction layer 38 is buried. On the gate interconnection 18a, the conductor plug 66b is formed of the conduction layer 54 alone, whereby the conductor plug 66b can have a low electric resistance.

(Method of Manufacturing the Semiconductor Device)

Next, the method of manufacturing the semiconductor device according to the present embodiment will be described with reference to FIGS. 35A to 38B. FIGS. 35A to 38B are sectional views of the semiconductor device according to the present embodiment in the steps of the method of manufacturing the semiconductor device, which illustrate the method.

Figure 35A:
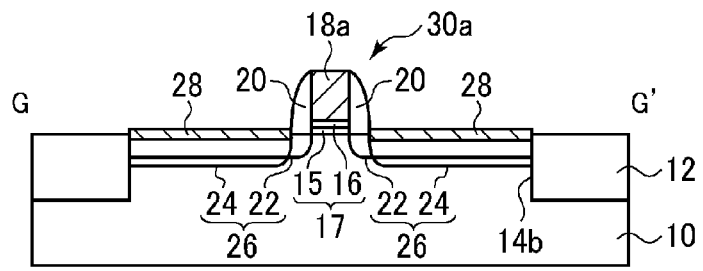
FIGS. 35A to 38B are sectional views of the semiconductor device according to the fourth embodiment in the steps of the method of manufacturing the semiconductor device, which illustrate the method.
Figure 35B:
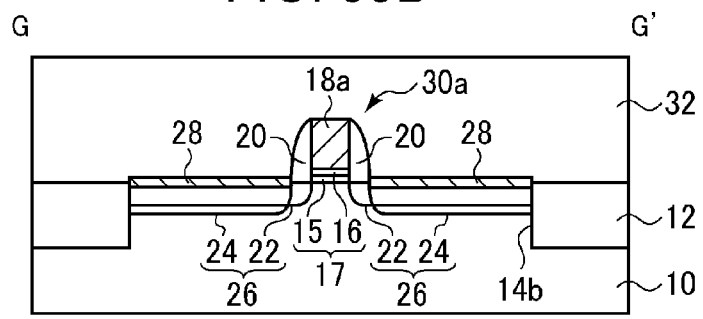

First, the step of forming the device isolation regions 12 to the step of planarizing the surface of the inter-layer insulation film 32 are the same as those of the method of manufacturing the semiconductor device according to the first embodiment described above with reference to FIGS. 3A to 4B, and their description will not be repeated (see FIGS. 35A and 35B).

Then, a photoresist film (not illustrated) is formed on the entire surface by, e.g., spin coating.

Next, by photolithography, openings (not illustrated) are formed in the photoresist film. The openings are for forming the contact holes (openings) 60a, 60b in the inter-layer insulation film 32.

Figure 35C:
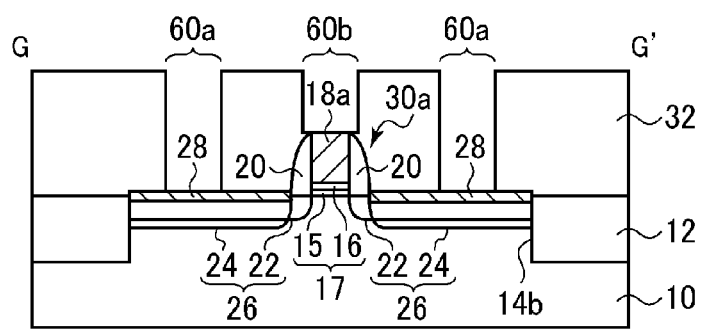

Then, by, e.g., RIE with the photoresist film as the mask, the inter-layer insulation film 32 is etched to form the contact holes 60a, 60b in the inter-layer insulation film 32 (see FIG. 35C). The contact holes 60a are formed, reaching the source/drain regions 26. The contact hole 60b is formed down to the gate interconnection 18a. The diameter of the contact holes 60a, 60b is, e.g., about 45-55 nm.

Then, the photoresist film is removed by, e.g., asking.

Figure 35D:
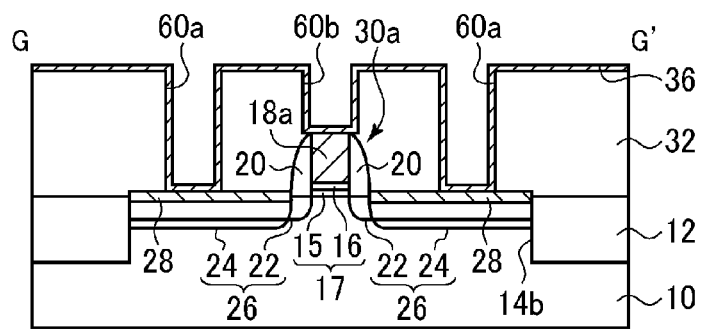

Next, in the same way as in the method of manufacturing the semiconductor device according to the first embodiment described above with reference to FIG. 5A, the barrier metal film 36 is formed (see FIG. 35D).

Figure 36A:
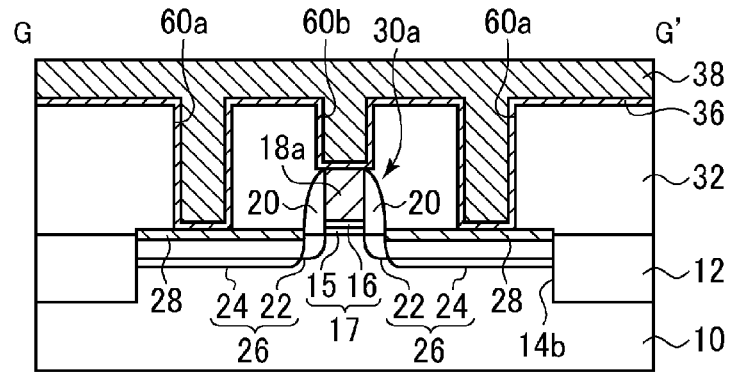

Next, in the same way as in the method of manufacturing the semiconductor device according to the first embodiment described above with reference to FIG. 5B, the conduction layer 38 is formed (see FIG. 36A).

Figure 36B:
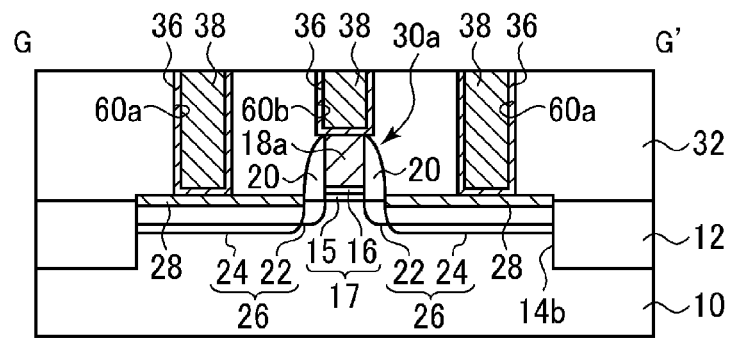
Figure 36C:
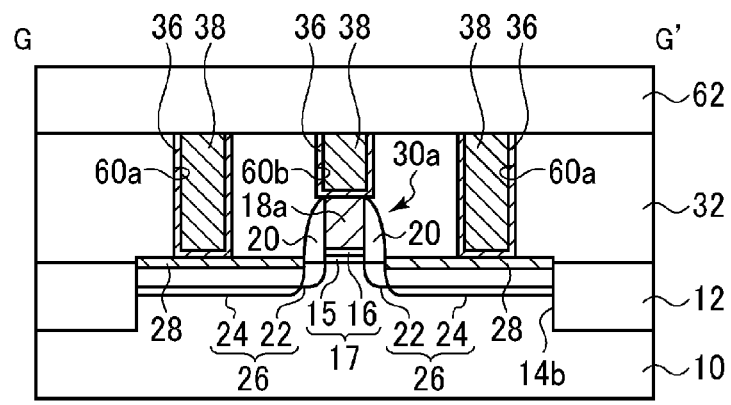

Next, in the same way as in the method of manufacturing the semiconductor device according to the first embodiment described above with reference to FIG. 6A, the conduction layer 38 and the barrier metal film 36 are polished to bury the conduction layer 38 in the contact holes 60a, 60b (see FIG. 36B).

Then, on the entire surface, the inter-layer insulation film 62 of an about 90-110 nm-film thickness is formed by, e.g., CVD. As the inter-layer insulation film 62, a low-k material film, e.g., SiOC film or others, $SiO_2$ film or others is formed (see FIG. 36C).

Figure 37A:
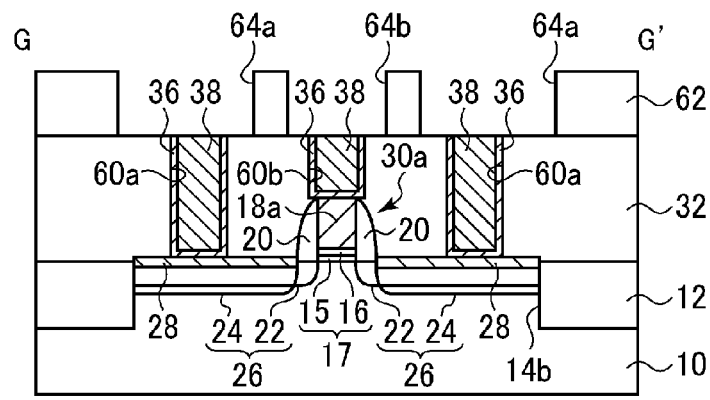

Next, by photolithography, the trenches (openings, trench-shaped openings) 64a, 64b connected to the contact holes 60a, 60b are formed in the inter-layer insulation film 62 (see FIG. 37A). The trenches 64a, 64b are for the interconnections 68a, 68b to be buried in. The width of the trenches 64a, 64b is, e.g., about 45-55 nm.

Figure 37B:
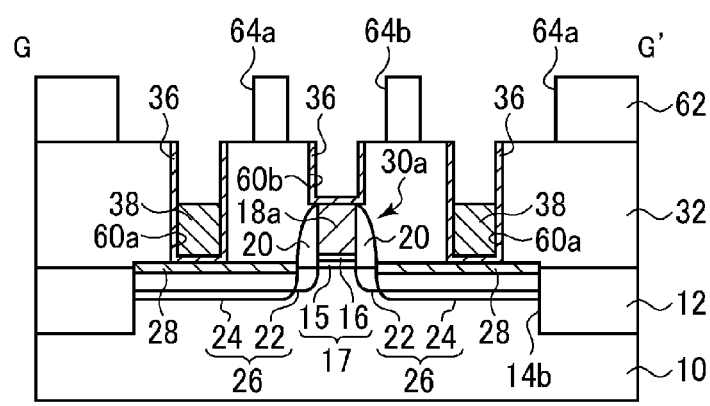

In the same way as in the method of manufacturing the semiconductor device according to the first embodiment described above with reference to FIG. 6B, the upper portions of the conduction layer 38 buried in the contact holes 60a is etched off (see FIG. 37B). That is, the upper portion of the conduction layer 38 buried in the openings 60a are etched off by, e.g., CDE. The etching rate of the conduction layer 38 is, e.g., about 55-60 nm. In etching the conduction layer 38, the etching is made until the conduction layer 38 does not exist in the contact holes 60b. The height of the upper surface of the conduction layer 38 in the contact holes 60a is equal to or smaller than the height of the upper surface of the gate electrode 18a. In the upper part of the contact holes 60a, the conduction layer 38 is absent, and in the lower part of the contact holes 60a, the conduction layer 38 is buried. In the contact hole 60b on the gate interconnection 18a, the conduction layer 38 is absent.

The conditions for etching the conduction layer 38 by CDE are as exemplified below. The pressure in the chamber of the CDE system is, e.g., about 20 Pa. The gases to be introduced into the chamber are, e.g., $SF_6$ gas and $O_2$ gas. The flow rate of the $SF_6$ is, e.g., about 250 sccm. The flow rate of the $O_2$ gas is, e.g., about 50 sccm. The high-frequency power of the remote plasma is about 200-400 W. The stage temperature is about 25° C.

The insides of the contact holes 60a, 60b remain covered by the barrier metal film 38. That is, the bottom surfaces and the side walls of the contact holes 60a, 60b remain covered by the barrier metal film 38. In the contact holes 60a, the bottom surfaces and side walls of the lower part of the contact holes 60a remain covered by the barrier metal film 38, and the side walls of the upper part of the contact holes 60a also remain covered by the barrier metal film 38.

Figure 37C:
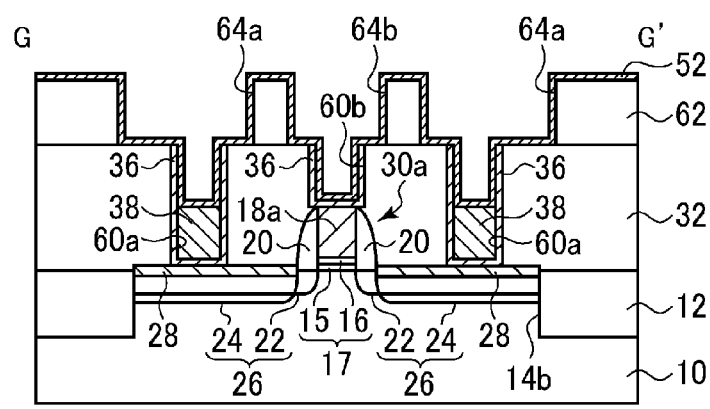

Next, in the same way as in the method of manufacturing the semiconductor device according to the first embodiment described above with reference to FIG. 10A, the barrier metal film 52 is formed (see FIG. 37C).

Figure 38A:
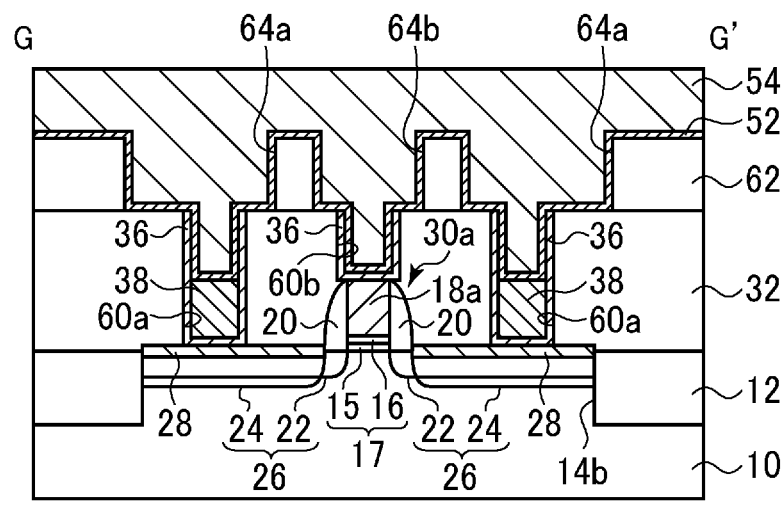

Next, in the same way as in the method of manufacturing the semiconductor device according to the first embodiment described above with reference to FIG. 10A, the seed layer (not illustrated) is formed (see FIG. 38A).

Next, in the same way as in the method of manufacturing the semiconductor device according to the first embodiment described above with reference to FIG. 10A, the conduction layer 54 is formed (see FIG. 38A).

Then, in the same way as in the method of manufacturing the semiconductor device according to the first embodiment described above with reference to FIG. 10B, the conduction layer 54 and the barrier metal film 52 are polished.

Figure 38B:
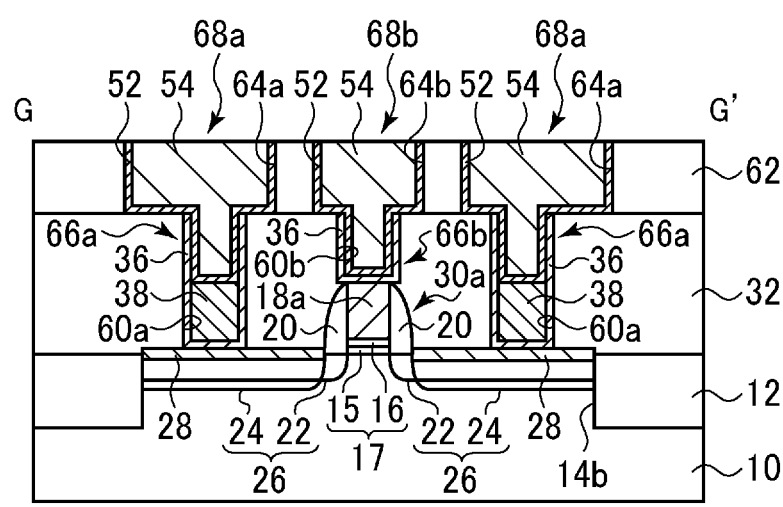

Thus, the semiconductor device according to the present embodiment is formed (see FIG. 38B).

As described above, according to the present embodiment, the conduction layer 38 is buried in the lower part of the contact holes 60a, and in the upper part of the contact holes 60a, the conduction layer 54 whose conductivity is higher than that of the conduction layer 38 is buried. Consequently, in comparison with the case that the conductor plugs 66a are formed of the conduction layer 38 alone, the electric resistance of the conductor plugs 66a can be decreased. Furthermore, the conduction layer 38 and the conduction layer 54 are buried in the same contact holes 60a, whereby no misregistration takes place between the conduction layer 38 and the conduction layer 54. Thus, the conductor plugs 66a can have a low electric resistance without lowering the reliability and the yield. According to the present embodiment, the semiconductor device can have good electric characteristics without lowering the reliability and the yield.

According to the present embodiment, the conduction layer 38 in the contact hole 60b exposing the gate interconnection 18a is removed, and the conduction layer 54 whose conductivity is higher than the conduction layer 38 is buried in. The conductor plug 66b is formed of the conduction layer 54 alone, whereby the conductor plug 66b can have a low electric resistance.

A Firth Embodiment

The semiconductor device according to a fifth embodiment and its manufacturing method will be described with reference to FIGS. 39 to 42C. The same members of the present embodiment as those of the semiconductor device according to the first to the fourth embodiments and its manufacturing method illustrated in FIGS. 1 to 38B are represented by the same reference numbers not to repeat or to simplify the description.

(Semiconductor Device)

Figure 39:
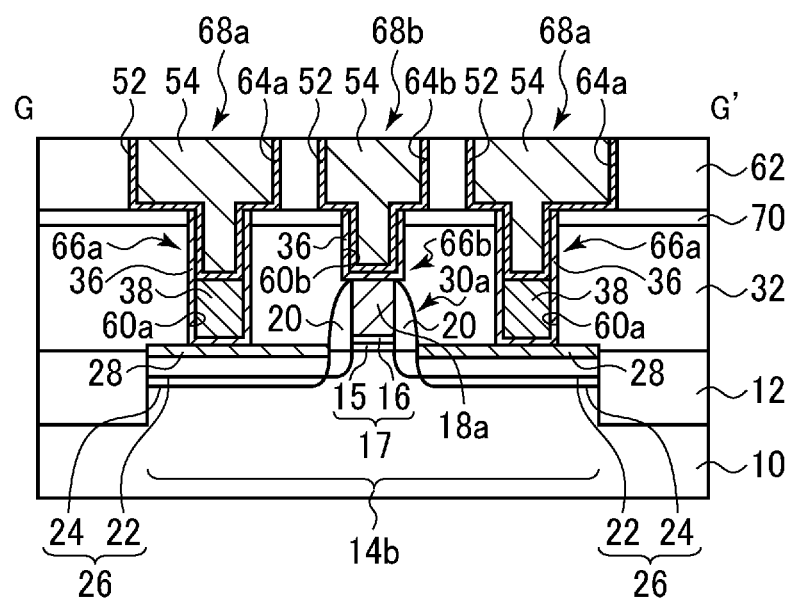
FIG. 39 is a sectional view of a semiconductor device according to a fifth embodiment.

First, the semiconductor device according to the present embodiment will be described with reference to FIG. 39. FIG. 39 is a sectional view of the semiconductor device according to the present embodiment. The plan view of the semiconductor device according to the present embodiment is the same as that of the semiconductor device according to the fourth embodiment described above with reference to FIG. 34.

As illustrated in FIG. 39, an etching stopper film (insulation film) 70 of, e.g. an about 10-20 nm-film thickness is formed on the inter-layer insulation film 32. As the material of the etching stopper film 70, a material whose etching characteristics are different from those of the inter-layer insulation film 62 is used. As the etching stopper film 70, for example, SiC film, SiN film or others is used.

In the etching stopper film 70 and the inter-layer insulation film 32, the contact holes (openings) 60a reaching the source/drain regions 26 and a contact hole (opening) 60b reaching the gate interconnection (gate electrode) 18a are formed.

Thus, the semiconductor device according to the present embodiment is constituted.

As described above, the etching stopper film 70 may be formed on the inter-layer insulation film 32.

(Method of Manufacturing the Semiconductor Device)

Next, the method of manufacturing the semiconductor device according to the present embodiment will be described with reference to FIGS. 40A to 42C. FIGS. 40A to 42C are sectional views of the semiconductor device according to the present embodiment in the steps of the method of manufacturing the semiconductor device, which illustrate the method.

Figure 40A:
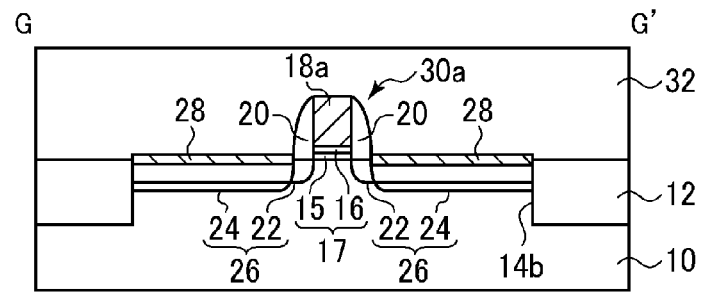
FIGS. 40A to 42C are sectional views of a semiconductor device according to a fifth embodiment in the steps of the method of manufacturing the semiconductor device, which illustrate the method.

First, the step of forming the device isolation regions 12 to the step of planarizing the surface of the inter-layer insulation film 32 are the same as those of the method of manufacturing the semiconductor device according to the first embodiment described above with reference to FIGS. 3A to 4B, and their description will not be repeated (see FIG. 40A).

Figure 40B:
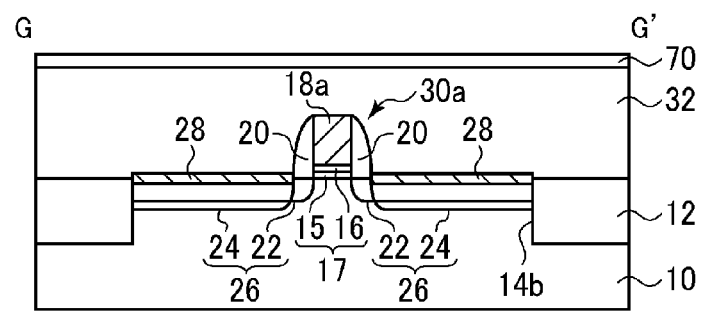

Next, the etching stopper film 70 of an about 10-20 nm-film thickness is formed by, e.g., CVD (see FIG. 40B). As the etching stopper film 70, for example, SiC film, SiN film or others is used.

Next, a photoresist film (not illustrated) is formed on the entire surface by, e.g., spin coating.

Next, openings (not illustrated) are formed in the photoresist film by photolithography. The openings are for forming the contact holes (openings) 60a, 60b in the etching stopper film 70 and the inter-layer insulation film 32.

Figure 40C:
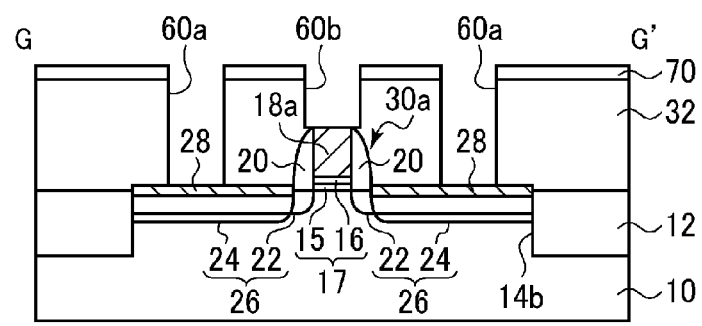

Next, by, e.g., RIE with the photoresist film as the mask, the etching stopper film 70 and the inter-layer insulation film 32 are etched to form the contact holes 60a, 60b in the etching stopper film 70 and the inter-layer insulation film 32 (see FIG. 40C). The contact holes 60a are formed down to the source/drain regions 26. The contact hole 60b is formed down to the gate interconnection 18a. The diameter of the contact holes 60a, 60b is, e.g., about 45-55 nm.

Then, the photoresist film is removed by, e.g., asking.

Figure 40D:
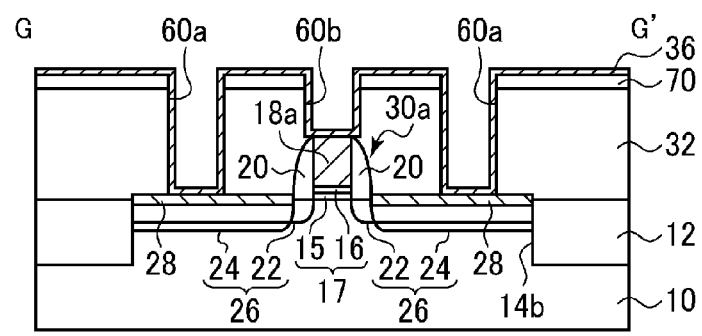

Next, in the same way as in the method of manufacturing the semiconductor device according to the first embodiment described above with reference to FIG. 5A, the barrier metal film 26 is formed (see FIG. 40D).

Figure 41A:
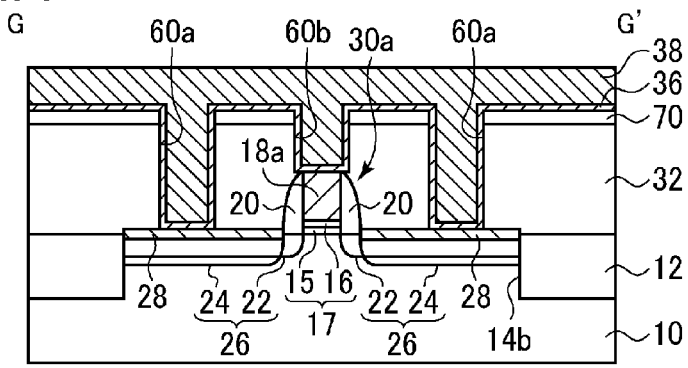
Figure 41B:
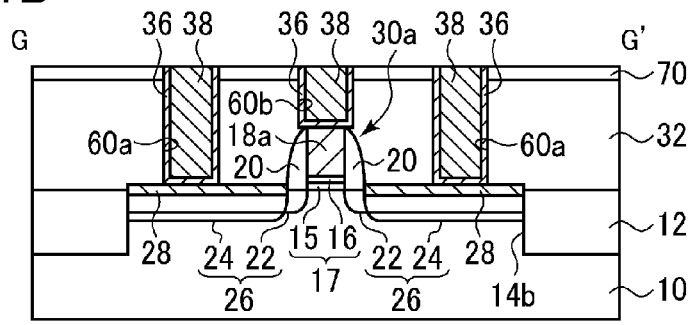

Next, in the same way as in the method of manufacturing the semiconductor device according to the first embodiment described above with reference to FIG. 5B, the conduction layer 38 is formed (see FIG. 41A).

Next, in the same way as in the method of manufacturing the semiconductor device according to the first embodiment described above with reference to FIG. 6A, the conduction layer 38 and the barrier metal film 36 are polished to bury the conduction layer 38 in the contact holes 60a, 60b (see FIG. 41).

Figure 41C:
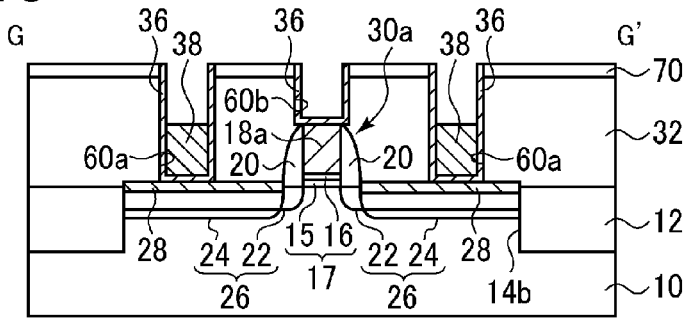
Figure 41D:
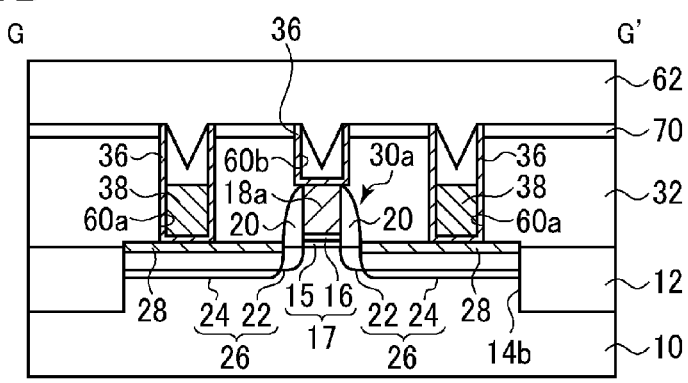

Then, in the same way as in the method of manufacturing the semiconductor device according to the first embodiment described above with reference to FIG. 6B, the upper portion of conduction layer 38 buried in the contact holes 60a is etched off (see FIG. 41C). That is, the upper portion of the conduction layer 38 buried in the openings 60a is etched off by, e.g., CDE. The etching rate of the conduction layer 38 is, e.g., about 55-65 nm. In etching the conduction layer 38, the etching is made until the conduction layer 38 in the contact hole 60b does not exist. The height of the upper surface of the conduction layer 38 in the contact holes 60a is equal to or smaller than that of the upper surface of the gate electrode 18a. The conduction layer 38 is absent in the upper part of the contact holes 60a, and in the lower part of the contact holes 60a, the conduction layer 38 is buried in. In the contact hole 60b on the gate interconnection 18a, the conduction layer 38 is absent.

The conditions for etching the conduction layer 38 by CDE are as exemplified below. The pressure in the chamber of the CDE system is, e.g., about 20 Pa. The gases to be introduced into the chamber are, e.g., $SF_6$ gas and $O_2$ gas. The flow rate of the $SF_6$ gas is, e.g., about 250 sccm. The flow rate of the $O_2$ gas is, e.g., about 50 sccm. The high-frequency power of the remote plasma is about 200-400 W. The stage temperature is, e.g., about 25° C.

The insides of the contact holes 60a, 60b remain covered by the barrier metal film 38. That is, the bottom surfaces and the side walls of the contact holes 60a, 60b remain covered by the barrier metal film 38. In the contact holes 60a, the bottom surfaces and side walls of the lower part of the contact holes 60a are covered by the barrier metal film 38, and the side walls of the upper part of the contact holes 60a also remain covered by the barrier metal film 38.

Next, on the entire surface, the inter-layer insulation film 62 of an about 90 nm-film thickness is formed by, e.g., CVD. As the inter-layer insulation film 62, a low-k material film, e.g., SiOC film or others, $SiO_2$ film or others is used (see FIG. 41D).

Next, a photoresist film 72 is formed on the entire surface by, e.g., spin coating.

Next, by photolithography, openings 74 are formed in the photoresist film 72. The openings 74 are for forming the trenches 64a, 64b in the inter-layer insulation film 62.

Then, with the photoresist film 72 as the mask and with the etching stopper film 70 as the stopper, the inter-layer insulation film 62 is etched. Thus, the trenches (openings, trench-shaped openings) 64a, 64b connected to the contact holes 60a, 60b are formed in the inter-layer insulation film 62 (see FIG. 42A). The trenches 64a, 64b is for the interconnections 68a, 68b to be buried in. The width of the trenches 64a, 64b is, e.g., about 45-55 nm.

Then, the photoresist film 72 is removed by, e.g., asking.

Figure 42A:
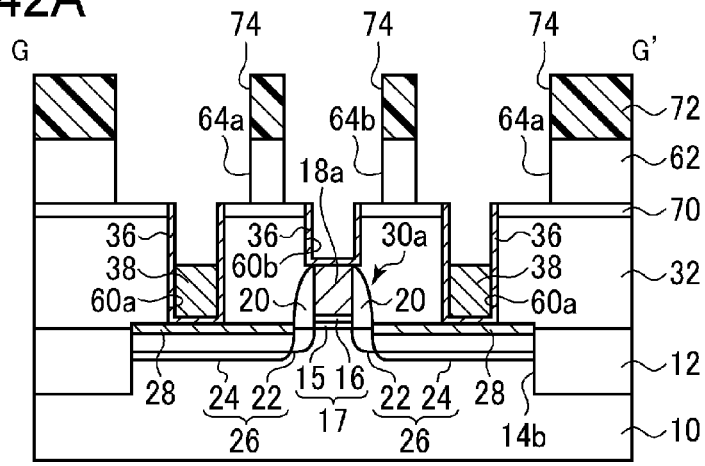
Figure 42B:
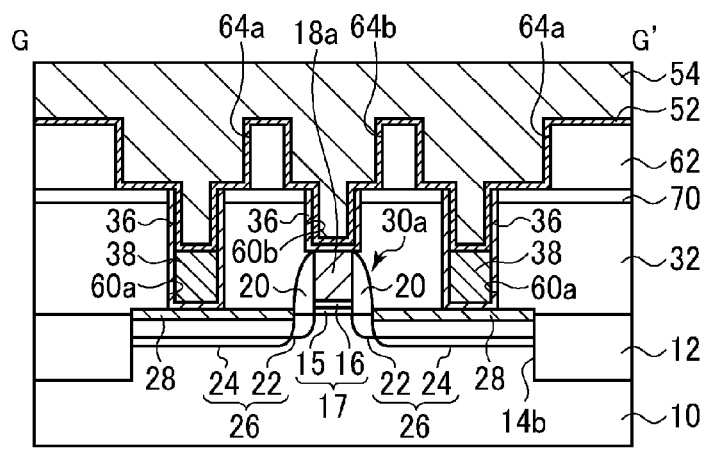

Next, in the same way as in the method of manufacturing the semiconductor device according to the first embodiment described above with reference to FIG. 10A, the barrier metal film 52 is formed (see FIG. 42B).

Next, in the same way as in the method of manufacturing the semiconductor device according to the first embodiment described above with reference to FIG. 10A, the seed layer (not illustrated) is formed.

Next, in the same way as in the method of manufacturing the semiconductor device according to the first embodiment described above with reference to FIG. 10A, the conduction layer 54 is formed.

Next, in the same way as in the method of manufacturing the semiconductor device according to the first embodiment described above with reference to FIG. 10B, the conduction layer 54 and the barrier metal film 52 are polished.

Figure 42C:
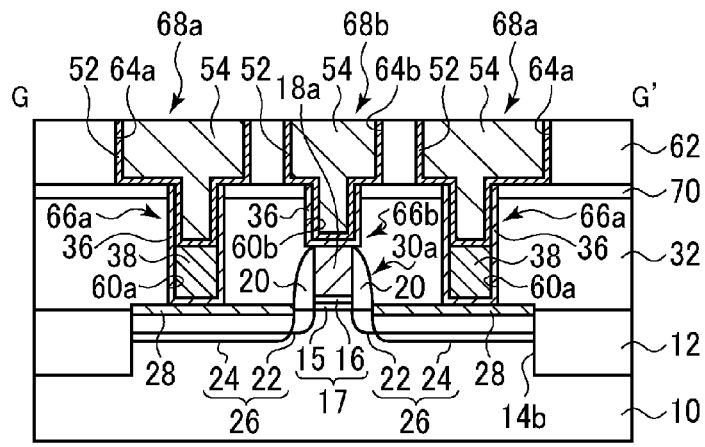

Thus, the semiconductor device according to the present embodiment is formed (see FIG. 42C).

As described above, according to the present embodiment, the conduction layer 38 is buried in the lower part of the contact holes 60a, and in the upper part of the contact holes 60a, the conduction layer 54 whose conductivity is higher than that of the conduction layer 38 is buried. Consequently, in comparison with the case that the conductor plugs 66a are formed of the conduction layer 38 alone, the electric resistance of the conduction plugs 66a can be decreased. Furthermore, the conduction layer 38 and the conduction layer 54 are formed in the same contact holes 60a, whereby the no misregistration takes place between the conduction layer 38 and the conduction layer 54. Thus, the conductor plugs 66a can have a low electric resistance without lowering the reliability and the yield. According to the present embodiment, the semiconductor device can have good electric characteristics without lowering the reliability and the yield.

According to the present embodiment, the conduction layer 38 in the contact holes 60b exposing the gate interconnection 18a is etched off, and the conduction layer 54 whose conductivity is higher than that of the conduction layer 38 is buried. The conductor plug 66b is formed of the conduction layer 54 alone, whereby the conductor plug 66b can have a low electric resistance.

Modified Embodiments

The present invention is not limited to the above-described embodiments and can cover other various modifications.

For example, the above-described embodiments have been described by means of the example that a copper alloy is used as the material of the conduction layer 42, but this is not essential. As the material of the conduction layer 42, a material whose conductivity is higher than that of the conduction layer 38 can be used. For example, copper may be used as the material of the conduction layer 42.

The above-described embodiments have been described by means of the example that tungsten is used as the material of the conduction layer 38, but the material of the conduction layer 38 is not limited to tungsten. A material which can prevent the diffusion of the constituent atoms of the conduction layer 42 can be suitably used as the material of the conduction layer 38.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
   a device isolation region formed in a semiconductor substrate;
   a first transistor including a first gate insulation film formed over a first device region defined by the device isolation region, a first gate electrode formed over the first gate insulation film, and a first diffused regions formed in the first device region on both sides of the first gate electrode;
   a first insulation film formed over the semiconductor substrate and over the first transistor, and including a first opening reaching one of the first diffusion regions and a second opening reaching the first gate electrode;
   a first barrier metal which covers an inner wall of the first opening over the one of the first diffused regions;
   a first conduction layer formed in a lower part of the first opening of which the inner wall is covered with the first barrier metal and formed of a first conductor;
   a second barrier metal formed on the first barrier metal and the first conduction layer, the second barrier metal covers an upper portion of the inner wall of the first opening of which the inner wall is covered with the first barrier metal;
   a second conduction layer formed in an upper part of the first opening of which the upper portion of the inner wall is covered with the second barrier metal and formed of a second conductor;
   a third barrier metal which covers an inner wall of the second opening on the first gate electrode;
   a fourth barrier metal formed on the third barrier metal, the fourth barrier metal covers the inner wall of the second opening of which the inner wall is covered with the third barrier metal; and
   a third conduction layer formed in the second opening of which the inner wall is covered with the fourth barrier metal and formed of the second conductor.

2. The semiconductor device according to claim 1, wherein the first opening or the second opening is trench shaped.

3. The semiconductor device according to claim 1, wherein the first opening or the second opening is hole shaped.

4. The semiconductor device according to claim 1, further comprising
   a second insulation film formed over the first insulation film and having third opening connected to the first opening, and a fourth opening connected to the second opening,
   the second conduction layer being formed also in the third opening, and
   the third conduction layer being formed also in the fourth opening.

5. The semiconductor device according to claim 1, wherein the first insulation film includes an inter-layer insulation film, and an etching stopper film formed over the inter-layer insulation film.

6. The semiconductor device according to claim 1, further comprising
   a second transistor including a second gate insulation film formed over a second device region defined by the device isolation region, a second gate electrode formed over the second gate insulation film, and second diffused regions in the second device region on both sides of the second gate electrode,
   the first opening reaching one of the second diffused regions and being trench-shaped.

7. The semiconductor device according to claim 1, further comprising
   a second transistor including a second gate insulation film formed over a second device region defined by the device isolation region, a second gate electrode formed over the second gate insulation film, and second diffused regions in the second device region on both sides of the second gate electrode,
   the second opening reaching the second gate electrode and being trench-shaped.

8. The semiconductor device according to claim 1, wherein
   a fifth opening is further formed in the first insulation film, and
   the second conductor is formed also in the fifth opening.

9. The semiconductor device according to claim 8, wherein the fifth opening is formed, reaching the first opening or the second opening.

10. The semiconductor device according to claim 1, wherein
    the first conductor contains tungsten, and
    the second conductor contains copper.

11. A semiconductor device comprising:
    a device isolation region formed in a semiconductor substrate;
    a first transistor including a first gate insulation film formed over a first device region defined by the device isolation region, a first gate electrode formed over the first gate insulation film, and first diffused regions formed in the first device region on both sides of the first gate electrode;
    a first insulation film formed over the semiconductor substrate and over the first transistor, and including a first opening reaching one of the first diffusion regions and a second opening reaching the first gate electrode;
    a first barrier metal over the one of the first diffused regions in the first opening;
    a first conduction layer formed over the first barrier metal in the first opening and formed of a first conductor;
    a second barrier metal formed over the first conduction layer in the first opening;
    a second conduction layer formed over the second barrier metal in the first opening and formed of a second conductor;
    a third barrier metal formed over the first gate electrode in the second opening;
    a fourth barrier metal formed in the second opening and contacting with the third barrier metal;
    a third conduction layer formed of the second conductor contacting with the fourth barrier metal in the second opening;
    a second insulation film formed over the first insulation film and having third opening connected to the first opening, and a fourth opening connected to the second opening;
    the second conduction layer being formed also in the third opening; and
    the third conduction layer being formed also in the fourth opening.

12. A semiconductor device comprising:
    a device isolation region formed in a semiconductor substrate;
    a first transistor including a first gate insulation film formed over a first device region defined by the device isolation region, a first gate electrode formed over the first gate insulation film, and first diffused regions formed in the first device region on both sides of the first gate electrode;

a first insulation film formed over the semiconductor substrate and over the first transistor, and including a first opening reaching one of the first diffusion regions and a second opening reaching the first gate electrode;

a first barrier metal over the one of the first diffused regions in the first opening;

a first conduction layer formed over the first barrier metal in the first opening and formed of a first conductor;

a second barrier metal formed over the first conduction layer in the first opening;

a second conduction layer formed over the second barrier metal in the first opening and formed of a second conductor;

a third barrier metal formed over the first gate electrode in the second opening;

a fourth barrier metal formed in the second opening and contacting with the third barrier metal; and third conduction layer formed of the second conductor contacting with the fourth barrier metal in the second opening, any conduction layer formed of the first conductor not being formed in the second opening.

* * * * *